United States Patent
Skeoch

(10) Patent No.: US 10,878,671 B1
(45) Date of Patent: *Dec. 29, 2020

(54) COMMUNICATING BETWEEN DEVICES IN A DOORBELL SYSTEM USING AC POWER WAVEFORMS

(71) Applicant: Amazon Technologies, Inc., Seattle, WA (US)

(72) Inventor: James Steven Skeoch, Palos Verdes Estates, CA (US)

(73) Assignee: Amazon Technologies, Inc., Seattle, WA (US)

( * ) Notice: Subject to any disclaimer, the term of this patent is extended or adjusted under 35 U.S.C. 154(b) by 15 days.

This patent is subject to a terminal disclaimer.

(21) Appl. No.: 16/173,794

(22) Filed: Oct. 29, 2018

(51) Int. Cl.
 *G08B 3/00* (2006.01)
 *G08B 3/10* (2006.01)
 (Continued)

(52) U.S. Cl.
 CPC ............... *G08B 3/10* (2013.01); *H03K 17/18* (2013.01); *H03K 17/94* (2013.01); *H04N 7/186* (2013.01); *H03K 2217/0054* (2013.01)

(58) Field of Classification Search
 CPC .................. H03K 17/18; H03K 17/94; H03K 2217/0054; H04N 7/186; H04N 5/23241;
 (Continued)

(56) References Cited

U.S. PATENT DOCUMENTS

| 4,764,953 A | 8/1988 | Chern et al. |
| 5,428,388 A | 6/1995 | von Bauer et al. |

(Continued)

FOREIGN PATENT DOCUMENTS

| CN | 2585521 Y | 11/2003 |
| CN | 2792061 Y | 6/2006 |

(Continued)

OTHER PUBLICATIONS

Office Action for U.S. Appl. No. 16/173,931, dated May 30, 2019, Skeoch, "Communicating Between Devices in a Doorbell System Using AC Power Waveforms", 9 pages.

(Continued)

*Primary Examiner* — Anh V La
(74) *Attorney, Agent, or Firm* — Lee & Hayes, P.C.

(57) ABSTRACT

This disclosure describes techniques for using alternating current (AC) power waveforms to communicate between devices in a doorbell circuit. A signaling device that emits sound may be positioned in the doorbell circuit between an AC power source and a doorbell device (such as an A/V device including a doorbell). A signaling device may be coupled in parallel to a signaling-control device that includes electronic circuitry that provides a selective bypass to allow for larger amounts of current drawn by the A/V device to bypass the signaling device without causing the signaling device to emit the sound. The A/V device and the signaling-control device may use AC power waveforms to communicate data and/or data between each other. For example, the A/V device and the signaling-control device may control respective signal relays to selectively open and close the doorbell circuit in order to communicate with each other using the AC current waveform.

20 Claims, 24 Drawing Sheets

(51) Int. Cl.
*H04N 7/18* (2006.01)
*H03K 17/94* (2006.01)
*H03K 17/18* (2006.01)

(58) Field of Classification Search
CPC ........ H04N 5/23206; H04N 5/77; H04B 3/54; G08B 3/10; G08B 13/196; G08B 13/19615; G08B 13/19669
USPC ................ 340/328, 326, 506, 540, 541, 565
See application file for complete search history.

(56) References Cited

U.S. PATENT DOCUMENTS

| | | | |
|---|---|---|---|
| 5,760,848 A | 6/1998 | Cho | |
| 6,072,402 A | 6/2000 | Kniffin et al. | |
| 6,192,257 B1 | 2/2001 | Ray | |
| 6,271,752 B1 | 8/2001 | Vaios | |
| 6,429,893 B1 | 8/2002 | Xin | |
| 6,456,322 B1 | 9/2002 | Marinacci | |
| 6,476,858 B1 | 11/2002 | Ramirez Diaz et al. | |
| 6,633,231 B1 | 10/2003 | Okamoto et al. | |
| 6,658,091 B1 | 12/2003 | Naidoo et al. | |
| 6,753,774 B2 | 6/2004 | Pan et al. | |
| 6,970,183 B1 | 11/2005 | Monroe | |
| 7,062,291 B2 | 6/2006 | Ryley et al. | |
| 7,065,196 B2 | 6/2006 | Lee | |
| 7,085,361 B2 | 8/2006 | Thomas | |
| 7,109,860 B2 | 9/2006 | Wang | |
| 7,193,644 B2 | 3/2007 | Carter | |
| 7,304,572 B2 | 12/2007 | Sheynman et al. | |
| 7,382,249 B2 | 6/2008 | Fancella | |
| 7,429,924 B2 | 9/2008 | Langer et al. | |
| 7,450,638 B2 | 11/2008 | Iwamura | |
| 7,643,056 B2 | 1/2010 | Silsby | |
| 7,683,924 B2 | 3/2010 | Oh et al. | |
| 7,683,929 B2 | 3/2010 | Elazar et al. | |
| 7,738,917 B2 | 6/2010 | Ryley et al. | |
| 8,139,098 B2 | 3/2012 | Carter | |
| 8,144,183 B2 | 3/2012 | Carter | |
| 8,154,581 B2 | 4/2012 | Carter | |
| 8,619,136 B2 | 12/2013 | Howarter et al. | |
| 8,780,201 B1 | 7/2014 | Scalisi et al. | |
| 8,823,795 B1 | 9/2014 | Scalisi et al. | |
| 8,842,180 B1 | 9/2014 | Kasmir et al. | |
| 8,872,915 B1 | 10/2014 | Scalisi et al. | |
| 8,937,659 B1 | 1/2015 | Scalisi et al. | |
| 8,941,736 B1 | 1/2015 | Scalisi | |
| 8,947,530 B1 | 2/2015 | Scalisi | |
| 8,953,040 B1 | 2/2015 | Scalisi et al. | |
| 9,013,575 B2 | 4/2015 | Scalisi | |
| 9,049,352 B2 | 6/2015 | Scalisi et al. | |
| 9,053,622 B2 | 6/2015 | Scalisi | |
| 9,055,202 B1 | 6/2015 | Scalisi et al. | |
| 9,058,738 B1 | 6/2015 | Scalisi | |
| 9,060,103 B1 | 6/2015 | Scalisi | |
| 9,060,104 B2 | 6/2015 | Scalisi | |
| 9,065,987 B2 | 6/2015 | Kasmir et al. | |
| 9,094,584 B2 | 7/2015 | Scalisi et al. | |
| 9,109,378 B2 | 8/2015 | Scalisi | |
| 9,113,051 B1 | 8/2015 | Scalisi | |
| 9,113,052 B1 | 8/2015 | Scalisi et al. | |
| 9,118,819 B1 | 8/2015 | Scalisi et al. | |
| 9,142,214 B2 | 9/2015 | Scalisi | |
| 9,160,987 B1 | 10/2015 | Kasmir et al. | |
| 9,165,444 B2 | 10/2015 | Scalisi | |
| 9,172,920 B1 | 10/2015 | Kasmir et al. | |
| 9,172,921 B1 | 10/2015 | Scalisi et al. | |
| 9,172,922 B1 | 10/2015 | Kasmir et al. | |
| 9,179,107 B1 | 11/2015 | Scalisi et al. | |
| 9,179,108 B1 | 11/2015 | Scalisi et al. | |
| 9,179,109 B1 | 11/2015 | Kasmir et al. | |
| 9,196,133 B2 | 11/2015 | Scalisi et al. | |
| 9,197,867 B1 | 11/2015 | Scalisi et al. | |
| 9,230,424 B1 | 1/2016 | Scalisi et al. | |
| 9,237,318 B2 | 1/2016 | Kasmir et al. | |
| 9,247,219 B2 | 1/2016 | Kasmir et al. | |
| 9,253,455 B1 | 2/2016 | Harrison et al. | |
| 9,342,936 B2 | 5/2016 | Scalisi | |
| 9,508,239 B1 | 11/2016 | Harrison et al. | |
| 9,736,284 B2 | 8/2017 | Scalisi et al. | |
| 9,743,049 B2 | 8/2017 | Scalisi et al. | |
| 9,769,435 B2 | 9/2017 | Scalisi et al. | |
| 9,786,133 B2 | 10/2017 | Harrison et al. | |
| 9,799,183 B2 | 10/2017 | Harrison et al. | |
| 10,270,971 B2 * | 4/2019 | Siminoff | H04N 5/23241 |
| 2002/0094111 A1 | 7/2002 | Puchek et al. | |
| 2002/0147982 A1 | 10/2002 | Naidoo et al. | |
| 2003/0043047 A1 | 3/2003 | Braun | |
| 2004/0085205 A1 | 5/2004 | Yeh | |
| 2004/0085450 A1 | 5/2004 | Stuart | |
| 2004/0086093 A1 | 5/2004 | Schranz | |
| 2004/0095254 A1 | 5/2004 | Maruszczak | |
| 2004/0135686 A1 | 7/2004 | Parker | |
| 2005/0111660 A1 | 5/2005 | Hosoda | |
| 2006/0010199 A1 | 1/2006 | Brailean et al. | |
| 2006/0022816 A1 | 2/2006 | Yukawa | |
| 2006/0071760 A1 | 4/2006 | Epstein et al. | |
| 2006/0139449 A1 | 6/2006 | Cheng et al. | |
| 2006/0156361 A1 | 7/2006 | Wang et al. | |
| 2013/0057695 A1 | 3/2013 | Huisking | |
| 2014/0097953 A1 | 4/2014 | Jelveh et al. | |
| 2015/0310381 A1 | 10/2015 | Lyman et al. | |
| 2016/0180667 A1 | 6/2016 | Bunker et al. | |
| 2017/0272706 A1 | 9/2017 | Jeong | |
| 2018/0047266 A1 | 2/2018 | Siminoff et al. | |
| 2018/0047267 A1 | 2/2018 | Modestine | |
| 2018/0047268 A1 | 2/2018 | Lemberger | |
| 2018/0075718 A1 | 3/2018 | Modestine | |
| 2018/0197383 A1 | 7/2018 | Tso | |
| 2019/0149775 A1 * | 5/2019 | Alamgir | G08B 13/1966 348/143 |

FOREIGN PATENT DOCUMENTS

| | | |
|---|---|---|
| EP | 0944883 | 6/1998 |
| EP | 1480462 | 11/2004 |
| GB | 2286283 | 8/1995 |
| GB | 2354394 | 3/2001 |
| GB | 2357387 A | 6/2001 |
| GB | 2400958 | 10/2004 |
| JP | 2001-103463 A | 4/2001 |
| JP | 2002-033839 A | 1/2002 |
| JP | 2002-125059 A | 4/2002 |
| JP | 2002-342863 A | 11/2002 |
| JP | 2002-344640 A | 11/2002 |
| JP | 2002-354137 A | 12/2002 |
| JP | 2002-2368890 A | 12/2002 |
| JP | 2003-283696 A | 10/2003 |
| JP | 2004-128835 A | 4/2004 |
| JP | 2005-341040 A | 12/2005 |
| JP | 2006-147650 A | 6/2006 |
| JP | 2006-262342 A | 9/2006 |
| JP | 2009-008925 A | 1/2009 |
| WO | WO1998039894 | 9/1998 |
| WO | WO2001013638 | 2/2001 |
| WO | WO2001093220 | 12/2001 |
| WO | WO2002085019 | 10/2002 |
| WO | WO2003028375 | 4/2003 |
| WO | WO2003096696 | 11/2003 |
| WO | WO2006038760 | 4/2006 |
| WO | WO2006067782 | 6/2006 |
| WO | WO2007125143 | 11/2007 |

OTHER PUBLICATIONS

Office Action for U.S. Appl. No. 16/692,697, dated Jan. 8, 2020, Skeoch, "Communicating Between Devices in a Doorbell System Using AC Power Waveforms",12 Pages.

* cited by examiner

AC CURRENT
WAVEFORM
206

PHASE
DESIGNATIONS
208

A/V DEVICE TO SIGNALING-CONTROL DEVICE REQUEST
BYTE VALUE: 10101010 (HEX: AA)
COMMUNICATION: "REQUEST ID"

AC CURRENT
WAVEFORM
210

PHASE
DESIGNATIONS
212

SIGNALING-CONTROL DEVICE TO A/V DEVICE RESPONSE
BYTE VALUE: 11101110 (HEX: EE)
COMMUNICATION: "EE" (VALUE)

BYTE VALUE: 10010011 (HEX: 93)

300
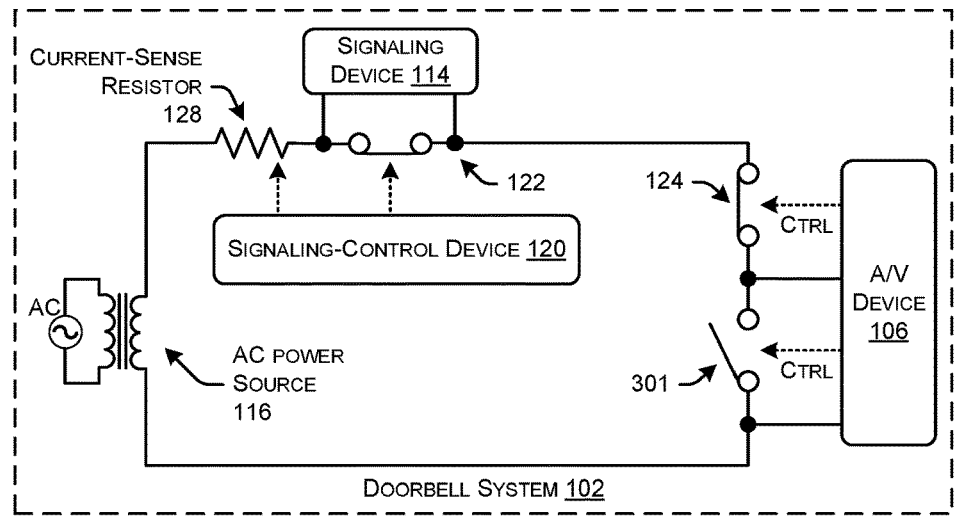
A/V DEVICE DRAWS AC CURRENT
(IDLE STATE)
302
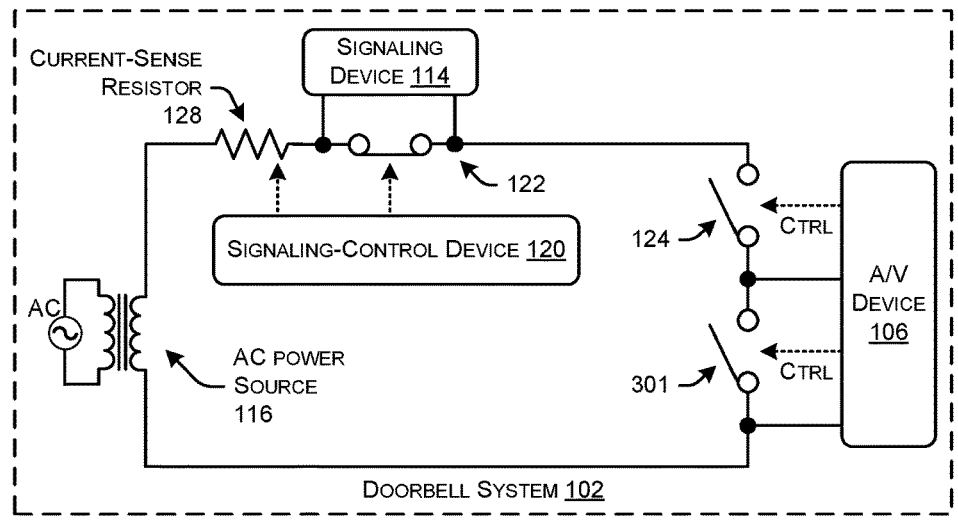
SIGNAL TO ACTIVATE SIGNALING DEVICE
(OPEN-CIRCUIT STATE)
304
FIGURE 3A

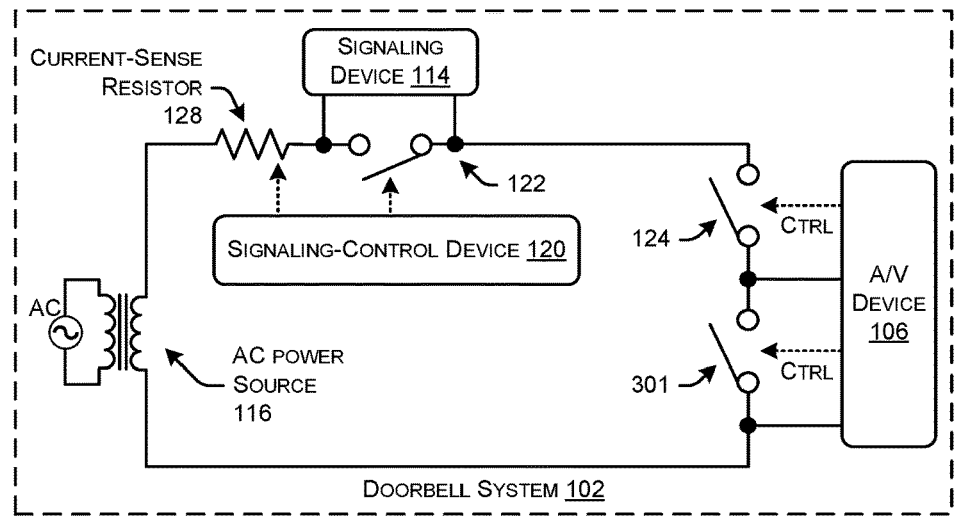
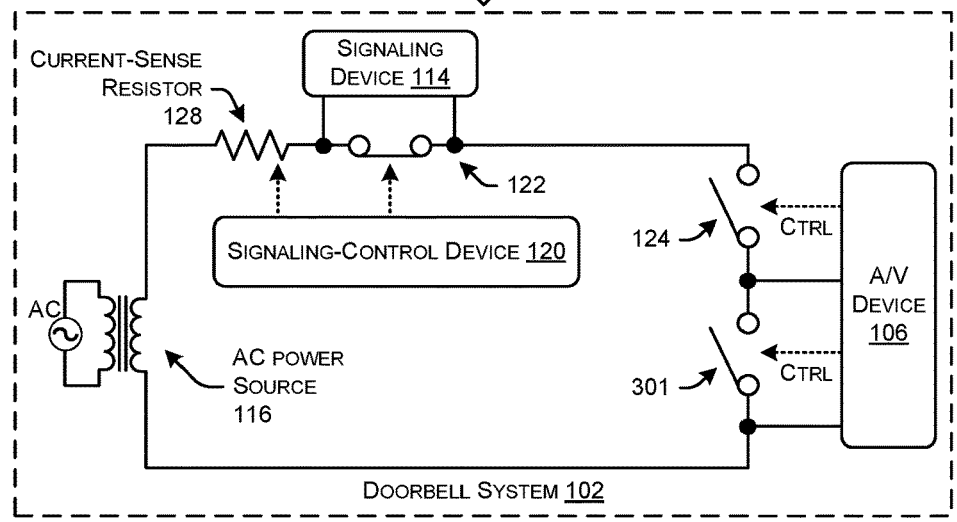
FIGURE 3C

900 ↘

```
┌─────────────────────────────────────────────────────────────┐
│  RECEIVE AN INSTRUCTION FOR COMMUNICATION TO A DOORBELL DEVICE │
│                            B902                              │
└─────────────────────────────────────────────────────────────┘
                              │
                              ▼
┌─────────────────────────────────────────────────────────────┐
│  DETERMINE, BASED AT LEAST IN PART ON THE INSTRUCTION, A CONTROL │
│         SIGNAL TO CONTROL THE SWITCH TO CLOSE AND OPEN       │
│                            B904                              │
└─────────────────────────────────────────────────────────────┘
                              │
                              ▼
┌─────────────────────────────────────────────────────────────┐
│  SEND THE CONTROL SIGNAL TO THE SWITCH RESULTING IN MODULATION OF A │
│  PORTION OF THE AC CURRENT, THE MODULATION OF THE PORTION OF THE AC │
│  CURRENT REPRESENTATIVE OF THE INSTRUCTION TO THE DOORBELL CIRCUIT │
│                           DEVICE                             │
│                            B906                              │
└─────────────────────────────────────────────────────────────┘
```

```
┌─────────────────────────────────────────────────────────────┐
│  CAUSE CONTROL CIRCUITRY TO ENTER A CLOSED STATE SUCH THAT AC│
│         CURRENT IS NOT DRAWN BY A SIGNALING DEVICE           │
│                          B1102                               │
└─────────────────────────────────────────────────────────────┘
                              │
                              ▼
┌─────────────────────────────────────────────────────────────┐
│         IDENTIFY A MODULATION OF A PORTION OF THE AC CURRENT │
│                          B1104                               │
└─────────────────────────────────────────────────────────────┘
                              │
                              ▼
┌─────────────────────────────────────────────────────────────┐
│  CAUSE THE CONTROL CIRCUITRY TO ENTER AN OPEN STATE SUCH THAT│
│  THE AC CURRENT IS DRAWN BY THE SIGNALING DEVICE TO CAUSE THE│
│                  SIGNALING DEVICE TO OUTPUT SOUND            │
│                          B1106                               │
└─────────────────────────────────────────────────────────────┘
```

FIGURE 11

COMMUNICATING BETWEEN DEVICES IN A DOORBELL SYSTEM USING AC POWER WAVEFORMS

BACKGROUND

Traditional doorbell systems for houses have a signaling device that emits the doorbell sound (e.g., "ding-dong") when the doorbell button is pressed. The signaling device is typically connected in series in a doorbell circuit with the doorbell device, which has a button and a switch. In such a traditional doorbell circuit, the switch is normally open such that the doorbell circuit is an open circuit. When the button on the doorbell device is pressed, the button may cause the switch to close the doorbell circuit and allow for power to flow through the signaling device to cause the signaling device to emit the doorbell sound. However, various technological advances have been made to these traditional doorbell systems.

For example, home security is a concern for many homeowners and renters. Those seeking to protect or monitor their homes often wish to have video and audio communications with visitors, for example, those visiting an external door or entryway. Audio and video (A/V) recording and communication devices, such as A/V doorbells, provide this functionality, and can also aid in crime detection and prevention. For example, audio and/or video captured by an A/V recording and communication device (often referred to herein as "A/V devices") can be uploaded to the cloud and recorded on a remote server. Subsequent review of the A/V footage can aid law enforcement in capturing perpetrators of home burglaries and other crimes. Further, the presence of one or more A/V devices on the exterior of a home, such as a doorbell unit at the entrance to the home, acts as a powerful deterrent against would-be burglars. In some examples, users of these A/V devices may receive notifications at their personal, client devices that notify them when their A/V devices detect motion at their homes. Users may further use their client devices to have video and audio communications to interact with their visitors, and also to deter would-be burglars via their A/V devices.

BRIEF DESCRIPTION OF THE DRAWINGS

The various embodiments of the present communicating between devices in a doorbell system using AC power waveforms now will be discussed in detail with an emphasis on highlighting the advantageous features. These embodiments depict the novel and non-obvious communicating between devices in a doorbell system using AC power waveforms, as shown in the accompanying drawings, which are for illustrative purposes only. These drawings include the following figures, in which like numerals indicate like parts:

FIGS. 3A-3D are schematic flow diagrams illustrating a process for an A/V recording and communication device to control the flow of AC current in order to instruct a signaling-control device to either close a shunt to cause the AC current to bypass a signaling device, or open the shunt to cause the AC current to flow through a signaling device to cause the signaling device to emit sound, according to various aspects of the present disclosure;

FIGS. 8-11 are flowcharts illustrating example processes for communicating between devices in a doorbell system by modulating phase portions of an AC current waveform according to various aspects of the present disclosure;

DETAILED DESCRIPTION

Figure 1:
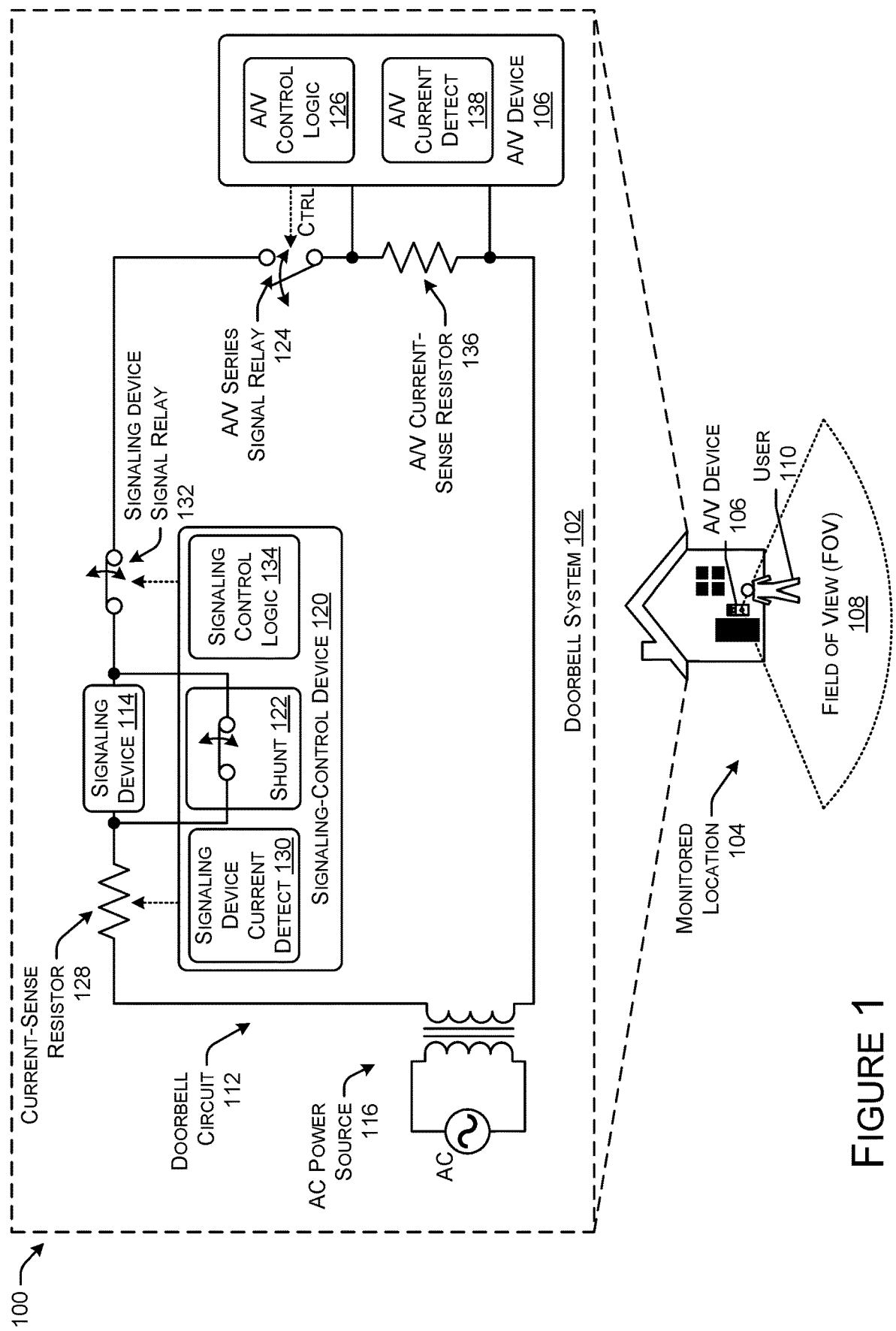
FIG. 1 is a schematic diagram illustrating an example environment that includes a doorbell system for powering a doorbell device of a monitored location according to various aspects of the present disclosure.

Although doorbell systems that include A/V devices are helpful for at least the reasons described above, various problems may exist when attempting to integrate these A/V devices into previously-installed, traditional doorbell systems. For example, A/V devices that are implemented as doorbells may draw large enough amounts of current through the doorbell circuit to inadvertently cause the signaling device to emit the doorbell sound. Additionally, traditional doorbell systems do not provide electronics or communication avenues that allow signaling devices and doorbell devices to communicate data with each other. The present embodiments solve these problems, as described below.

The present disclosure describes techniques for using alternating current (AC) power waveforms to communicate between devices in a doorbell circuit. In the doorbell circuit, a signaling device (such as a bell or a buzzer) that emits sound may be positioned between an AC power source and a doorbell device (such as an A/V device including a doorbell). In some examples, the A/V device may include a button to perform functions of a traditional doorbell, but may also include a processor and other components that allow for other functionality that traditional doorbell devices were not able to perform, such as audio and/or video recording, communication of audio and/or video data, etc. Further, traditional signaling devices may be coupled in parallel to signaling-control devices that include electronic circuitry that provide a selective bypass (e.g., a shunt switch) to allow for larger amounts of current drawn by the A/V device to bypass the signaling device without causing the signaling device to emit the sound. According to the techniques described herein, the A/V device and the signaling-control device may use AC power waveforms to communicate instructions and/or data between each other using the doorbell circuit. For example, the A/V device and the signaling-control device may include respective processors and logic to control respective signal relays (or other electronic switches) in order to selectively open and close the doorbell circuit in order to communicate with each other using the AC current waveform of the AC power signal.

In some examples, the A/V device and signaling-control device may selectively open and close the doorbell circuit in order to modulate a phase of the AC current waveform, or a sequence of phases of the AC current waveform, to communicate with each other. For example, the A/V device may modulate one or more phases of the AC current waveform to indicate that a user provided input at the doorbell button. The signaling-control device may detect, such as by using a current-sense resistor, the modulation of the phase(s) of the AC current waveform and determine that the A/V device is instructing the signaling-control device to cause the signaling device to emit the sound. The signaling-control device may then remove the bypass, or open the shunt switch, to allow the AC current to flow through the signaling device to emit the sound. The A/V device may then subsequently modulate one or more phases of the AC waveform to instruct the signaling-control device to stop the signaling device from emitting the sound by closing the shunt switch such that the AC current bypasses the signaling device.

In some examples, other types of communications may be performed by the A/V device and the signaling-control device. For example, the A/V device may modulate one or more phases of the AC waveform according to a predefined sequence that represents a request for the signaling-control device to provide certain information to the A/V device, such as a device identifier (ID) for the signaling-control device. The signaling-control device may identify the request for the device ID from the A/V device, and in turn use a signal relay to modulate one or more phases of the AC current waveform according to a sequence that represents the device ID of the signaling-control device for the A/V device to detect. In various examples, the A/V device and/or the signaling-control device may modulate positive phases, or negative phases, to indicate a binary bit of "0," and allow current to flow for positive phases, or negative phases, to indicate a binary bit of "1." Accordingly, the devices may communicate binary bits using modulations of phases of an AC power signal, such as the AC current waveform, to provide information in various forms, such as single-bit instructions, multi-bit instructions, hexadecimal values, and so forth.

In some examples, the A/V device and/or the signaling-control device may modulate substantially all of a positive phase (e.g., the positive 180 degrees), or a negative phase (e.g., the negative 180 degrees) of the AC current waveform to indicate a "1" bit or a "0" bit. Depending on the logic in the A/V device and the signaling-control device, a modulation of a phase may indicate a "1," or a "0," in various examples. However, in some examples the A/V device and/or the signaling device may modulate the AC current waveform in smaller increments to indicate bits and to communicate data more efficiently or quickly. For example, the A/V device and/or the signaling-control device may modulate the first half of a positive phase (e.g., the initial 90 degrees of the positive phase), and allow the second half of the positive phase (e.g., the subsequent 90 degrees of the positive phase) of a period of an AC current waveform to indicate two bits within 180 degrees of the positive phase.

In some examples, the A/V device and/or the signaling-control device may allow for portions of the AC current waveform to pass through to ensure that a sufficient amount of power is provided to the devices without modulation. For example, half of each period of the AC current waveform may be designated as a "power bit" where the phase is not modulated to ensure that sufficient current is provided to one or both of the devices to power components of the devices. In this way, communications between the A/V device and the signaling-control device may be performed using the AC power signal in the doorbell circuit while still providing sufficient power for normal operation of the A/V device and/or the signaling-control device.

In further examples, the A/V device may control the flow of the AC power such that substantially all of the available power that the A/V device is rated to use may be provided to the A/V device without causing the signaling device to emit the sound. In traditional doorbell circuits, when more sophisticated doorbell devices (such as A/V doorbell devices) draw AC power to implement various functionality (e.g., powering a microphone, powering a camera, performing wireless communications, etc.), the amount of power drawn through the doorbell circuit may be high enough to inadvertently cause the signaling device to emit sound. Thus, sophisticated doorbell devices may be unable to perform some or all of their functions without inadvertently causing the signaling device to output sound. According to the techniques described herein, the signaling-control device may include a shunt switch that is connected in parallel with the signaling device, and the shunt switch may have a much lower impedance than the signaling device to ensure that AC power flows around, or bypasses, the signaling device while the A/V device is operating. While this technique allows the A/V device to operate without inadvertently causing the signaling device to emit sound, the A/V device may desire to communicate a request to the signaling-control device to remove the bypass and cause the signaling device to emit the sound, such as when a doorbell is pressed at the A/V device.

According to various examples described herein, the A/V device may control the flow of AC current in order to instruct the signaling-control device to either close the shunt switch to cause the AC power to bypass the signaling device, or open the shunt switch to cause the AC power to flow through the signaling device and cause the signaling device to emit sound. More specifically, the A/V device may use one or more signal relays to open the doorbell circuit, and/or close the doorbell circuit, to instruct the signaling-control device to activate and/or de-active the signaling device. In normal operation, or an "idle state," the signaling-control device may cause the AC power to bypass the signaling device and flow to the A/V device for use by components of the A/V device, such as the processor, microphone, camera, wireless communication component, etc. However, the A/V device may receive an instruction to cause the signaling device to emit sound, such as input received at a doorbell of the A/V device. In such examples, the A/V device may open a signal relay that is connected in series between the signaling-control device and the A/V device such that the doorbell circuit is in an open-circuit state where the AC current is no longer able to flow. The signaling-control device may detect the open-circuit state, such as by using a current-sense resistor and/or a voltage sense, and be configured to perform various operations based on detecting the open-circuit state. For instance, the signaling-control device may be configured to determine that the open-circuit state indicates a request from the A/V device to have the signaling device emit sound. Thus, the signaling-control device may remove the bypass around the signaling device, such as by opening a shunt switch, and allowing the AC current to flow through the signaling device.

Once the A/V device has created the open-circuit state for a sufficient period of time for the signaling-control device to detect the open-circuit state, the A/V device may create a closed-circuit state for the doorbell circuit by closing one or more signal relays. For example, the A/V device may cause the signal relay to close that is connected in series with the signaling device, and may further cause a signal relay to close that is connected in parallel with a power load of the A/V device. In this way, the power load of the A/V device may be bypassed by the parallel signal relay, thereby creating a shunt around the A/V device power load. In this way, the A/V device may close at least two signal relays in order to create a closed-circuit state such that current flowing through the doorbell circuit bypasses the A/V device. In this way, all of the current flowing through the doorbell circuit is drawn by the signaling device in order to cause the signaling device to emit sound.

After a predetermined period of time, or until input is no longer received at the doorbell button, the A/V device may signal to the signaling-control device to stop causing the signaling device to sound. For example, the A/V device may open at least the signal relay that is connected in series with the signaling-control device and the A/V device in order to create the open-circuit state for a period of time. The signaling-control device may detect, using at least one of a current-sense resistor or a voltage sense, the open-circuit state created by the A/V device. Responsive to detecting the open-circuit state, the signaling-control device may close the shunt switch in order to create a bypass around the signaling device. After the predetermined period of time, the A/V device may close the signal relay positioned between the signaling-control device and the A/V device, and open the signal relay that is connected in parallel with the power load of the A/V device (if not already opened) to place the A/V device back in the normal operating state. Stated otherwise, the A/V device may use the signal relays such that the AC current bypasses the signaling device and flows through the power load of the AC device. In this way, the A/V device may selectively control the flow of AC current through the doorbell circuit to communicate with the signaling-control device. In such examples, the A/V device may be able to draw the full rated amount of power for operating various components of the A/V device, and also be able to provide the full amount of power to the signaling device to emit sound. Further, the A/V device may communicate with the signaling-control device in order to ensure that the signaling device is not inadvertently activated when the A/V device draws AC current through the doorbell circuit.

In some examples, the signaling-control device may be configured to stop the signaling device from emitting sound after a predetermined period of time. For example, the signaling-control device may determine that the A/V device has instructed the signaling-control device to cause the signaling device to emit sound. However, the signaling-control device may not need further instructions from the A/V device. For instance, the signaling-control device may identify an instruction from the A/V device to cause the signaling device to emit sound, and cause AC current to flow through the signaling device to emit the sound. The signaling-control device may detect or determine an end of a predefined period of time (e.g., 5 seconds, 10 seconds, etc.), and cause the A/C current to bypass the signaling device to stop emitting the sound. In this way, the signaling-control device does not always receive further instruction from the A/V device indicating when to stop emitting sound using the signaling device.

While the techniques described herein are with reference to detecting modulation in AC current waveforms, the techniques are equally applicable for detecting changes/modulations in AC voltage waveforms. Additionally, any type of electrical switches, mechanical switches, and/or electromechanical switches may be used to perform the techniques described herein.

The following detailed description describes the present embodiments with reference to the drawings. In the drawings, reference numbers label elements of the present embodiments. These reference numbers are reproduced below in connection with the discussion of the corresponding drawing features.

FIG. 1 is a schematic diagram illustrating an example environment 100 that includes a doorbell system 102 for powering a doorbell device of a monitored location 104. In some examples, the doorbell device may be an audio and video (A/V) recording and communication device 106 (also referred to herein as A/V device 106) that monitors a field of view (FOV) 108 in front of the monitored location, where the field of view 108 includes a user 110 that is approaching the A/V device 106.

As illustrated, the monitored location 104 may include a structure (e.g., a house) that is being monitored by the A/V device 106 according to the FOV 108 of the A/V device 106. The A/V device 106 may monitor the physical environment in the FOV 108 for various reasons, including security reasons to identify or otherwise view people within a threshold proximity to the monitored location 104. In some examples, the A/V device 106 may be positioned at a location on a home similar to traditional doorbell devices, and may include a doorbell button to receive input for causing a doorbell signaling device to emit sound. The A/V device 106 may include one or more motion sensors that are at least periodically powered on to detect motion within the FOV 108 of the A/V device 106 (e.g., passive infrared (PIR) motion sensors, active infrared (AIR) motion sensors, etc.). In some examples, based on detecting motion within the FOV 108 of the A/V device 104, the A/V device 104 may activate (e.g., turn on, provide power to, etc.) a camera to begin generating image data. In further examples, based on detecting motion within a motion zone located within the FOV 108 of the A/V device 104, the A/V device 104 may begin generating the image data using the camera, and begin transmitting the image data over one or more networks (e.g., WANs, PANs, LANs, MANs, or any other network and/or combination thereof) and to one or more network devices.

In some examples, the image data may always be generated and may always be transmitted to the network device(s) (e.g., 24/7 video recording). However, in some examples the A/V device 106 may initially send a motion-based notification to the network device(s), which is in turn relayed to a client device registered for a user that is associated with the A/V device 106. Once the client device has received the notification (e.g., a push notification) indicating that the A/V device 106 has detected motion, the user may provide input using their client device that indicates they would like to view what is happening in the physical environment. In such examples, the A/V device 106 may be instructed by the network device(s) to start generating the image data and transmitting the image data to the network devices, which in turn may relay the image data to the client device.

Additionally, the A/V device 106 may include a microphone to generate audio data (such as speech of the user 110), and may further include a speaker to output audio data (such as speech from a remote user operating the client device). In this way, the A/V device 106 may perform various operations for monitoring the monitored location 104, such as using a motion sensor to detect movement, using a camera to capture image data representing the FOV 108, using a microphone to generate audio data, using a loudspeaker to output audio data, and/or streaming image data and/or audio data over network(s) to backend servers and/or client devices.

Additionally, the A/V device 106 may include a button that may receive input (e.g., capacitive-touch input, press input, near-touch input, etc.) to cause a doorbell signaling device to emit a sound. Thus, not only may the A/V device 106 include a doorbell button to receive input to cause a signaling device to emit a sound, similar to a traditional doorbell device, but the A/V device may perform the additional functionality described above. In light of these types of functions, the A/V device 106 may draw additional AC power, and/or additional AC current, compared to traditional doorbell devices.

As shown in FIG. 1, the doorbell system 102 may include the A/V device 106 that is installed or positioned on a doorbell circuit 112, and further include a signaling device 114 installed or positioned in the doorbell circuit 112 between the A/V device 106 and an AC power source 116. The signaling device 114 may be mechanical or electronic, in various embodiments. A mechanical signaling device creates its sound by using physical bells or bars and a mechanical hammer, and makes a traditional "ding-dong" sound. An electronic signaling device plays pre-recorded digital tones through an electronic speaker.

The AC power source may include a step-down transformer that may step down an AC voltage to an operating voltage for the signaling device 114 and/or the A/V device 106, such as a step-down from 120 volts AC to an operating voltage of 8-24 volts AC. The A/V device 106 and/or the signaling device 114 may draw AC power, and thus AC current, from the AC power source 116 to power various loads. For example, the signaling device 114 may draw AC power to signaling device 114 emit a sound upon receiving a large enough amount of AC power from the AC power source 116. Similarly, the A/V device 106 may draw AC power from the AC power source 116 to power various components, such as a wireless communication component, a camera, a microphone, a loudspeaker, etc.

It would be disadvantageous for the A/V device 106 to draw an amount of power from the AC power source 116 that is above the threshold necessary for causing the signaling device 114 to sound at any time other than when the doorbell button is pressed, because any inadvertent sounding of the signaling device 114 would not only be bothersome to the home's occupant(s), but would also undermine the usefulness of the doorbell. To prevent inadvertent sounding of the signaling device 114, a signaling-control device 120 may be coupled to the signaling device 114 to, among other functions, provide a bypass for the AC power to flow around the signaling device 114 when drawn by the A/V device 106.

The signaling-control device 120 may include a shunt 122 that is connected in parallel with the signaling device 114. The shunt 122 may facilitate the ability of the A/V device 106 to draw power from the AC power source 116 without inadvertently triggering the signaling device 114 to sound. The shunt 122, during normal standby operation, presents a relatively low electrical impedance, such as a few ohms, across the terminals of the signaling device 114. Most of the current drawn by the A/V device 106, therefore, flows through the shunt 122, and not through the signaling device 114. The shunt 122 and/or signaling-control device 120 may contain electronic circuitry that switches the shunt 122 between a state of low impedance, such as a few ohms, for example, and a state of high impedance, such as >1K ohms, for example. Thus, when the shunt 122 is closed, the AC current drawn by the A/V device may flow through the shunt 122, and when the shunt 122 is open, the AC current drawn through the doorbell circuit 112 may flow through the signaling device 114.

In various examples, the A/V device 106 may include, or control, an A/V series signal relay 124 that is connected in series between the signaling device 114 and the A/V device 106. In this way, when the A/V series signal relay 124 is open, the doorbell circuit 112 may be in an open-circuit state such that AC current is not able to flow through the doorbell circuit 112. The A/V device may include A/V control logic 126 configured to selectively open or close the A/V series signal relay 124 based on instructions received or determined at the A/V device 106. For example, the A/V device 106 may selectively open and close the A/V series signal relay 124 in order to modulate a phase of the AC current waveform, or a sequence of phases of the AC current waveform, to communicate with the signaling-control device 120.

As a specific example, the A/V control logic 126 may determine that the user 110 provided input at the doorbell button of the A/V device 106. In such examples, the A/V device 106 may selectively open the A/V series signal relay 124 to modulate one or more phases of the AC current waveform to indicate to the signaling-control device 120 that the doorbell button was pressed, and instruct the signaling-control device 120 to cause the signaling device 114 to emit sound. The signaling-control device 120 may detect, such as by using a current-sense resistor 128 and signaling device-current detect logic 130, the modulation of the phase(s) of the AC current waveform and determine that the A/V device 106 is instructing the signaling-control device 120 to cause the signaling device 114 to emit the sound. The signaling-control device 120 may then remove the bypass, or open the shunt 122, to allow the AC current to flow through the signaling device 114 to cause the signaling device 114 to emit the sound. The A/V device 106 may then subsequently modulate one or more phases of the AC waveform to instruct the signaling-control device 120 to stop the signaling device 114 from emitting the sound by closing the shunt 122 such that the AC current bypasses the signaling device 114.

In some examples, other types of communications may be performed by the A/V device 106. For example, the A/V device 106 may open and close the A/V series signal relay 124 to modulate one or more phases of the AC waveform according to a predefined sequence that represents a request for the signaling-control device 120 to provide certain information to the A/V device 106, such as a device identifier (ID) for the signaling-control device 120 and/or the signaling device 114. The signaling-control device 120 may identify the request for the device ID from the A/V device 106. For example, the signaling device-current detect logic 130 may detect, using the signaling device current-sense resistor 128, which phases of the AC current waveform are modulated by the opening of the A/V series signal relay 124, and determine information based on the modulation. In some examples, the A/V device 106 may open and close the A/V series signal relay 124 in order to modulate positive phases, or negative phases, to indicate a binary bit of "0," and allow current to flow for positive phases, or negative phases, to indicate a binary bit of "1." Accordingly, the A/V device 106 may communicate binary bits using modulations of phases of an AC power signal, such as the AC current waveform, to provide information in various forms, such as single-bit instructions, multi-bit instructions, hexadecimal values, etc.

In some examples, the A/V device 106 may modulate substantially all of a positive phase (e.g., the positive 180 degrees), or a negative phase (e.g., the negative 180 degrees) of the AC current waveform to indicate a "1" bit or a "0" bit. Depending on the logic in the A/V device 106 and the signaling-control device 120, a modulation of a phase may indicate a "1," or a "0," in various examples. However, in some examples the A/V device 106 and/or the signaling device 120 may modulate the AC current waveform in smaller increments to indicate bits and to communicate data more efficiently or quickly. For example, the A/V device 106 and/or the signaling-control device 120 may modulate the first half of a positive phase (e.g., the initial 90 degrees of the positive phase), and allow the second half of the positive phase (e.g., the subsequent 90 degrees of the positive phase) of a period of an AC current waveform to indicate two bits within 180 degrees of the positive phase.

The signaling-control device 120 may identify one or more modulations of the AC current waveform caused by the opening and closing of the A/V series signal relay 124. The signaling device-current detect 130 may write those modulations to memory in the form of binary bits, such as by writing a "1" to memory to indicate a non-modulated phase portion of the AC current waveform, and writing a "0" to memory to indicate a modulated phase portion of the AC current waveform. The signaling-control device 120 may then determine various commands or instructions based on the one or more bits, or the specific sequence of bits. For example, the instructions may be an instruction to open the shunt 122 to cause the signaling device 1114 to receive current and cause the signaling device 114 to output the sound. The instruction indicated by the bit or sequence of bits may comprise an instruction to communicate various data back to the A/V device 106, such as an instruction to indicate a device ID of the signaling-control device 120 and/or the signaling device 114.

Thus, in some examples the signaling-control device 120 may be configured to modulate phases of the AC current waveform that are flowing through the doorbell circuit 112. For instance, the signaling-control device 120 may also include, or control, a signaling device signal relay 132 configured to be selectively opened and closed. The signaling-control device 120 may include signaling-control logic 134, which causes the signaling device signal relay 132 to selectively open or close to modulate phases of the AC current waveform in order to communicate data back to the A/V device 106. For example, the signaling-control logic 134 may determine a signal to use to cause the signaling device signal relay 132 to open and close to modulate one or more phase of the AC current waveform to provide a representation of a device ID for the signaling-control device 120, such as a sequence of bits indicating a hexadecimal representation of the device ID. To determine the data being communicated by the signaling-control device 120 using the phase of the AC current waveform, the A/V device 106 may also include an A/V current-sense resistor 136 and associated A/V current detect logic 138. The A/V current detect logic 138 may identify bits represented by the modulated phase(s) of the AC current waveform in order to determine information or data being communicated. The A/V current detect logic 138 may similarly write the bits to memory, and take one or more actions based on the data received, such as storing an indication of the device identifier for the signaling-control device 120. As illustrated, the A/V current-sense resistor 136 may be disposed between two terminals of the A/V device 106. Thus, the A/V device 106 may include two terminals that are connectable in series with the signaling-control device 120 in the doorbell circuit 112.

In some examples, the A/V device 106 and/or the signaling-control device 120 may allow for portions of the AC current waveform to pass through to ensure that a sufficient amount of power is provided to the devices without modulation. For example, half of each period of the AC current waveform may be designated as a "power bit" where the phase is not modulated to ensure that sufficient current is provided to one or both of the devices to power components of the devices. In this way, communications between the A/V device 106 and the signaling-control device 120 may be performed using the AC power signal in the doorbell circuit 112 while still providing sufficient power for normal operation of the A/V device 106 and/or signaling-control device 120.

Accordingly, the signaling-control device 120 and the A/V device 106 may communicate information with each other by modulating phase portions of an AC current waveform, as described in more detail in FIGS. 2A-2F.

Generally, the signaling device signal relay 132, the A/V series signal relay 124, and/or the shunt 122 may comprise, or include, any type of electrical-based switch, mechanical-based switch, and/or electromechanical-based switch. For instance, one or all of the signaling device signal relay 132, the A/V series signal relay 124, and/or the shunt 122 may include, and/or be driven by, a triac (Triode for Alternating Current) device, a transistor device (e.g., a BJT (Bipolar Junction Transistor), a MOSFET (Metal-Oxide Semiconductor Field-Effect Transistor), etc.), and/or any other type of switching mechanism or device. Additionally, the signaling device current-sense resistor 128 and/or the A/V current-sense resistor 136 may comprise, for example, a shunt resistor configured to detect a voltage drop that is proportional to the current going through the resistor. Thus, the signaling device-current detect logic 130 and the A/V current detect logic 138 may detect drops in voltage across the signaling device current-sense resistor 128 and the A/V current-sense resistor 136, respectively, and based on the impedance of the resistor, determine or detect changes in the AC current waveform, such as modulations.

FIGS. 2A-2F represent example AC current waveforms that have been modulated by the A/V device 106 and/or the signaling-control device 120 in order to communicate data, such as device IDs and/or instructions, between the two devices.

Figure 2A:
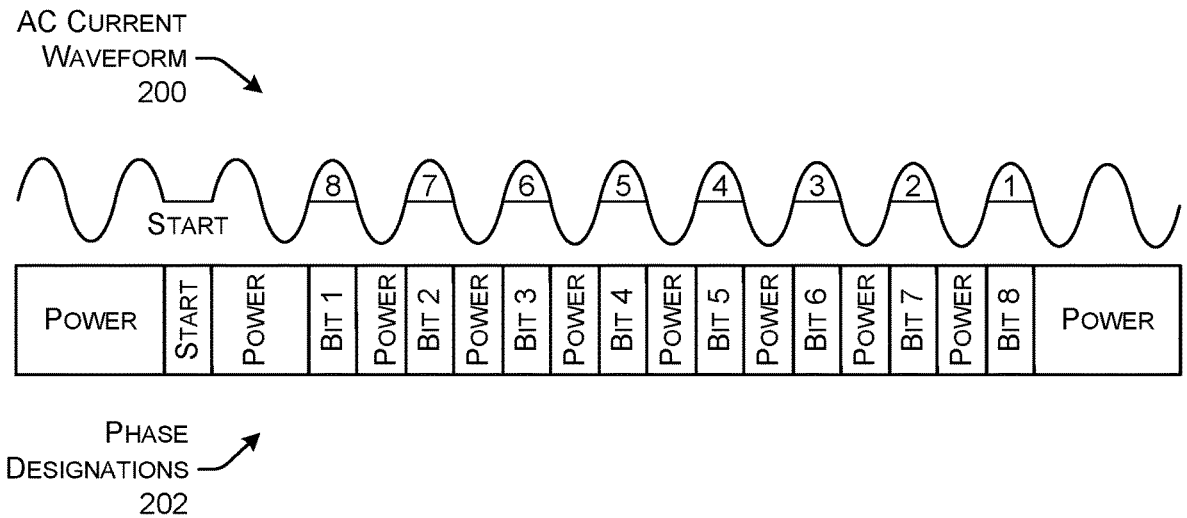
FIGS. 2A-2F are schematic diagrams represent example AC current waveforms that have been modulated by an A/V device and/or a signaling-control device in order to communicate data, such as device IDs and/or instructions, between the two devices, according to various aspects of the present disclosure.

FIG. 2A illustrates an example AC current waveform 200 that is drawn through the doorbell circuit 112 by at least one of the A/V device 106, the signaling-control device 120, and/or the signaling device 114. In some examples, the A/V device 106 and the signaling-control device 120 may be configured to analyze AC current waveforms 200 according to the indicated phase designations 202. For example, the A/V device 106 and the signaling-control device 120 may be configured to detect a start bit, which may comprise a modulation of a negative phase of a period of the AC current waveform 200, such as approximately 180 degrees of a period of the waveform 200. The "start" bit may indicate to the A/V device 106 and/or the signaling-control device 120 that subsequent modulations of the AC current waveform 200 indicate information or data being communicated. Subsequent to the "start" bit may be one or more phases that are designated for supplying power to the devices followed by phase designations 202 for bits to be communicated by the A/V device 106 and/or the signaling-control device 120.

For example, for eight consecutive periods of the AC current waveform 200, the positive phase portions of each segment may be designated in the phase designations 202 as being bits that indicate a "1" or a "0" depending on whether the A/V device 106 and/or the signaling-control device 120 modulate the phase. Thus, the positive phase portions, such as roughly 180 degrees of the wave period or wave cycle, may be designated as bits to convey data, and the negative phase portions, such as roughly 180 degrees of the wave period, may be designated as power to ensure that the A/V device 106 and/or the signaling-control device 120 receive sufficient power to operate. The A/V device 106 and/or the signaling-control device 120 may be configured to detect the "start" bit, and identify whether the positive phase portions designated in the phase designations 202 are modulated or not. The A/V device 106 and/or the signaling-control device 120 may write "1s" or "0s" to memory based on detecting a modulation, or a lack of modulation, for each of the bits 1-8. In this way, the A/V device 106 and/or the signaling-control device 120 may communicate information by modulating phases of an AC current waveform 200, and be configured to understand which phases following a "start" bit indicate a "1" or a "0."

Figure 2B:
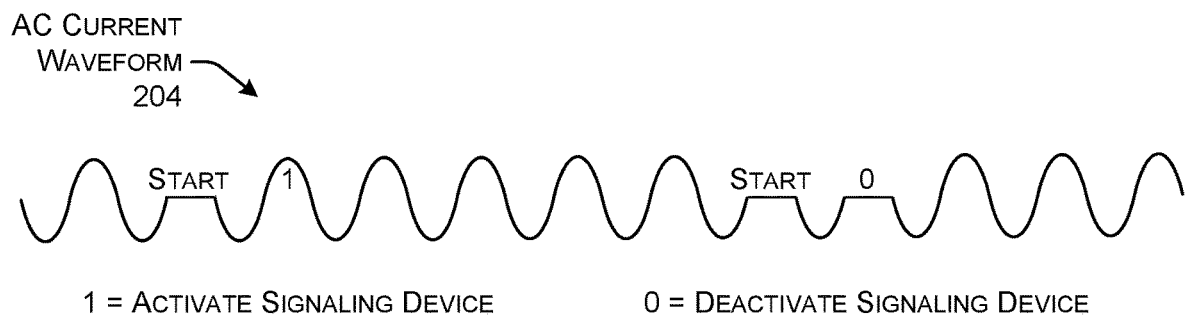

FIG. 2B illustrates an example AC current waveform 204 that is modulated by the A/V device 106 in order to instruct the signaling-control device 120 to cause the signaling device 114 to output sound. As shown, the AC current waveform 204 may begin the communication with a designed "start" bit, which may comprise a modulation of a positive phase portion of a wave period. Following the start bit, the next positive phase portion may indicate a "1," which is ready by the signaling-control device 120 and indicates a command to active the signaling device. Thus, when the signaling-control device detects a modulation of a positive phase portion, or the "start" bit, in a wave cycle, and detects a non-modulation (or a "1") of the following wave cycle's positive phase, the signaling-control device 120 may determine that the A/V device 106 is instructing the signaling-control device 120 to open the shunt 122 such that the AC current waveform flows through the signaling device 114 to cause the signaling device 114 to output sound.

After a pre-determined period of time, or when the user stops providing input to the doorbell button at the A/V device 106, the A/V device may modulate another positive phase of a waveform cycle of the AC current waveform 204 to indicate the "start" of another communication, and may further modulate the positive phase of the following waveform cycle. This "0" bit that follows the "start" bit may indicate a command from the A/V device 106 to deactivate the signaling device 114. The signaling-control device 120 may detect the start bit followed by the "0" bit and cause the shunt 122 to close, thereby resulting in the AC current waveform 204 to bypass the signaling device 114 and flow to the A/V device 106. The modulations are merely exemplary, and any type of modulation scheme may be used to indicate requests to start and/or stop causing the signaling device 114 to output sound.

Figure 2C:
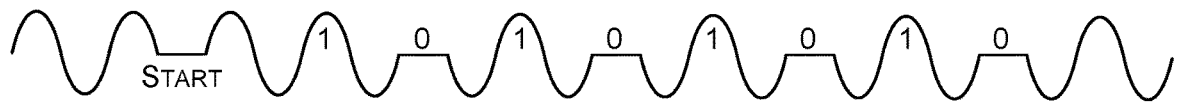

FIG. 2C illustrates another example AC current waveform 206 along with example phase designations 208. In this scenario, the A/V device 106 may communicate an instruction using the AC current waveform 206 to the signaling-control device 120. For example, the A/V device 106 may selectively modulate the AC current waveform 206 to indicate a request for the device ID from the signaling-control device 120. As illustrated, the A/V device 106 may modulate a negative phase portion of the AC current waveform 206 to indicate the "start" bit, and for the remaining designated bits, selectively modulate phases to indicate a byte value of "10101010" which, in hexadecimal, is the hexadecimal value of "AA." In some examples, the byte value may be designated to be a communication for "request ID" such that, when the signaling-control device 120 identifies the modulations of the AC current waveform 206 according to the bye value of "10101010," the signaling-control device 120 may determine that the A/V device 106 is requesting that the signaling-control device 120 respond with a communication indicating the device ID.

In some examples, the AC current waveform 206 may indicate other communications and/or data. For instance, the AC current waveform 206 may be modulated to indicate to the signaling-control device 120 a specific melody or sound it is to play. For instance, the signaling-control device 120 may have multiple sounds or melodies it is configured to play, and may determine which of those sounds or melodies that the signaling device 114 is to output based on the bits in the modulation of the AC current waveform 206. As another example, the AC current waveform 206 may be modulated to indicate to the signaling-control device 120 how long the sound is to be emitted by the signaling device 114. For example, the byte value indicated by the modulation of the AC current waveform 206 may indicate that the signaling-control device 120 is to divert AC current to the signaling device 114 for 5 seconds, 10 seconds, etc.

Figure 2D:
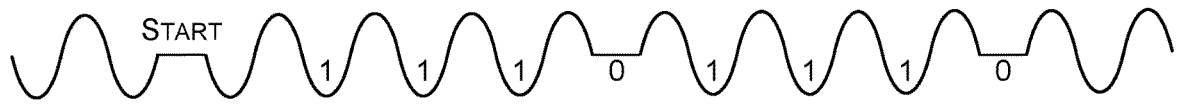

FIG. 2D illustrates another example of an AC current waveform 210 along with example phase designations 212. In this scenario, the signaling-control device 120 may communicate a device ID using the AC current waveform 210 to the A/V device 106. For example, the signaling-control device 120 may selectively modulate the AC current waveform 210 to indicate its device ID. As illustrated, the signaling-control device 120 may modulate a positive phase portion of the AC current waveform 210 to indicate the "start" bit, and for the remaining designated bits, selectively modulate phases to indicate a byte value of "11101110" which, in hexadecimal, is the hexadecimal value of "EE." In some examples, the byte value may be "EE" and correspond to a device identifier for the signaling-control device 120 and/or the signaling device 114. When the A/V device 106 identifies the modulations of the AC current waveform 210 according to the bye value of "11101110," the A/V device 106 may store an indication of the device ID of the signaling-control device 120.

Figure 2E:
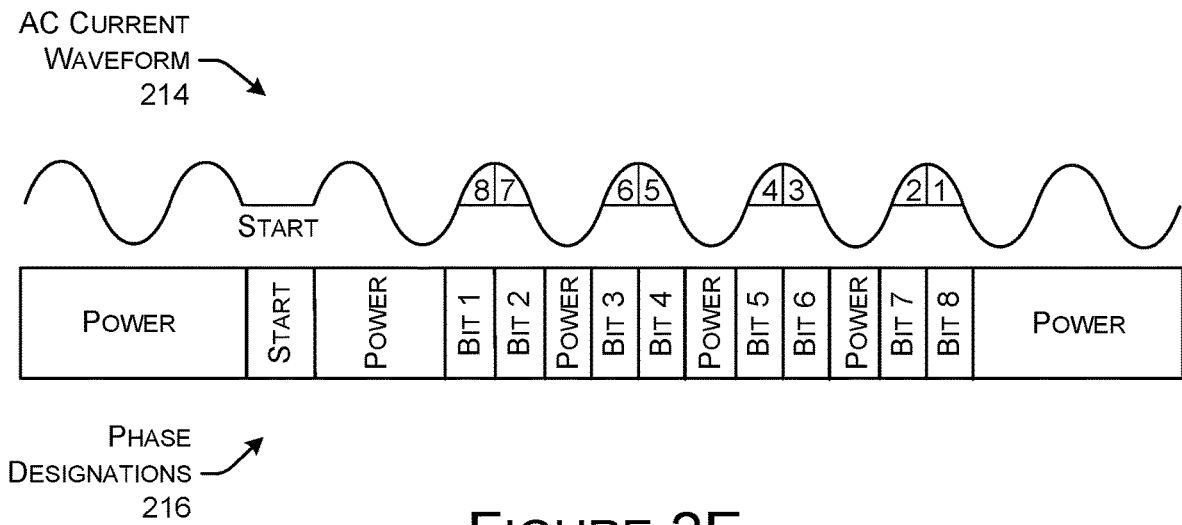

FIG. 2E illustrates another example of an AC current waveform 214 along with example phase designations 216. In some examples, the A/V device 106 and the signaling-control device 120 may be configured to analyze AC current waveforms 214 according to the indicated phase designations 216. For example, the A/V device 106 and the signaling-control device 120 may be configured to detect a start bit, which may comprise a modulation of a negative phase of a period of the AC current waveform 200, such as approximately 180 degrees of a period of the waveform 200. The "start" bit may indicate to the A/V device 106 and/or the signaling-control device 120 that subsequent modulations of the AC current waveform 200 indicate information or data being communicated. Subsequent to the "start" bit may be one or more phases that are designated for supplying power to the devices followed by phase designations 202 for bits to be communicated by the A/V device 106 and/or the signaling-control device 120.

For example, for four consecutive periods of the AC current waveform 200, the positive phase portions of each segment may be designated in the phase designations 216 as being two bits that indicate a "1" or a "0" depending on whether the A/V device 106 and/or the signaling-control device 120 modulate the phase. Thus, the positive phase portions may be split into two portions, such as roughly two 90-degree portions of the 180 degrees portion of the wave period or wave cycle, may be designated as bits to convey data, and the negative phase portions, such as roughly 180 degrees of the wave period, may be designated as power to ensure that the A/V device 106 and/or the signaling-control device 120 receive sufficient power to operate. The A/V device 106 and/or the signaling-control device 120 may be configured to modulate and/or detect the "start" bit, and modulate, or identify modulations, of roughly half (e.g., 90 degrees) of the positive phase portions of the AC current waveform 214 as being modulated or not. The A/V device 106 and/or the signaling-control device 120 may modulate and/or write "1s" or "0s" to memory based on detecting a modulation, or a lack of modulation, for each of the bits 1-8 represented in the four waveform cycles. In this way, the A/V device 106 and/or the signaling-control device 120 may communicate information by modulating phases of an AC current waveform 200, and be configured to understand which phases following a "start" bit indicate a "1" or a "0." Further, more bits may be communicated in less amounts of the AC current waveform 214 may designating, in the phase designations 216, a positive (or negative) phase portion as representing two bits in 90-degree portions of the 180-degree phase portion.

Figure 2F:
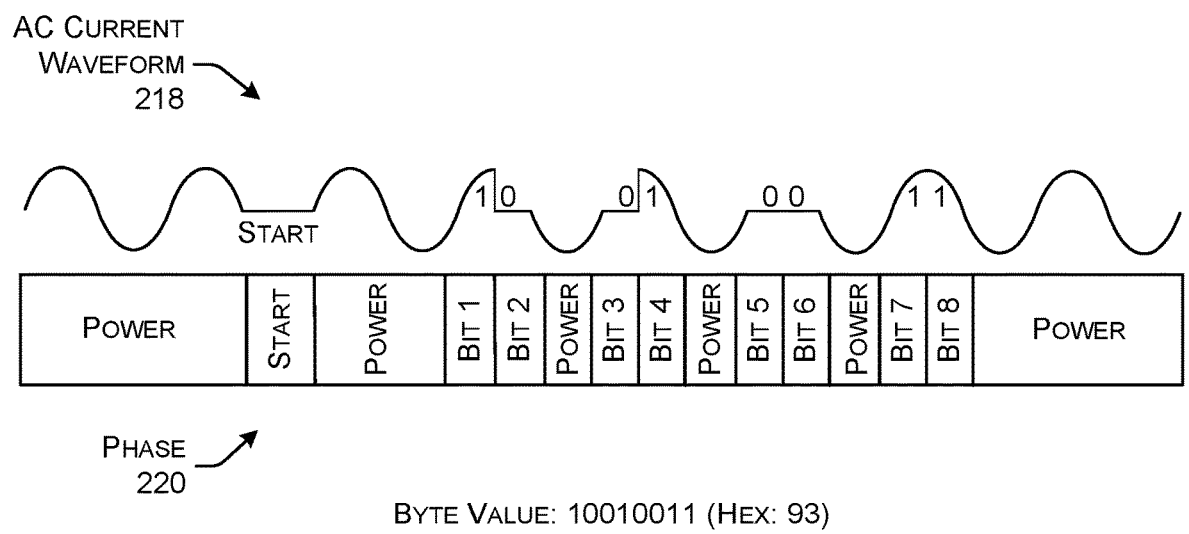
Figure 3B:
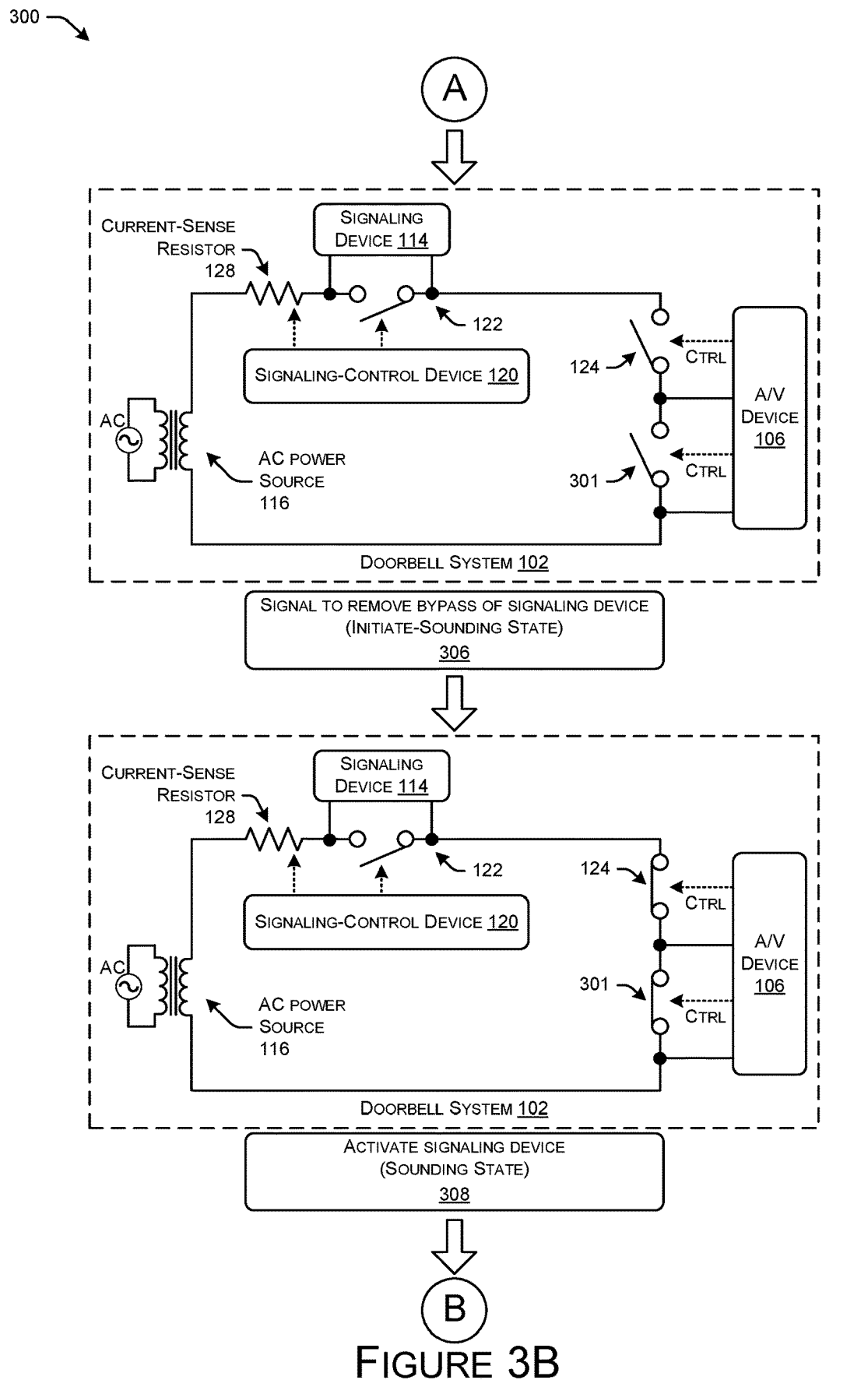
Figure 3D:
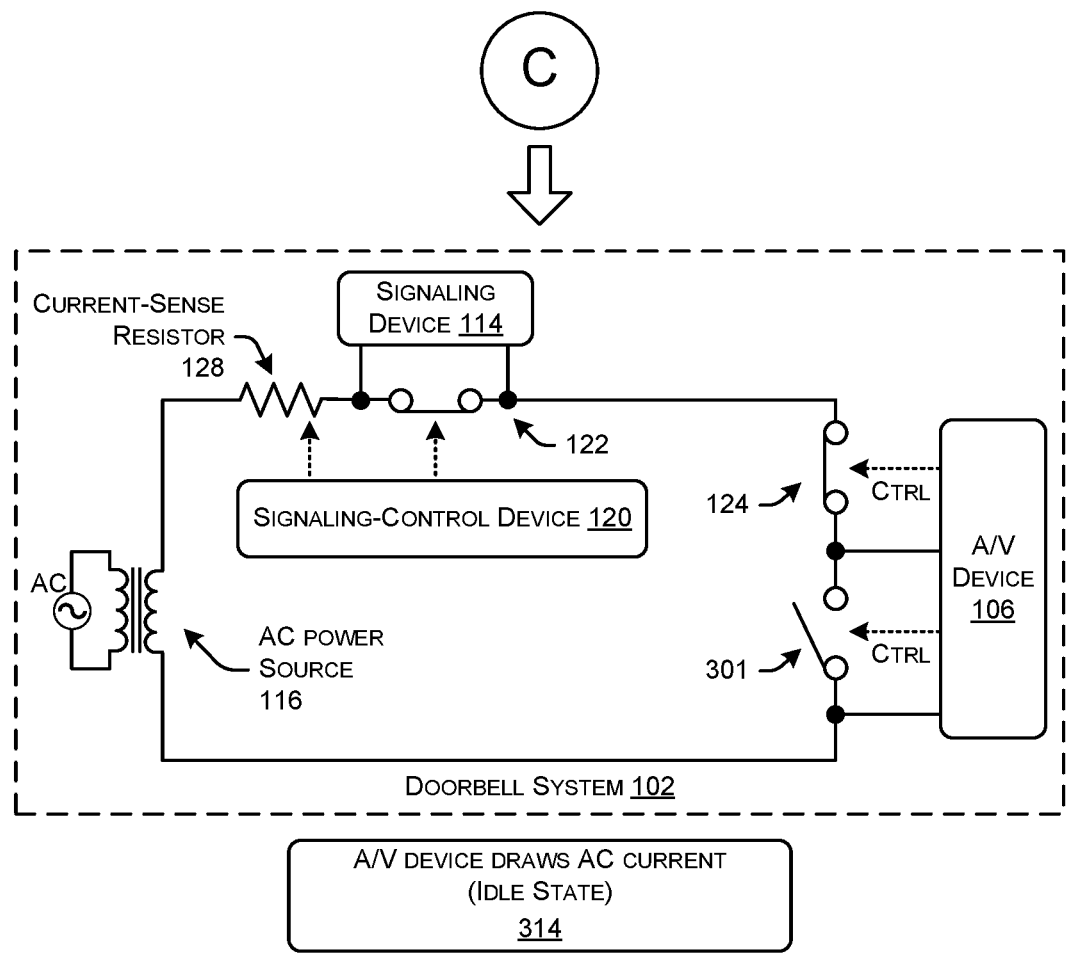

FIG. 2F illustrates an example AC current waveform 218 that is modulated by the A/V device 106 and/or the signaling-control device 120 in order to communicate data between devices using the AC current waveform 218. As illustrated, the AC current waveform 218 may begin the communication with a designed "start" bit, which may comprise a modulation of a negative phase portion of a wave period. Following the start bit, the next positive phase portion may indicate two bits, in roughly 980-degree portions, such as a "1" and a "0." The following positive phase portion for the next wave cycle may be selectively modulated to indicate, in 90-degree portions, a "0" followed by a "1." Similarly, the two following positive phase portions in the following two wave cycles may indicate bits of "0," "0," "1," and "1" to represent a byte value of "10010011" or a hex value of 93.

Generally, the techniques described with reference to FIGS. 2A-2F may be performed in many different ways. Stated otherwise, modulating phase portions of an AC current waveform may be performed in various ways to communicate data, and the techniques described herein are not limited to the examples shown in FIGS. 2A-2F. For instance, any portion of the phase of an AC current waveform may be modulated to indicate data. Further, power bits need not necessarily be used between data bits, such as in examples where the A/V device 106 and/or signaling-control device 120 have internal power supplies (e.g., battery, super capacitors, capacitors, etc.). Even further, any arrangement of modulations, sequence of modulations, phase portions that are modulated, etc., may be used according to the techniques described herein. Generally, the techniques described herein include any type of communication performed at least in part by modulating at least a portion of a phase of an AC current waveform, or AC power waveform, to indicate data.

FIGS. 3A-3D illustrate a flow diagram of a process 300 for the A/V device to control the flow of AC current in order to instruct the signaling-control device 120 to either close the shunt 122 to cause the AC power to bypass the signaling device 114, or open the shunt 122 to cause the AC power to flow through the signaling device 114 and cause the signaling device 114 to emit sound. More specifically, the A/V device 106 may use one or more signal relays to open the doorbell circuit 112, and/or close the doorbell circuit 112, to instruct the signaling-control device 120 to activate and/or de-active the signaling device 114. As illustrated in FIGS. 3A-3D, the A/V device 106 may not only include the A/V series signal relay 124, but may further include an A/V shunt signal relay 301. Generally, the A/V shunt signal relay 301 may comprise any type of switch that is connected in parallel with at least a power load of the A/V device 106, and potentially the entire A/V device 106. Accordingly, when the A/V device 106 closes the A/V shunt signal relay 301, the AC current flowing through the doorbell circuit 112 may bypass the A/V device 106, thereby creating a closed circuit where the A/V device 106 is bypassed (assuming the A/V series signal relay 124 is closed as well).

At 302, the doorbell circuit 112 may be in a normal operation mode, or an "idle state," where the shunt 122 is closed, the A/V series signal relay 124 is closed and the A/V shunt signal relay 301 such that the AC current flowing in the doorbell circuit 112 bypasses the signaling device 114 and passes through the A/V device 106. In this idle state, the A/V device 106 may draw as much current as it is rated to draw without inadvertently causing the signaling device 114 to emit sound. For example, the signaling-control device 120 may cause the AC power to bypass the signaling device 114 and flow to the A/V device 106 for use by components of the A/V device, such as the processor, microphone, camera, wireless communication component, etc.

At 304, the A/V device 106 may signal to the signaling-control device 120 to activate the signaling device 114. In some examples, the A/V device 106 may receive an instruction to cause the signaling device 114 to emit sound, such as input received at a doorbell button of the A/V device 106. In such examples, the A/V device 106 may open the A/V series signal relay 124, and potentially the A/V shunt signal relay 301, such that the doorbell circuit 112 is in an open-circuit state where the AC current is no longer able to flow. The signaling-control device 120 may detect the open-circuit state, such as by using the signaling device current-sense resistor 128 and/or a voltage sense, and be configured to perform various operations based on detecting the open-circuit state. For instance, the signaling-control device 120 may be configured to determine that the open-circuit state indicates a request from the A/V device 106 to have the signaling device 114 emit sound.

At 306, the signaling-control device 120 may remove the bypass around the signaling device 114, such as by opening the shunt 112, to initiate a sounding state. However, the A/V series signal relay 124 is still open, creating the open doorbell circuit 112. Thus, the AC current is not able to flow through the doorbell circuit 112.

At 308, the signaling device 114 may be activated, causing the doorbell circuit 112 to enter into a sounding state. For instance, once the A/V device 106 has created the open-circuit state for a sufficient period of time for the signaling-control device 120 to detect the open-circuit state, the A/V device 106 may create a closed-circuit state for the doorbell circuit 112 by closing the A/V series signal relay 124 and the A/V shunt signal relay 301. The A/V device may cause the A/V series signal relay 124, which is connected in series with the signaling device 114, to close, and may further cause the A/V shunt signal relay 301, which is connected in parallel with a power load of the A/V device 106, to close. In this way, the power load of the A/V device 106 may be bypassed by the A/V shunt signal relay 301 thereby creating a shunt around the A/V device 106 power load. In this way, the A/V device 106 may close at least two signal relays in order to create a closed-circuit state such that current flowing through the doorbell circuit 112 bypasses the A/V device 106. In this way, all of the current flowing through the doorbell circuit 112 is drawn by the signaling device 114 in order to cause the signaling device 114 to emit sound.

At 310, the A/V device 106 may enter an initiate-idle state by signaling, or instructing, the signaling-control device 120 to have the AC current bypass the signaling device 114. For example, after a predetermined period of time, or until input is no longer received at the doorbell button, the A/V device 106 may signal to the signaling-control device 120 to stop causing the signaling device 114 to sound. The A/V device 106 may open at least the A/V series signal relay 124 that is connected in series with the signaling-control device 120 and the A/V device 106 in order to create the open-circuit state for a period of time. The signaling-control device 120 may detect, using at least one of a current-sense resistor 1281 or a voltage sense, the open-circuit state created by the A/V device 108. Responsive to detecting the open-circuit state, the signaling-control device 120 may close the shunt 122 in order to create a bypass around the signaling device 114 and signaling device 114.

At 312, the signaling device 114 may be bypassed by the shunt 122, and the doorbell circuit 112 may be in an open circuit state. For instance, the A/V series signal relay 124 may be open, and the A/V shunt signal relay 301 may also be open in some examples, such that AC current is not able to flow through the doorbell circuit 112.

At 314, the A/V device 106 may enter into the idle state and draw AC current from the AC power source 116. For instance, after a predetermined period of time, the A/V device 106 may close the A/V series signal relay 124 positioned between the signaling-control device 120 and the A/V device 106, and open the A/V shunt signal relay 301 (if not already opened) that is connected in parallel with at least the power load of the A/V device 106 (if not already opened) to place the A/V device 106 back in the normal operating state. Stated otherwise, the A/V device 106 may use the signal relays such that the AC current bypasses the signaling device 114 and flows through the power load of the AC device 106. In this way, the A/V device 106 may selectively control the flow of AC current through the doorbell circuit 112 to communicate with the signaling-control device 120. In such examples, the A/V device 106 may be able to draw the full rated amount of power for operating various components of the A/V device 106, and also be able to provide the full amount of power to the signaling device 114 to emit sound. Further, the A/V device 106 may communicate with the signaling-control device 120 in order to ensure that the signaling device 114 is not inadvertently activated when the A/V device 106 draws AC current through the doorbell circuit 112.

Figure 4:
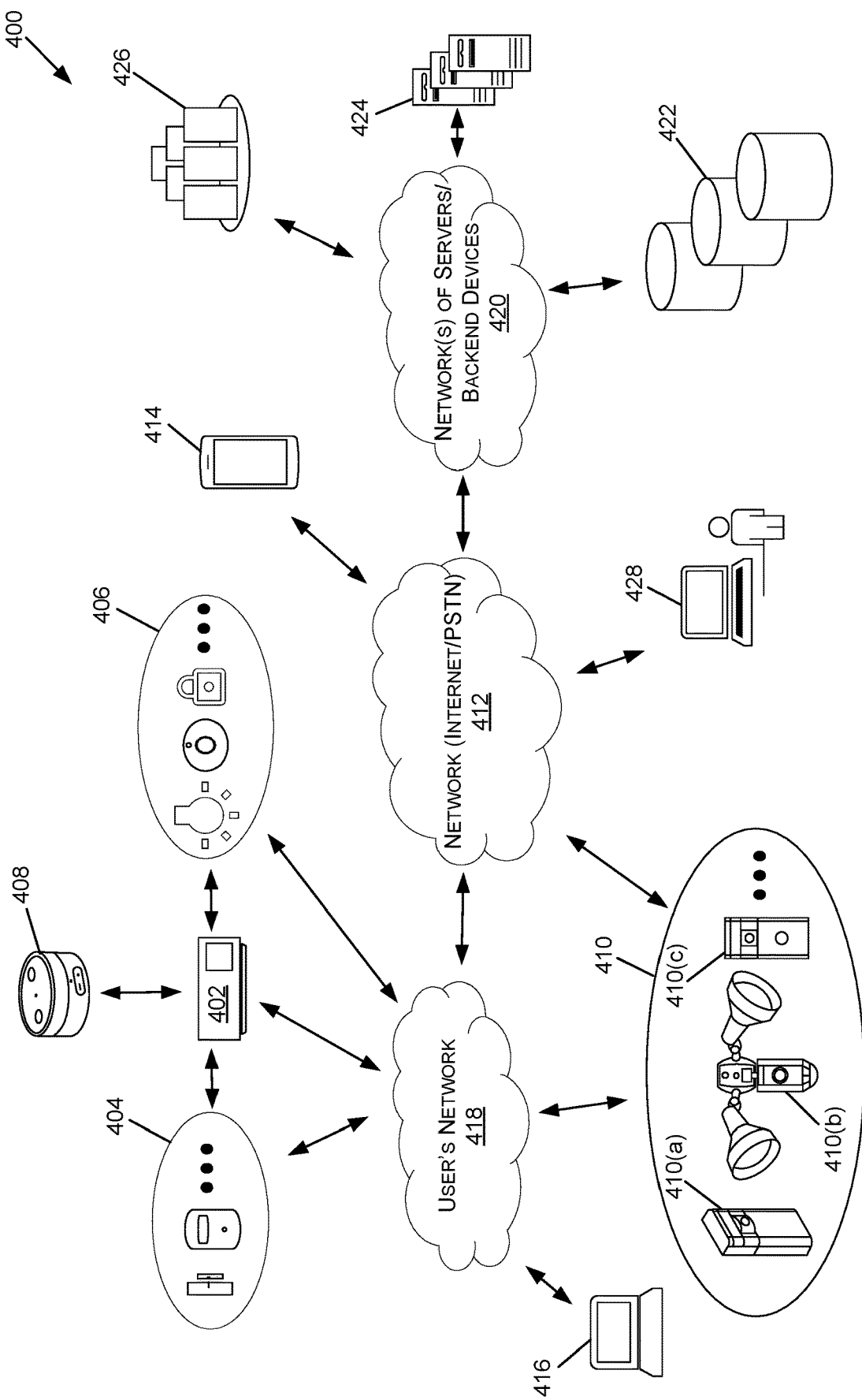
FIG. 4 is a functional block diagram illustrating a system for communicating in a network according to various aspects of the present disclosure.

FIG. 4 is a functional block diagram illustrating a system 400 for communicating in a network according to various aspects of the present disclosure. Home automation, or smart home, is building automation for the home. Home automation enable users (e.g., home owners and authorized individuals) to control and/or automate various devices and/or systems, such as lighting, heating (e.g., smart thermostats), ventilation, home entertainment, air conditioning (HVAC), blinds/shades, security devices (e.g., contact sensors, smoke/CO detectors, motion sensors, etc.), washers/dryers, ovens, refrigerators/freezers, and/or other network connected devices suitable for use in the home. In various embodiments, Wi-Fi is used for remote monitoring and control of such devices and/or systems. Smart home devices (e.g., hub devices 402, sensors 404, automation devices 406, a virtual assistant (VA) device 408, Audio/Video (A/V) recording and communication devices 410, etc.), when remotely monitored and controlled via a network (Internet/a public switched telephone network (PSTN)) 412, may be considered to be components of the "Internet of Things." Smart home systems may include switches and/or sensors (e.g., the sensors 404) connected to a central hub such as the smart-home hub device 402 and/or the VA device 408 (the hub device 402 and/or the VA device 408 may alternatively be referred to as a gateway, a controller, a home-automation hub, or an intelligent personal assistance device) from which the system may be controlled through various user interfaces, such as voice commands and/or a touchscreen. Various examples, of user interfaces may include any or all of a wall-mounted terminal (e.g., a keypad, a touchscreen, etc.), software installed on the client devices 414, 416 (e.g., a mobile application), a tablet computer, or a web interface. Furthermore, these user interfaces are often but not always supported by Internet cloud services. In one example, the Internet cloud services are responsible for obtaining user input via the user interfaces (e.g., a user interface of the hub device 402 and/or the VA device 408) and causing the smart home devices (e.g., the sensors 404, the automation devices 406, etc.) to perform an operation in response to the user input.

The hub device 402, the VA device 408, the sensors 404, the automation devices 406, the A/V recording and communication devices 410, and/or client devices 414, 416 may use one or more wired and/or wireless communication protocols to communicate, including, for example and without limitation, Wi-Fi (e.g., the user's network 418), X10, Ethernet, RS-485, 6LoWPAN, Bluetooth LE (BLE), ZigBee, Z-Wave, and/or a low power wide-area networks (LPWAN), such as a chirp spread spectrum (CSS) modulation technology network (e.g., LoRaWAN), an Ultra Narrow Band modulation technology network (e.g., Sigfox, Telensa, NB-IoT, etc.), RingNet, and/or the like.

The user's network 418 may be, for example, a wired and/or wireless network. If the user's network 418 is wireless, or includes a wireless component, the user's network 418 may be a Wi-Fi network compatible with the IEEE 802.11 standard and/or other wireless communication standard(s). Furthermore, the user's network 418 may be connected to other networks such as the network 412, which may comprise, for example, the Internet and/or PSTN.

The system 400 may include one or more A/V recording and communication devices 410 (alternatively be referred to herein as "A/V devices 410" or "A/V device 410") (which may represent, and/or be similar to, the A/V device 106 of FIGS. 1, 2A-2F, and 3A-3D). The A/V devices 410 may include security cameras 410(a), light cameras 410(b) (e.g., floodlight cameras, spotlight cameras, etc.), video doorbells 410(c) (e.g., wall powered and/or battery powered video doorbells), and/or other devices capable of recording audio data and/or image data. The A/V devices 410 may be configured to access a user's network 418 to connect to a network (Internet/PSTN) 412 and/or may be configured to access a cellular network to connect to the network (Internet/PSTN) 412. The components and functionality of the A/V devices 410 are described in more detail below with respect to FIG. 5.

The system 400 may further include a smart-home hub device 402 (which may alternatively be referred to herein as the "hub device 402") connected to the user's network 418 and/or the network (Internet/PSTN) 412. The smart-home hub device 402 (also known as a home automation hub, gateway device, or network device), may comprise any device that facilitates communication with and control of the sensors 404, automation devices 406, the VA device 408, and/or the one or more A/V devices 410. For example, the smart-home hub device 402 may be a component of a security system and/or a home automation system installed at a location (e.g., a property, a premise, a home, a business, etc.). In some embodiments, the A/V devices 410, the VA device 408, the sensors 404, and/or the automation devices 406 communicate with the smart-home hub device 402 directly and/or indirectly using one or more wireless and/or wired communication protocols (e.g., BLE, Zigbee, Z-Wave, etc.), the user's network 418 (e.g., Wi-Fi, Ethernet, etc.), and/or the network (Internet/PSTN) 412. In some of the present embodiments, the A/V devices 410, the VA device 408, the sensors 404, and/or the automation devices 406 may, in addition to or in lieu of communicating with the smart-home hub device 402, communicate with the client devices 414, 416, the VA device 408, and/or one or more of components of the network of servers/backend devices 420 directly and/or indirectly via the user's network 418 and/or the network (Internet/PSTN) 412. In some examples, at least one of the network(s) 112 may correspond to, or include, the network 412.

As illustrated in FIG. 4, the system 400 includes the VA device 408. The VA device 408 may be connected to the user's network 418 and/or the network (Internet/PSTN) 412. The VA device 408 may include an intelligent personal assistant, such as, without limitation, Amazon Alexa® and/or Apple Siri®. For example, the VA device 408 may be configured to receive voice commands, process the voice commands to determine one or more actions and/or responses (e.g., transmit the voice commands to the one or more components of the network of servers/backend devices 420 for processing), and perform the one or more actions and/or responses, such as to activate and/or change the status of one or more of the sensors 404, automation devices 406, or A/V devices 410. In some embodiments, the VA device 408 is configured to process user inputs (e.g., voice commands) without transmitting information to the network of servers/backend devices 420 for processing. The VA device 408 may include at least one speaker (e.g., for playing music, for outputting the audio data generated by the A/V devices 410, for outputting the voice of a digital assistant, etc.), at least one a microphone (e.g., for receiving commands, for recording audio data, etc.), and a display (e.g., for displaying a user interface, for displaying the image data generated by the A/V devices 410, etc.). In various embodiments, the VA device 408 may include an array of speakers that are able to produce beams of sound. Although illustrated as a separate component in FIG. 4, in some embodiments the VA device 408 may not be a separate component from the hub device 402. In such embodiments, the hub device 402 may include the functionality of the VA device 408 or the VA device 408 may include the functionality of the hub device 402.

The one or more sensors 404 may include, for example, at least one of a door sensor, a window sensor, a contact sensor, a tilt sensor, a temperature sensor, a carbon monoxide sensor, a smoke detector, a light sensor, a glass break sensor, a freeze sensor, a flood sensor, a moisture sensor, a motion sensor, and/or other sensors that may provide the user/owner of the security system a notification of a security event at his or her property.

The one or more automation devices 406 may include, for example, at least one of an outdoor lighting system, an indoor lighting system, and indoor/outdoor lighting system, a temperature control system (e.g., a thermostat), a shade/blind control system, a locking control system (e.g., door lock, window lock, etc.), a home entertainment automation system (e.g., TV control, sound system control, etc.), an irrigation control system, a wireless signal range extender (e.g., a Wi-Fi range extender, a Z-Wave range extender, etc.) a doorbell chime, a barrier control device (e.g., an automated door hinge), a smart doormat, and/or other automation devices.

As described herein, in some of the present embodiments, some or all of the client devices 414, 416, the A/V device(s) 410, the smart-home hub device 402, the VA device 408, the sensors 404, and the automation devices 406 may be referred to as a security system and/or a home-automation system. The security system and/or home-automation system may be installed at location, such as a property, home, business, or premises for the purpose of securing and/or automating all or a portion of the location.

The system 400 may further include one or more client devices 414, 416. The client devices 414, 416 may communicate with and/or be associated with (e.g., capable of access to and control of) the A/V devices 410, a smart-home hub device 402, the VA device 408, sensors 404, and/or automation devices 406. In various embodiments, the client devices 414, 416 communicate with other devices using one or more wireless and/or wired communication protocols, the user's network, and/or the network (Internet/PSTN) 412, as described herein. The client devices 414, 416 may comprise, for example, a mobile device such as a smartphone or a personal digital assistant (PDA), or a computing device such as a tablet computer, a laptop computer, a desktop computer, etc. In some embodiments, the client devices 414, 416 includes a connected device, such as a smart watch, Bluetooth headphones, another wearable device, or the like. In such embodiments, the client devices 414, 416 may include a combination of the smartphone or other device and a connected device (e.g., a wearable device), such that alerts, data, and/or information received by the smartphone or other device are provided to the connected device, and one or more controls of the smartphone or other device may be input using the connected device (e.g., by touch, voice, etc.).

The A/V devices 410, the hub device 402, the VA device 408, the automation devices 406, the sensors 404, and/or the client devices 414, 416 may also communicate, via the user's network 418 and/or the network (Internet/PSTN) 412, with network(s) of servers and/or backend devices 420, such as (but not limited to) one or more remote storage devices 422 (may be referred to interchangeably as "cloud storage device(s)"), one or more backend servers 424, and one or more backend application programming interfaces (APIs)

426. While FIG. 4 illustrates the storage device 422, the backend server 424, and the backend API 426 as components separate from the network 420, it is to be understood that the storage device 422, the backend server 424, and/or the backend API 426 may be considered to be components of the network 420. For example, the network 420 may include a data center with a plurality of computing resources used to implement the storage device 422, the backend server 424, and the backend API 426.

The backend server 424 may comprise a computer program or other computer executable code that, when executed by processor(s) of the backend server 424, causes the backend server 424 to wait for requests from other computer systems or software (clients) and provide responses. In an embodiment, the backend server 424 shares data and/or hardware and/or software resources among the client devices 414, 416. This architecture is called the client-server model. The client devices 414, 416 may run on the same computer or may connect to the backend server 424 over the network (Internet/PSTN) 412 and/or the network 420. Examples of computing servers include database servers, file servers, mail servers, print servers, web servers, game servers, and application servers. The term server may be construed broadly to include any computerized process that shares a resource to one or more client processes.

The backend API 426 may comprise, for example, a server (e.g. a real server, or a virtual machine, or a machine running in a cloud infrastructure as a service), or multiple servers networked together, exposing at least one API to clients. In various embodiments, the backend API 426 is provided by servers including various components such as an application server (e.g. software servers), a caching layer, a database layer, or other components suitable for implementing one or more APIs. The backend API 426 may, for example, comprise a plurality of applications, each of which communicate with one another using one or more public APIs. In some embodiments, the backend API 426 maintains user data and provides user management capabilities, thereby reducing the load (e.g., memory and processor consumption) of the client devices 414, 416.

In various embodiments, an API is a set of routines, protocols, and tools for building software and applications. Furthermore, the API may describe a software component in terms of its operations, inputs, outputs, and underlying types, defining functionalities that are independent of their respective implementations, which allows definitions and implementations to vary without compromising the interface. As such, the API may provide a programmer with access to a particular application's functionality without the need to modify the particular application.

The backend API 426 illustrated in FIG. 4 may further include one or more services (also referred to as network services). A network service is an application that provides data storage, manipulation, presentation, communication, and/or other capability. Network services are often implemented using a client-server architecture based on application-layer network protocols. Each service may be provided by a server component (e.g., the backend server 424) running on one or more computers (such as a dedicated server computer offering multiple services) and accessed via a network by client components running on other devices (e.g., client devices 414, 416). However, the client and server components can both be run on the same machine. Clients and servers may have a user interface, and sometimes other hardware associated with them.

The network 420 may be any wireless network, any wired network, or a combination thereof, configured to operatively couple the above-mentioned modules, devices, components, and/or systems as illustrated in FIG. 4. For example, the network 420, the user's network 418, and/or the network (Internet PSTN) 412 may include one or more of the following: a PSTN (public switched telephone network), the Internet, a local intranet, a PAN (Personal Area Network), a LAN (Local Area Network), a WAN (Wide Area Network), a MAN (Metropolitan Area Network), a virtual private network (VPN), a storage area network (SAN), a frame relay connection, an Advanced Intelligent Network (AIN) connection, a synchronous optical network (SONET) connection, a digital T1, T3, E1 or E3 line, a Digital Data Service (DDS) connection, a DSL (Digital Subscriber Line) connection, an Ethernet connection, an ISDN (Integrated Services Digital Network) line, a dial-up port such as a V.90, V.34, or V.34bis analog modem connection, a cable modem, an ATM (Asynchronous Transfer Mode) connection, or an FDDI (Fiber Distributed Data Interface) or CDDI (Copper Distributed Data Interface) connection. Furthermore, communications may also include links to any of a variety of wireless networks, including WAP (Wireless Application Protocol), GPRS (General Packet Radio Service), GSM (Global System for Mobile Communication), LTE, VoLTE, LoRaWAN, LPWAN, RPMA, LTE Cat-"X" (e.g. LTE Cat 1, LTE Cat 0, LTE CatMl, LTE Cat NB1), CDMA (Code Division Multiple Access), TDMA (Time Division Multiple Access), FDMA (Frequency Division Multiple Access), and/or OFDMA (Orthogonal Frequency Division Multiple Access) cellular phone networks, global navigation satellite system (GNSS), such as global positioning systems (GPS), CDPD (cellular digital packet data), RIM (Research in Motion, Limited) duplex paging network, Bluetooth radio, or an IEEE 802.11-based radio frequency network. The network can further include or interface with any one or more of the following: RS-252 serial connection, IEEE-4024 (Firewire) connection, Fibre Channel connection, IrDA (infrared) port, SCSI (Small Computer Systems Interface) connection, USB (Universal Serial Bus) connection, or other wired or wireless, digital or analog, interface or connection, mesh or Digi® networking.

The hub device 402, the VA device 408, and/or any of the components of the network(s) of servers/backend devices 420 (e.g., the backend server 424, the backend API 426, the storage devices 422, etc.) may be referred to herein as a "network device" or "network devices."

With further reference to FIG. 4, the system 400 may also include a security monitoring service 428. The security monitoring service 428 may be operated by the same company that manufactures, sells, and/or distributes the A/V devices 410, the hub device 402, the VA device 408, the sensors 404, and/or the automation devices 406. In other embodiments, the security monitoring service 428 may be operated by a third-party company (e.g., a different company than the one that manufactured, sold, and/or distributed the A/V devices 410, the hub device 402, the VA device 408, the sensors 404, and/or the automation devices 406). In any of the present embodiments, the security monitoring service 428 may have control of at least some of the features and components of the security system and/or the home-automation system (e.g., the security monitoring service 428 may be able to arm and/or disarm the security system, lock and/or unlock doors, activate and/or deactivate one or more of the sensors 404 and/or the automation devices 406, etc.). For example, the security monitoring service 428 may operate and control their own client devices and/or network of servers/backend devices for monitoring and/or controlling security systems. In such an example, the A/V devices 410, the hub device 402, the VA device 408, the sensors 404, and/or the automation devices 406 may communicate with the client devices and/or one or more components of the network of servers/backend devices of the security monitoring service 428 over the network (Internet/PSTN) 412 (in some embodiments, via one or more of the components of the network of backend servers/backend devices 420).

Figure 5:
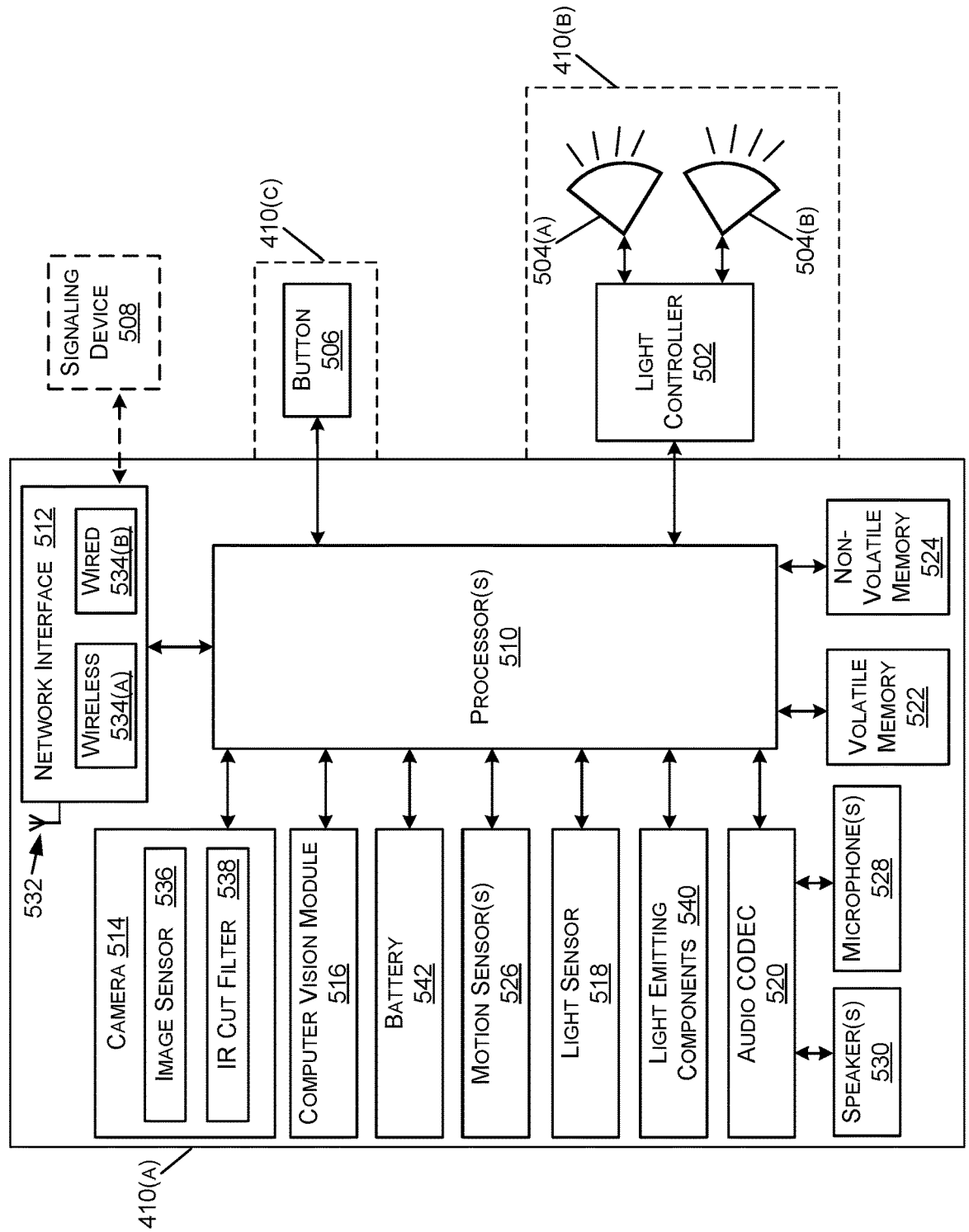
FIG. 5 is a functional block diagram illustrating an A/V recording and communication device according to various aspects of the present disclosure.

FIG. 5 is a functional block diagram for an audio/video (A/V) device (such as the A/V device 106 described in FIG. 13D and the A/V devices 410) according to various aspects of the present disclosure. In some embodiments, the one or more A/V devices 410 may include the security camera 410(a). In other embodiments, the one or more A/V devices 410 may include the light camera 410(b), which may include some or all of the components of the security camera 410(a) in addition to a light controller 502 and one or more lights 504(a), 504(b). In some embodiments, the one or more A/V devices 410 may include the video doorbell 410(c), which may include some or all of the components of the security camera 410(a) in addition to a button 506, and in some embodiments, a connection to a signaling device 508 (e.g., a pre-installed signaling device, such as a wired signaling device, and/or a wireless signaling device, connected over Wi-Fi, BLE, or another wireless communication protocol).

With further reference to FIG. 5, the A/V device 410 may include a processor(s) 510, a network interface 512, a camera 514, a computer vision module 516, a light sensor 518, an audio CODEC (coder-decoder) 520, volatile memory 522, and non-volatile memory 524. The processor(s) 510 (alternatively referred to herein as a "CPU," a "controller," and/or a "microcontroller) may comprise an integrated circuit including a processor core, memory, and programmable input/output peripherals. The processor(s) 510 may receive input signals, such as data and/or power, from the camera 514, motion sensor(s) 526, light sensor 518, microphone(s) 528, speaker(s) 550, and/or the network interface 512, and may perform various functions as described in the present disclosure. In various embodiments, when the processor(s) 510 is triggered by the motion sensor(s) 526, the camera 514, the speaker(s) 550, the microphone(s) 528, the network interface 512, and/or another component, the processor(s) 510 performs one or more processes and/or functions. For example, when the light sensor 518 detects a low level of ambient light, the light sensor 518 may trigger the processor(s) 510 to enable a night vision camera mode. The processor(s) 510 may also provide data communication between various components such as between the network interface 512 and the camera 514.

With further reference to FIG. 5, the network interface 512 may comprise an integrated circuit including a processor core, memory, and programmable input/output peripherals. The network interface 512 may be operatively connected to the processor(s) 510. In some embodiments, the network interface 512 is configured to handle communication links between the A/V device 410 and other, external devices, external receivers, external transmitters, and/or external transceivers, and to route incoming/outgoing data appropriately. For example, inbound data from an antenna 552 of the network interface 512 may be routed through the network interface 512 before being directed to the processor(s) 510, and outbound data from the processor(s) 510 may be routed through the network interface 512 before being directed to the antenna 552 of the network interface 512. As another example, the network interface 512 may be configured to transmit data to and/or receive data from a remote network device (e.g., one or more components of the network(s) of servers/backend devices 420 described in FIG. 4). The network interface 512 may include wireless 534(a) and wired 534(b) adapters. For example, the network interface 512 may include one or more wireless antennas, radios, receivers, transmitters, and/or transceivers (not shown in FIG. 5 for simplicity) configured to enable communication across one or more wireless networks, such as, without limitation, Wi-Fi, cellular, Bluetooth, Z-Wave, Zigbee, LPWAN(s), and/or satellite networks. The network interface 512 may receive inputs, such as power and/or data, from the camera 514, the processor(s) 510, the button 506 (in embodiments where the A/V device 410 is the video doorbell 410(c)), the motion sensors 526, a reset button (not shown in FIG. 5 for simplicity), and/or the non-volatile memory 524. The network interface 512 may also include the capability of communicating over wired connections, such as with a signaling device 508. For example, when the button 506 of the video doorbell 410(c) is pressed, the network interface 512 may be triggered to perform one or more functions, such as to transmit a signal over the wired 534(b) connection to the signaling device 508 (although, in some embodiments, the signal be transmitted over a wireless 534(a) connection to the signaling device) to cause the signaling device 508 to emit a sound (e.g., a doorbell tone, a user customized sound, a ringtone, a seasonal ringtone, etc.). The network interface 512 may also act as a conduit for data communicated between various components and the processor(s) 510.

With further reference to FIG. 5, the A/V device 410 may include the non-volatile memory 524 and the volatile memory 522. The non-volatile memory 524 may comprise flash memory configured to store and/or transmit data. For example, in certain embodiments the non-volatile memory 524 may comprise serial peripheral interface (SPI) flash memory. In some embodiments, the non-volatile memory 524 may comprise, for example, NAND or NOR flash memory. The volatile memory 522 may comprise, for example, DDR3 SDRAM (double data rate type three synchronous dynamic random-access memory). In the embodiment illustrated in FIG. 5, the volatile memory 522 and the non-volatile memory 524 are illustrated as being separate from the processor(s) 510. However, the illustration of FIG. 5 is not intended to be limiting, and in some embodiments the volatile memory 522 and/or the non-volatile memory 524 may be physically incorporated with the processor(s) 510, such as on the same chip. The volatile memory 522 and/or the non-volatile memory 524, regardless of their physical location, may be shared by one or more other components (in addition to the processor(s) 510) of the present A/V device 410.

With further reference to FIG. 5, the A/V device 410 may include the camera 514. The camera 514 may include an image sensor 536. The image sensor 536 may include a video recording sensor and/or a camera chip. In one aspect of the present disclosure, the imager sensor 536 may comprise a complementary metal-oxide semiconductor (CMOS) array and may be capable of recording high definition (e.g., 722p, 1800p, 4K, etc.) video files. The camera 514 may include a separate camera processor (not shown in FIG. 5 for simplicity), or the processor(s) 510 may perform the camera processing functionality. The processor(s) 510 (and/or camera processor) may include an encoding and compression chip. In some embodiments, the processor(s) 510 (and/or the camera processor) may comprise a bridge processor. The processor(s) 510 (and/or the camera processor) may process video recorded by the image sensor 536 and/or audio recorded by the microphone(s) 528, and may transform this data into a form suitable for transfer by the network interface 512 to the network (Internet/PSTN) 412. In various embodiments, the camera 514 also includes memory, such as volatile memory that may be used when data is being buffered or encoded by the processor(s) 510 (and/or the camera processor). For example, in certain embodiments the camera memory may comprise synchronous dynamic random-access memory (SD RAM).

The camera 514 may further include an IR cut filter 538 that may comprise a system that, when triggered, configures the image sensor 536 to see primarily infrared light as opposed to visible light. For example, when the light sensor 518 detects a low level of ambient light (which may comprise a level that impedes the performance of the image sensor 536 in the visible spectrum), the light emitting components 540 may shine infrared light through an enclosure of the A/V device 410 out to the environment, and the IR cut filter 538 may enable the image sensor 536 to see this infrared light as it is reflected or refracted off of objects within the field of view of the doorbell. This process may provide the A/V device with the "night vision" function mentioned above.

With further reference to FIG. 5, the recording and communication A/V device 410 may comprise the light sensor 518 and the one or more light-emitting components 540, such as LED's. The light sensor 518 may be one or more sensors capable of detecting the level of ambient light of the surrounding environment in which the A/V device 410 may be located. The light-emitting components 540 may be one or more light-emitting diodes capable of producing visible light when supplied with power (e.g., to enable night vision). In some embodiments, when activated, the light-emitting components 540 illuminates a light pipe.

The A/V device 410 may further include one or more speaker(s) 550 and/or one or more microphone(s) 528. The speaker(s) 550 may be any electromechanical device capable of producing sound in response to an electrical signal input. The microphone(s) 528 may be an acoustic-to-electric transducer or sensor capable of converting sound waves into an electrical signal. In some embodiments, the A/V device 410 may include two or more microphone(s) 528 that are spaced from one another (e.g., located on different sides of the A/V device 410) to provide noise cancelling and/or echo cancelling for clearer audio. The speaker(s) 550 and/or microphone(s) 528 may be coupled to an audio CODEC 520 to enable digital audio received by client devices to be decompressed and output by the speaker(s) 550 and/or to enable audio data captured by the microphone(s) 528 to be compressed into digital audio data. The digital audio data may be received from and transmitted to client devices using the network interface 512 (in some embodiments, through one or more intermediary devices such as the hub device 402, the VA device 408, and/or one or more components of the network of servers/backend devices 420 as described in FIG. 4). For example, when a visitor (or intruder) who is present in the area about the A/V device 410 speaks, sound from the visitor (or intruder) is received by the microphone(s) 528 and compressed by the audio CODEC 520. Digital audio data is then sent through the network interface 512 to the network 412 via the user's network 418, routed by the backend server 424 and/or the backend API 426 and delivered to the client device(s) 414, 416 as described above in connection with FIG. 4. When the user speaks, after being transferred through the network 412, the user's network 418, and the network interface 512, the digital audio data from the user is decompressed by the audio CODEC 520 and emitted to the visitor through the speaker(s) 550.

With further reference to FIG. 5, the A/V device 410 may be battery powered using a battery 542 and/or may be powered using a source of external AC (alternating-current) power, such as a household AC power supply (alternatively referred to herein as "AC mains" or "wall power"). The AC power may have a voltage in the range of 110-420 VAC, for example. The incoming AC power may be received by an AC/DC adapter (not shown), which may convert the incoming AC power to DC (direct-current) and may step down the voltage from 110-420 VAC to a lower output voltage of about 12 VDC and an output current of about 2 A, for example. In various embodiments, the output of the AC/DC adapter is in a range from about 9 V to about 15 V and in a range from about 0.5 A to about 5 A. These voltages and currents are examples provided for illustration and are not intended to be limiting.

However, in other embodiments, a battery 542 may not be included. In embodiments that include the battery 542, the A/V device 410 may include an integrated circuit (not shown) capable of arbitrating between multiple voltage rails, thereby selecting the source of power for the A/V device 410. The A/V device 410 may have separate power rails dedicated to the battery 542 and the AC power source. In one aspect of the present disclosure, the A/V device 410 may continuously draw power from the battery 542 to power the A/V device 410, while at the same time routing the AC power to the battery, thereby allowing the battery 542 to maintain a substantially constant level of charge. Alternatively, the A/V device 410 may continuously draw power from the AC power to power the doorbell, while only drawing from the battery 542 when the AC power is low or insufficient. Still, in some embodiments, the battery 542 comprises the sole source of power for the A/V device 410. In such embodiments, the components of the A/V device 410 (e.g., spring contacts, connectors, etc.) are not be connected to a source of AC power. When the battery 542 is depleted of its charge, it may be recharged, such as by connecting a power source to the battery 542 (e.g., using a USB connector).

Although not illustrated in FIG. 5, in some embodiments, the A/V device 410 may include one or more of an accelerometer, a barometer, a humidity sensor, and a temperature sensor. The accelerometer may be one or more sensors capable of sensing motion and/or acceleration. The one or more of the accelerometer, the barometer, the humidity sensor, and the temperature sensor may be located outside of a housing of the A/V device 410 so as to reduce interference from heat, pressure, moisture, and/or other stimuli generated by the internal components of the A/V device 410.

With further reference to FIG. 5, the A/V device 410 may include one or more motion sensor(s) 526. However, in some embodiments, the motion sensor(s) 526 may not be included, such as where motion detection is performed by the camera 514 or another device. The motion sensor(s) 526 may be any type of sensor capable of detecting and communicating the presence of an entity within their field of view. As such, the motion sensor(s) 526 may include one or more (alone or in combination) different types of motion sensors. For example, in some embodiments, the motion sensor(s) 526 may comprise passive infrared (PIR) sensors, which may be secured on or within a PIR sensor holder that may reside behind a lens (e.g., a Fresnel lens). In such an example, the PIR sensors may detect IR radiation in a field of view, and produce an output signal (typically a voltage) that changes as the amount of IR radiation in the field of view changes. The amount of voltage in the output signal may be compared, by the processor(s) 510, for example, to one or more threshold voltage values to determine if the amount of voltage in the output signal is indicative of motion, and/or if the amount of voltage in the output signal is indicative of motion of an entity that is to be captured by the camera 514 (e.g., motion of a person and/or animal may prompt activation of the camera 514, while motion of a vehicle may not). Although the above discussion of the motion sensor(s) 526 primarily relates to PIR sensors, depending on the embodiment, the motion sensor(s) 526 may include additional and/or alternate sensor types that produce output signals including alternative data types. For example, and without limitation, the output signal may include an amount of voltage change based on the presence of infrared radiation in a field of view of an active infrared (AIR) sensor, the output signal may include phase shift data from a microwave-type motion sensor, the output signal may include doppler shift data from an ultrasonic-type motion sensor, the output signal may include radio wave disturbance from a tomographic-type motion sensor, and/or the output signal may include other data types for other sensor types that may be used as the motion sensor(s) 526 of the A/V device 410.

In some embodiments, computer vision module(s) (CVM) 516 may be included in the A/V device 410 as the motion sensor(s) 526, in addition to, or alternatively from, other motion sensor(s) 526. For example, the CVM 516 may be a low-power CVM (e.g., Qualcomm Glance) that, by operating at low power (e.g., less than 2 mW of end-to-end power), is capable of providing computer vision capabilities and functionality for battery powered devices (e.g., the A/V device 410 when powered by the battery 542). The low-power CVM may include a lens, a CMOS image sensor, and a digital processor that may perform embedded processing within the low-power CVM itself, such that the low-power CVM may output post-processed computer vision metadata to the processor(s) 510 (e.g., via a serial peripheral bus interface (SPI)). As such, the low-power CVM may be considered to be one or more of the motion sensor(s) 526, and the data type output in the output signal may be the post-processed computer vision metadata. The metadata may include information such as the presence of a particular type of entity (e.g., person, animal, vehicle, parcel, etc.), a direction of movement of the entity, a distance of the entity from the A/V device 410, etc. In various embodiments, the motion sensor(s) 526 include a plurality of different sensor types capable of detecting motion such as PIR, AIR, low-power CVM, and/or cameras.

As indicated above, the A/V device 410 may include the CVM 516 (which may be the same as the above described low-power CVM 516 implemented as one or more motion sensor(s) 526, or may be additional to, or alternative from, the above described low-power CVM 516). For example, the A/V device 410, the hub device 402, the VA device 408, and/or one or more component of the network(s) of servers/backend devices 420 may perform any or all of the computer vision processes and functionalities described herein. In addition, although the CVM 516 is only illustrated as a component of the A/V device 410, the computer vision module 516 may additionally, or alternatively, be included as a component of the hub device 402, the VA device 408, and/or one or more components of the network of servers/backend devices 420. With respect to the A/V device 410, the CVM 516 may include any of the components (e.g., hardware) and/or functionality described herein with respect to computer vision, including, without limitation, one or more cameras, sensors, and/or processors. In some of the present embodiments, with reference to FIG. 5, the microphone(s) 528, the camera 514, the processor(s) 510, and/or the image sensor 536 may be components of the CVM 516. In some embodiments, the CVM 516 may include an internal camera, image sensor, and/or processor, and the CVM 516 may output data to the processor(s) 510 in an output signal, for example.

In embodiments where the A/V device 410 includes a light camera, the A/V device 410 may include the light controller 502 and one or more lights 504(a), 504(b) (collectively referred to herein as "lights 504"). The light controller 502 may include a switch for controlling the lights 504. For example, in response to the motions sensor(s) 526 and/or the camera 514 detecting motion, the light controller 236 may receive an output signal from the processor(s) 510 that causes the light controller 502 to activate the one or more lights 504(a), 504(b). In some embodiments, the light camera may include motion sensor(s) 526 detecting motion for controlling activation of the lights 504, and may further include the camera 514 for detecting motion for activating the recording of the image data using the camera 514 and/or the recording of the audio data using the microphone(s) 528. In other embodiments, the motion sensor(s) 526 may detect the motion for activating the lights 504, the camera 514, and the microphone(s) 528, or the camera 514 may detect the motion for activating the lights 504, the camera 514 to being recording the image data, and the microphone(s) 528 to being recording the audio data. The lights 504 may include floodlights, spotlights, porch lights, or another type of illumination device. The lights 504 may provide for better image data quality when ambient light levels are low (e.g., at dusk, dawn, or night), while also providing a deterrent effect by being illuminated when motion is detected.

With further reference to FIG. 5, in embodiments where the A/V device 410 includes a doorbell, such as the video doorbell 410(c), the A/V device 410 may include the button 506. In embodiments where the button 506 is a mechanical button (e.g., has a range of movement), the button 506 may make contact with a button actuator located within the video doorbell 410(c) when the button 506 is pressed. In embodiments where the button 506 is not mechanical (e.g., has no range of motion), the button 506 may include a capacitive touch button, a resistive touch button, a surface acoustic wave (SAW) button, an infrared (IR) button, an optical imaging button, an acoustic pulse recognition button, and/or a button that implements a low-power CVM for the detection of a person (e.g., a finger, hand, etc., of a person). When the button 506 is pressed, touched, and/or otherwise triggered, the processor(s) 510 may receive an output signal from the button 506 that may activate one or more functions of the video doorbell 410(c), such as transmitting an output signal, using the network interface 512, to the signaling device 508 to cause the signaling device 508 to output a sound (e.g., via the wired 534(b) connection to the signaling device 508 and/or a wireless 534(a) connection to the signaling device 508). In addition, the processor(s) 510 may transmit an output signal (e.g., a notification), using the network interface 512, to the client device(s) 414, 416 to indicate to the user(s) of the client device(s) 414, 416 that a person is present at the A/V device 410 (in some embodiments, via at least one of the hub device 402, the VA device 408, and/or one or more component of the network of servers/backend devices 420).

Although the A/V recording and communication device 410 (or A/V device 410) is referred to herein as an "audio/video" device, the A/V device 410 need not have both audio and video functionality. For example, in some embodiments, the A/V device 410 may not include the speakers 550, microphones 528, and/or audio CODEC. In such examples, the A/V device 410 may only have video recording and communication functionalities. In other examples, the A/V device 410 may only have the speaker(s) 550 and not the microphone(s) 528, or may only have the microphone(s) 528 and not the speaker(s) 550. In some examples, the A/V device 410 described in FIG. 5 may be the same as A/V device 104. In such examples, A/V device 104 may include some or all of the components illustrated as being included in the A/V device 410 in FIG. 5 to perform the techniques described herein.

Figure 6:
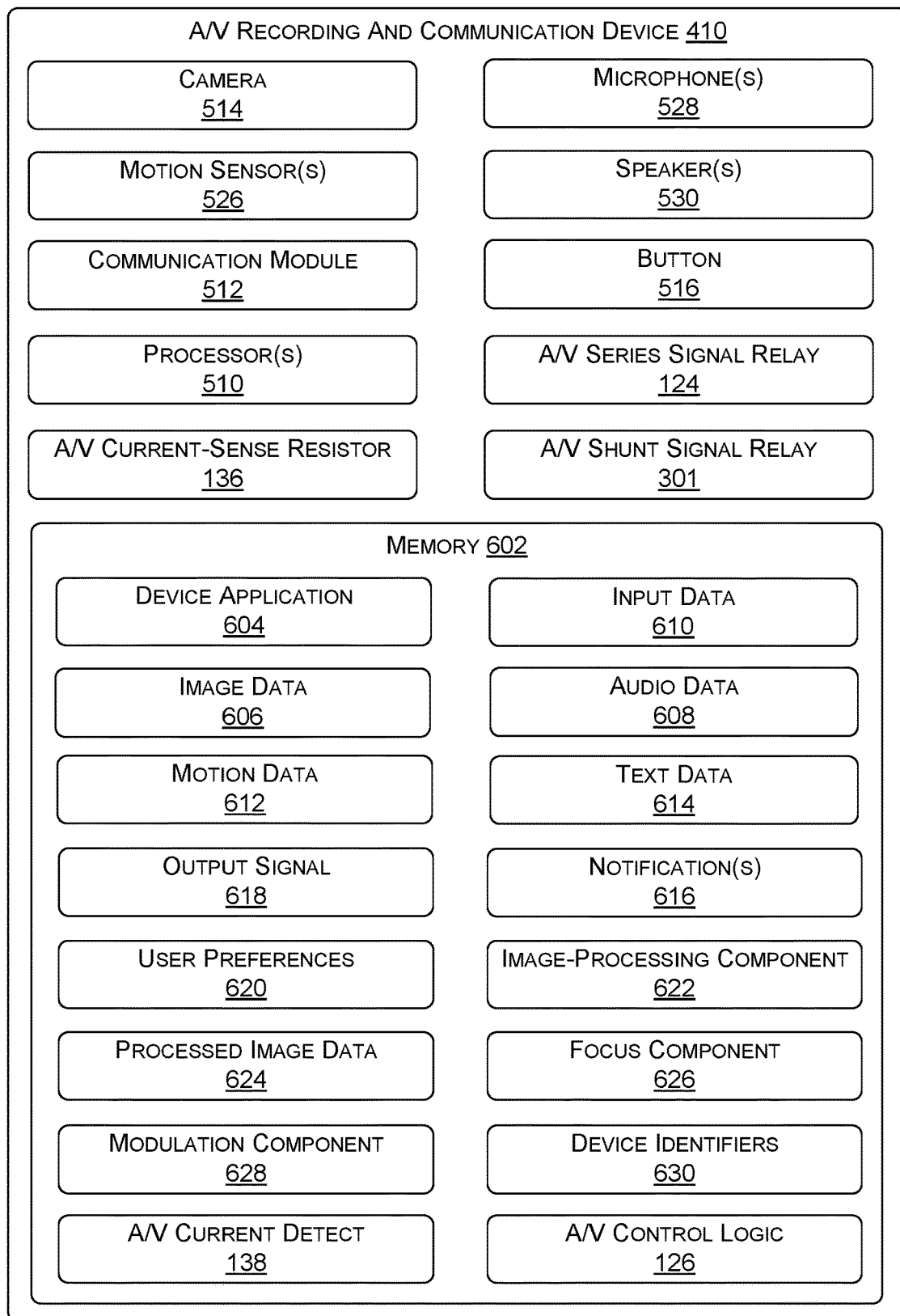
FIG. 6 is a functional block diagram illustrating one example embodiment of an A/V recording and communication device according to various aspects of the present disclosure.

FIG. 6 is another functional block diagram illustrating an embodiment of the A/V device 410 according to various aspects of the present disclosure. In some embodiments, the A/V device 410 may represent, and further include one or more of the components from, the A/V recording and communication doorbell 410(*c*), the A/V recording and communication security camera 410(*a*), and/or the floodlight controller 410(*b*). Additionally, in some embodiments, the A/V device 410 may omit one or more of the components shown in FIG. 6 and/or may include one or more additional components not shown in FIG. 6.

As shown in FIG. 6, the A/V device 410 includes memory 602, which may represent the volatile memory 522 and/or the non-volatile memory 524. The memory 602 stores a device application 604. In various embodiments, the device application 604 may store instructions that, when executed by the processor(s) 510, cause the processor(s) 510 to capture image data 606 (e.g., image data 110) using the camera 514, audio data 608 using the microphone(s) 528, input data 610 using the button 506 (and/or the camera 514 and/or the motion sensor(s) 526, depending on the embodiment), and/or motion data 612 using the camera 514 and/or the motion sensor(s) 526. In some embodiments, the device application 604 may also store instructions that, when executed by the processor(s) 510, cause the processor(s) 510 to generate text data 614 describing the image data 606, the audio data 608, and/or the input data 610, such as in the form of metadata, for example.

In addition, the device application 604 may store instructions that, when executed by the processor(s) 510, cause the processor(s) 510 to transmit the image data 606, the audio data 608, the motion data 612, the Input data 610, the text data 614, and/or notification(s) 616 to the client devices 414, 416, the hub device 402, and/or the backend server 424 using the network interface 512. In various embodiments, the device application 604 may also store instructions that, when executed by the processor(s) 510, cause the processor(s) 510 to generate and transmit an output signal 618 that may include the image data 606, the audio data 608, the text data 614, the input data 610, and/or the motion data 612. In some of the present embodiments, the output signal 618 may be transmitted to the backend server 424 and/or the hub device 402 using the network interface 512. The backend server 424 may then transmit (or forward) the output signal 618 to the client device(s) 414, 416, and/or the hub device 402 may then transmit (or forward) the output signal 618 to the client device(s) 414, 416, and/or the hub device 402 may then transmit (or forward) the output signal 618 to the backend server 424, and the backend server 424 may then transmit (or forward) the output signal 618 to the client device(s) 414, 416. In other embodiments, the output signal 618 may be transmitted directly to the client device(s) 414, 416 by the A/V device 410.

In further reference to FIG. 6, the image data 606 may comprise image sensor data such as (but not limited to) exposure values and data regarding pixel values for a particular sized grid. The image data 606 may include still images, live video, and/or pre-recorded images and/or video. The image data 606 may be recorded by the camera 514 in a field of view of the camera 514. The image data 606 may be representative of (e.g., depict) a physical environment in a field of view of the camera 606. In some embodiments, the physical environment 106 may include one or more objects (e.g., persons, vehicles, animals, items, etc.), and the image data 606 may be representative of the one or more objects, such as the one or more objects within the physical environment 106.

In further reference to FIG. 6, the motion data 612 may comprise motion sensor data generated in response to motion events. For example, the motion data 612 may include an amount or level of a data type generated by the motion sensor(s) 526 (e.g., the voltage level output by the motion sensor(s) 526 when the motion sensor(s) 526 are PIR type motion sensor(s)). In some of the present embodiments, such as those where the A/V device 410 does not include the motion sensor(s) 526, the motion data 612 may be generated by the camera 514. In such embodiments, based on a frame by frame comparison of changes in the pixels from the image data 606, it may be determined that motion is present.

The input data 610 may include data generated in response to an input to the button 506. The button 506 may receive an input (e.g., a press, a touch, a series of touches and/or presses, etc.) and may generate the input data 610 in response that is indicative of the type of input. In embodiments where the A/V device 410 is not a doorbell (e.g., the video doorbell 410(*c*)), the A/V device 410 may not include the button 506, and the A/V device 410 may not generate the input data 610.

With further reference to FIG. 6, a notification 616 may be generated by the processor(s) 510 and transmitted, using the network interface 512, to the client device 414, 416, the backend server 424, and/or the hub device 402. For example, in response to detecting motion using the camera 514 and/or the motion sensor(s) 526, the A/V device 410 may generate and transmit the notification 616. In some of the present embodiments, the notification 616 may include at least the image data 606, the audio data 608, the text data 614, and/or the motion data 612.

As described herein, the notification(s) 616 may include messages, signals, data, notifications, and/or any type of electronic communication that electronic devices (e.g., the A/V device 410, the client device 414, 416, the hub device 402, and/or one or more components of the network(s) of servers/backend devices 420) may transmit and receive with other electronic devices (e.g., the A/V device 410, the client device 414, 416, the hub device 402, and/or one or more components of the network(s) of servers/backend devices 420). For instance, notification(s) 616 may include push notifications, email messages, short message service (SMS) messages, multimedia messages (MMS), voicemail messages, video signals, audio signals, data transmissions, and/or any other type of electronic communication that an electronic device can send to another electronic device.

The image data 606, the audio data 608, the text data 614, and/or the motion data 612 may be tagged with (e.g., a time stamp, based on clock data) and/or stored separately (e.g., on the backend server 424, the hub device 402, and/or the A/V device 410) based on when the motion was detected, how long the motion was detected for, and/or a duration of time associated with the detected motion, or motion event (e.g., the duration of time may include the time the motion was detected plus an additional time, such as, without limitation, 5 seconds, 10 seconds, or 50 seconds). For example, each separate detection of motion, or motion event, may be associated with image data 606, audio data 608, text data 614, and/or motion data 612 representative of the detection of motion, or motion event. As a result, when a request for data pertaining to particular motion event, or a particular time period, is received (e.g., by the client device 414, 416, the backend server 424, and/or the hub device 402), the image data 606, the audio data 608, the text data 614, and/or the motion data 612 associated with a particular motion event, and/or associated with motion event(s) within the particular time period, may be transmitted, retrieved, and/or received.

Although examples discuss the A/V device 410 generating and transmitting the image data 606, the audio data 608, the text data 614, and/or the motion data 612 when motion is detected (e.g., in the notification 616), in other examples the data may be generated and/or transmitted at other times. For example, the image data 606, the audio data 608, the text data 614, and/or the motion data 612 may be generated and transmitted continuously (e.g., in a streaming manner), periodically, upon request, etc. In examples where the image data 606, the audio data 608, the text data 614, and/or the motion data 612 may be generated and transmitted continuously, the detection of motion (e.g., a motion event) may cause an indication of when the motion was detected (e.g., a time stamp) and/or how long the motion was detected for (e.g., a duration) to be associated with the image data 606, the audio data 608, the text data 614, and/or the motion data 612. As a result, even though the image data 606, the audio data 608, the text data 614, and/or the motion data 612 may be continuously generated by the A/V device 410, the image data 606, the audio data 608, the text data 614, and/or the motion data 612 associated with motion events may be tagged and/or stored separately (e.g., similar to that of the image data 606, the audio data 608, the text data 614, and/or the motion data 612 generated in response to the detection of motion), from the image data 606, the audio data 608, the text data 614, and/or the motion data 612 that is not associated with motion events.

As described herein, at least some of the processes of the backend server 424, the hub device 402, and/or the client device 414, 416 may be executed by the A/V device 410. In some examples, the memory 602 of the A/V device 410 may further include user preferences 620 associated with user(s) 118 of the A/V device 410. The user preferences 620 may be received from the client device 414, 416, the hub device 402, and/or the backend server 424. Generally, the user preferences 620 may include an indication of a specified region of the FOV 108 of the camera 514 that the user 118 wishes to have presented on their client device 414, 416. Using these user preferences 620, an image-processing component 622 may be executed by the processor(s) 510 to perform various operations for processing the image data 606. For example, the image-processing component 622 may process the image data 606 according to the user preferences 620 such that resulting processed image data 624 (e.g., processed image data 136) may depict the specified region of the physical environment 106, rather than the entire physical environment 106 included on the FOV 108 of the camera 514 of the A/V device 410. For example, the image-processing component 622 may process the image data 606 by cropping, or otherwise removing, the portions of the image data 606 that do not depict or represent the specified region.

In some examples, rather than using the image-processing component 622 to process image data 606, the A/V device 410 may execute a focus component 626 which controls the focus and/or direction of view of the camera 514 of the A/V device 410. For example, the focus component 626 may determine, based on the user preferences 620, how to zoom-in, zoom-out, and/or change a direction of view of the camera 514 such that the image data 606 generated by the camera 514 represents the specified region rather than the entire FOV 108 of the camera 514. In such examples, the image data 606 need not necessarily be processed because the image data 606, when generated by the camera 514 according to the user preferences 620 at the correct focus determined by the focus component 626, depicts the specified region when presented on the client device 116. Thus, the image data 606, when generated by the camera 514 when focused according to the user preferences 620 by the focus component 626, may simply be sent to the backend server 424 to be relayed to the client device 414, 416 to be presented on a display of the client device 414, 416.

As illustrated, the A/V device 410 may further include the A/V series signal relay 124, the A/V current-sense resistor 136, and the A/V shunt signal relay 301 described above. Generally, the A/V series signal relay 124 and/or the A/V shunt signal relay 301 may each be or include any type of electrical switches, mechanical switches, and/or electromechanical switches, such as signal relays, triac devices, transistor devices (e.g., a BJT, a MOSFET, etc.), and/or any other type of switching mechanism or device.

The A/V series signal relay 124 may be driven by a modulation component 628 to perform various modulation techniques for AC current waveforms described herein, such as the techniques of FIGS. 1 and 2A-2E. For instance, the modulation component 628 may use control signals to cause the A/V series signal relay 124 to open and close according to information and/or an instruction that the AC current waveform is to convey to the signaling-control device 120. For instance, the modulation component 628 may cause the A/V series signal relay 124 to open and close according to various predefined sequences, and using various timing parameters, to modulate the AC current waveforms as described herein. For example, in certain geographic areas, the AC power source 116 may provide power at a frequency of 60 Hz, or 60 cycles per second. Thus, single period of an AC current waveform is approximately 1/60, or 1.67 milliseconds (ms). Thus, to modulate a positive cycle of the AC current waveform, the modulation component 628 may cause the A/V series signal relay 124 to open for approximately 0.835 ms for a 180-degree phase modulation. To modulate a 90-degree phase of the AC current waveform (e.g., FIGS. 2E and 2F), the modulation component 628 may cause the A/V series signal relay 124 to open and/or close for approximately 0.417 ms.

The A/V device 410 may further include one or more device identifiers 630 which indicate device IDs for various signaling-control components 120. For example, the A/V current detect 138 may detect modulations of the AC current waveform performed by the signaling-control device 120, and write the modulations as bits to memory. The bits may, in some examples, represent device identifiers 630 for the signaling-control device 120. Further, the A/V device 410 may include the A/V control logic 126. In various examples, the A/V control logic 126 may drive the A/V series signal relay 124 and/or the A/V shunt signal relay 301 according to the techniques described herein.

Figure 7:
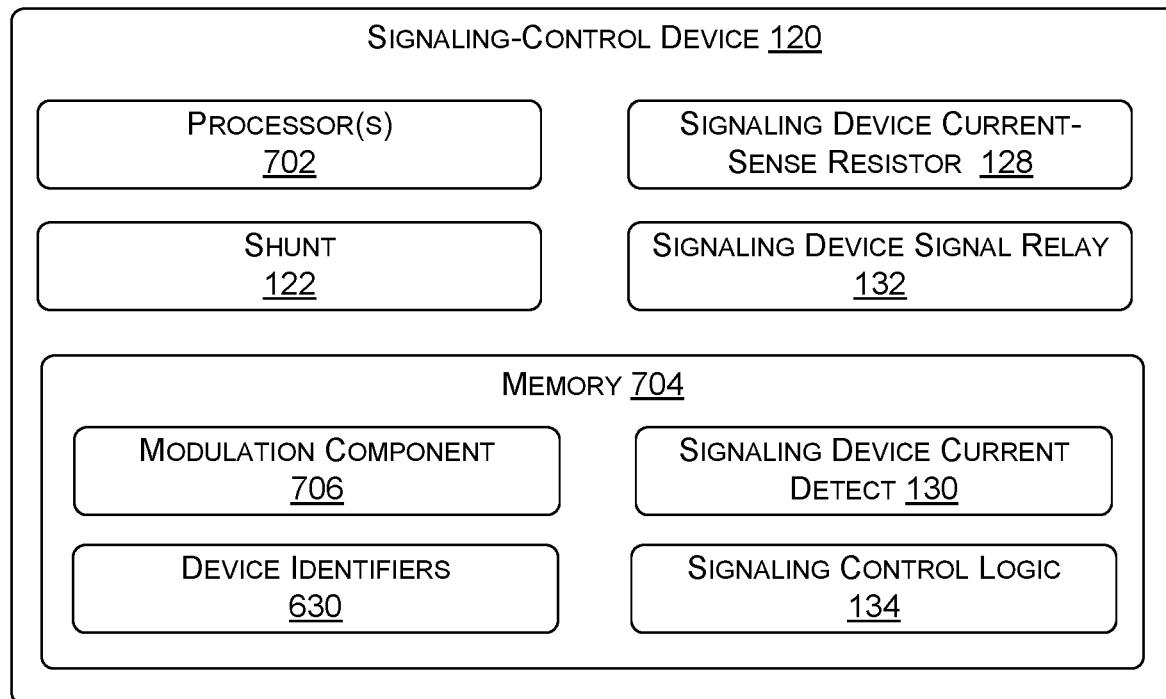
FIG. 7 is a functional block diagram illustrating one example embodiment of a signaling-control device according to various aspects of the present disclosure.

FIG. 7 illustrates a functional block diagram illustrating one example embodiment of a signaling-control device 120 according to various aspects of the present disclosure. The signaling-control device 120 may include one or more processors 702 to power and/or perform the various functions described herein of the signaling-control device 120.

The processor(s) 702 (alternatively referred to herein as a "CPU," a "controller," and/or a "microcontroller") may comprise an integrated circuit including a processor core, memory, and programmable input/output peripherals. The signaling-control device 120 may include the signaling device current-sense resistor 128, the shunt 122, and the signaling device signal relay 132. Generally, the signaling device current-sense resistor 128 may be used to detect current based on changes in voltage across the signaling device current-sense resistor 128. The shunt 122 may be opened and closed to selectively activate the signaling device 114. The signaling device signal relay 132 may be selectively opened and closed to modulate AC current waveforms that flow through the doorbell circuit 112.

The signaling-control device 120 may further include memory 704, which may represent volatile memory and/or non-volatile memory. The memory 704 may store a modulation component 706 configured to perform similar operations as the modulation component 628 to communicate data and/or instructions to the A/V device 106. For example, the modulation component 706 may drive the signaling device signal relay 132 to modulate an AC current waveform to represent a device identifier 630 of the signaling-control device 120. Further, the signaling-control device 120 may include the signaling-control logic 134 described above with reference to FIG. 1.

Each of the processes described herein, including the processes 800, 900, 1000, 1100, 1200, 1300, 1400, and 1500 are illustrated as a collection of blocks in a logical flow graph, which represent a sequence of operations that may be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks may be combined in any order and/or in parallel to implement the processes. Additionally, any number of the described blocks may be optional and eliminated to implement the processes. In some examples, some or all of the steps performed in processes 800, 900, 1000, 1100, 1200, 1300, 1400, and 1500 that are performed by the A/V device 410 and/or the signaling-control device 120 may be implemented as software, firmware, hardware, and/or any combination thereof. For instances, one or more control components comprising logic may perform the operations of the processes and may comprise one of, or any combination of, hardware, software, and/or firmware.

Figure 8:
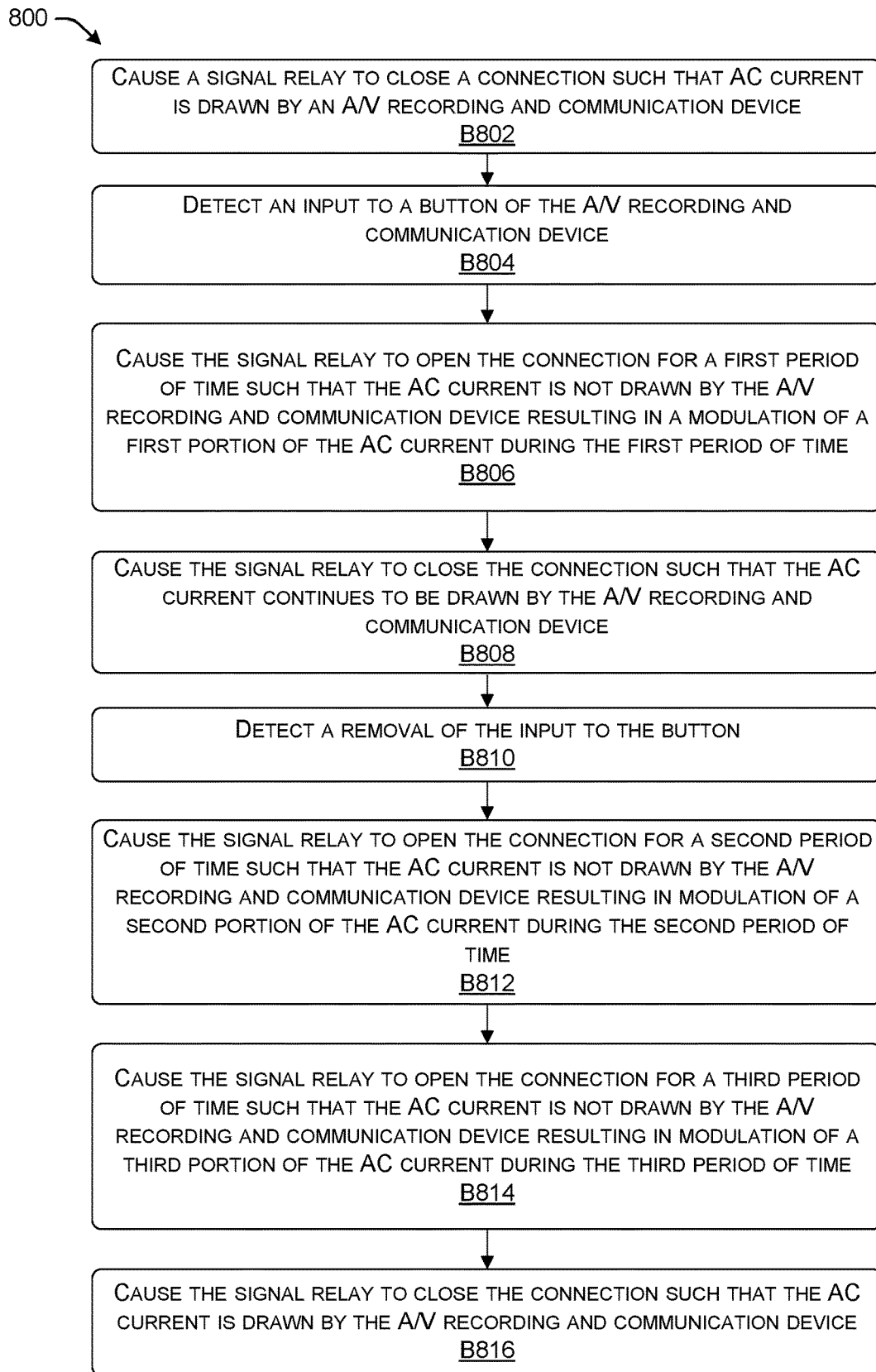

FIG. 8 is a flowchart illustrating an example process 800 for communicating between devices in a doorbell system by modulating phase portions of an AC current waveform. In some examples, the process 800 may be performed by a doorbell system (e.g., doorbell system 102) that includes a signaling device (e.g., signaling device 114, potentially in combination with signaling device 114) and an audio/video (A/V) recording and communication device (e.g., A/V device 106) configured to be connected in series in the doorbell circuit 112 with the signaling device 114. In various examples, the A/V device 106 may include a button (e.g., button 506) to receive input to cause the signaling device 114 to output a sound, one or more processors 510, a signal relay (e.g., A/V series signal relay 124) configured to perform current switching for controlling alternating current (AC) current that is drawn by the A/V recording and communication device 106. In some examples, the signal relay may be selectively configurable to close a connection such that the AC current is drawn by the A/V recording and communication device 106 and to open the connection such that the AC current is not drawn by the A/V recording and communication device 106.

The process 800, at block B802 includes causing the signal relay to close the connection such that AC current is drawn by the A/V recording and communication device. For example, the A/V device 106 may cause the A/V series signal relay 124 to close the connection in the doorbell circuit 112 such that AC current is drawn by the A/V device 106 from the AC power source 116.

The process 800, at block B804, includes detecting an input to a button of the A/V recording and communication device. For example, the A/V device 106 may detect an input (e.g., press, touch, near-touch, etc.) to the button 506 from a user 110.

The process 800, at block B806, includes causing the signal relay to open the connection for a first period of time such that the AC current is not drawn by the A/V recording and communication device resulting in modulation of a first portion of the AC current during the first period of time. For example, the A/V device 106 may, based at least in part on the input to the button, cause the A/V series signal relay 124 to open the connection for a first period of time such that the AC current is not drawn by the A/V device 106 resulting in modulation of a first portion of the AC current during the first period of time (e.g., a positive and/or negative portion of the AC current to indicate a "0").

The process 800, at block B808, includes causing the signal relay to close the connection such that the AC current continues to be drawn by the A/V recording and communication device. For example, the A/V device 106 may, subsequent to the first period of time (e.g., phase portion indicating a "0") cause the A/V series signal relay 124 to close the connection such that the AC current continues to be drawn by the A/V device 106. In some examples, the modulation of the AC current within the first period of time causes the signaling device 114 to output the sound (e.g., cause the signaling device 114 to emit sound).

The process 800, at block B810, includes detecting a removal of the input to the button. For example, the A/V device 106 may detect that the user 110 has removed input to the button 506.

The process 800, at block B812, includes causing the signal relay to open the connection for a second period of time such that the AC current is not drawn by the A/V recording and communication device resulting in modulation of a second portion of the AC current during the second period of time. For example, the A/V device 106 may, based at least in part on the removal of the input to the button 506, cause the A/V series signal relay 124 to open the connection for a second period of time such that the AC current is not drawn by the A/V device 106 resulting in modulation of a second portion of the AC current during the second period of time.

The process 800, at block B814, may include causing the signal relay to open the connection for a third period of time such that the AC current is not drawn by the A/V recording and communication device resulting in modulation of a third portion of the AC current during the third period of time. For example, the A/V device 106 may cause the A/V series signal relay 124 to open the connection for a third period of time such that the AC current is not drawn by the A/V device 106 resulting in modulation of a third portion of the AC current during the third period of time. In some examples, the modulation of the second portion of the AC current followed by the modulation of the third portion of the AC current indicates to the signaling device 114 to stop outputting the sound.

The process 800, at block B816, includes causing the signal relay to close the connection such that the AC current is drawn by the A/V recording and communication device. For example, subsequent to the third period of time, the A/V device 106 may cause the A/V series signal relay 124 to close the connection such that the AC current is drawn by the A/V device 106.

In some examples, the process 800 may result in the A/V device modulating the AC current to generate or result in an AC current waveform 204 similar to that shown in FIG. 2B.

FIG. 9 is a flowchart illustrating an example process 900 for an A/V recording and communication device (e.g., A/V device 106) to communicate with a doorbell circuit device (e.g., signaling-control device 120) that it is connected in series with in a doorbell circuit 112. In some examples, the A/V recording and communication device includes one or more processors (e.g., processors 510), and a switch (e.g., A/V series signal relay 124) configured to perform current switching for controlling alternating current (AC) current that is drawn by the A/V recording and communication device. The switch may be selectively operable to close such that the AC current is drawn by the A/V recording and communication device and to open such that the AC current is not drawn by the A/V recording and communication device.

The process 900, at block B902, includes receiving an instruction for communicating to the doorbell circuit device. For example, the A/V device 106 may receive an instruction signal comprising data representative of an instruction for communication to the signaling-control device 120. In some examples, the A/V device 106 may include a button 506. In such examples, receiving the instruction signal may include detecting an input to, or press of, the button 506.

The process 900, at block B904, includes determining, based at least in part on the instruction, a control signal to control the switch to cause the switch to close and open. For example, the A/V device 106 may determine, based at least in part on the instruction signal, a control signal to control the A/V series signal relay 124 to perform the current switching. In some examples, the control signal may be determined based at least in part on detecting input to the button 506. For example, the A/V device 106 may determine a control signal to drive the A/V series signal relay 124 such that the modulation of the AC current results in the AC current waveform 204, or another waveform configured to cause the signaling-control device 120 to activate the signaling device 114.

The process 900, at block B906, includes sending the control signal resulting in modulation of a portion of the AC current, the modulation of the portion of the AC current representative of the instruction to the doorbell circuit device. For example, the A/V device 106 may cause the A/V series signal relay 124 to perform the current switching for controlling the AC current according to the control signal resulting in modulation of a portion of the AC current to be representative of the instruction signal for communication to the signaling-control device 120. In some examples, causing the A/V series signal relay 124 to perform the current switching for controlling the AC current according to the control signal resulting in the modulation of the portion of the AC current to be representative of the instruction signal for communication to the doorbell circuit device comprises causing the A/V series signal relay 124 to switch between opened and closed multiple times according to a sequence resulting in a corresponding sequence of modulations of multiple portions of the AC current. For instance, the A/V series signal relay 124 may be switched between opened and closed according to a sequence to result in a corresponding sequence of modulations of the multiple portions of the AC current that indicates, to the signaling-control device 120, the instruction signal that the signaling-control device 120 provide a device identifier 630 to the A/V device 106. As an example, the A/V series signal relay 124 may be opened and closed according to a sequence to modulate the AC current waveform to result in an AC current waveform 206 illustrated in FIG. 2C, or similar types of waveforms to communicate data.

In some examples, causing the A/V series signal relay 124 to perform the current switching for controlling the AC current according to the control signal resulting in modulation of the portion of the AC current comprises causing the A/V series signal relay 124 to close the connection for a first period of time such that an initial portion (e.g., 90 degrees) of the AC current is drawn by the A/V device 106. In some examples, the initial portion of the AC current is included in a positive signal amplitude of a signal period of the AC current (e.g., 90 degrees of the positive phase portion). Further, causing the A/V series signal relay 124 to perform the current switching for controlling the AC current according to the control signal resulting in modulation of the portion of the AC current may further comprise, subsequent to the first period of time, causing the A/V series signal relay 124 to open the connection for a second period of time such that the AC current is not drawn by the A/V device 106 resulting in the modulation of the portion of the AC current. In some examples, the portion of the AC current is included in the positive signal amplitude of the signal period of the AC current (e.g., the second 90 degrees of the positive signal amplitude. Stated otherwise, in some examples, the A/V series signal relay 124 may be driven by the A/V device 106 to create the AC current waveform 218, or similar waveform, where a positive phase and/or a negative phase represents at least two bits.

Figure 10:
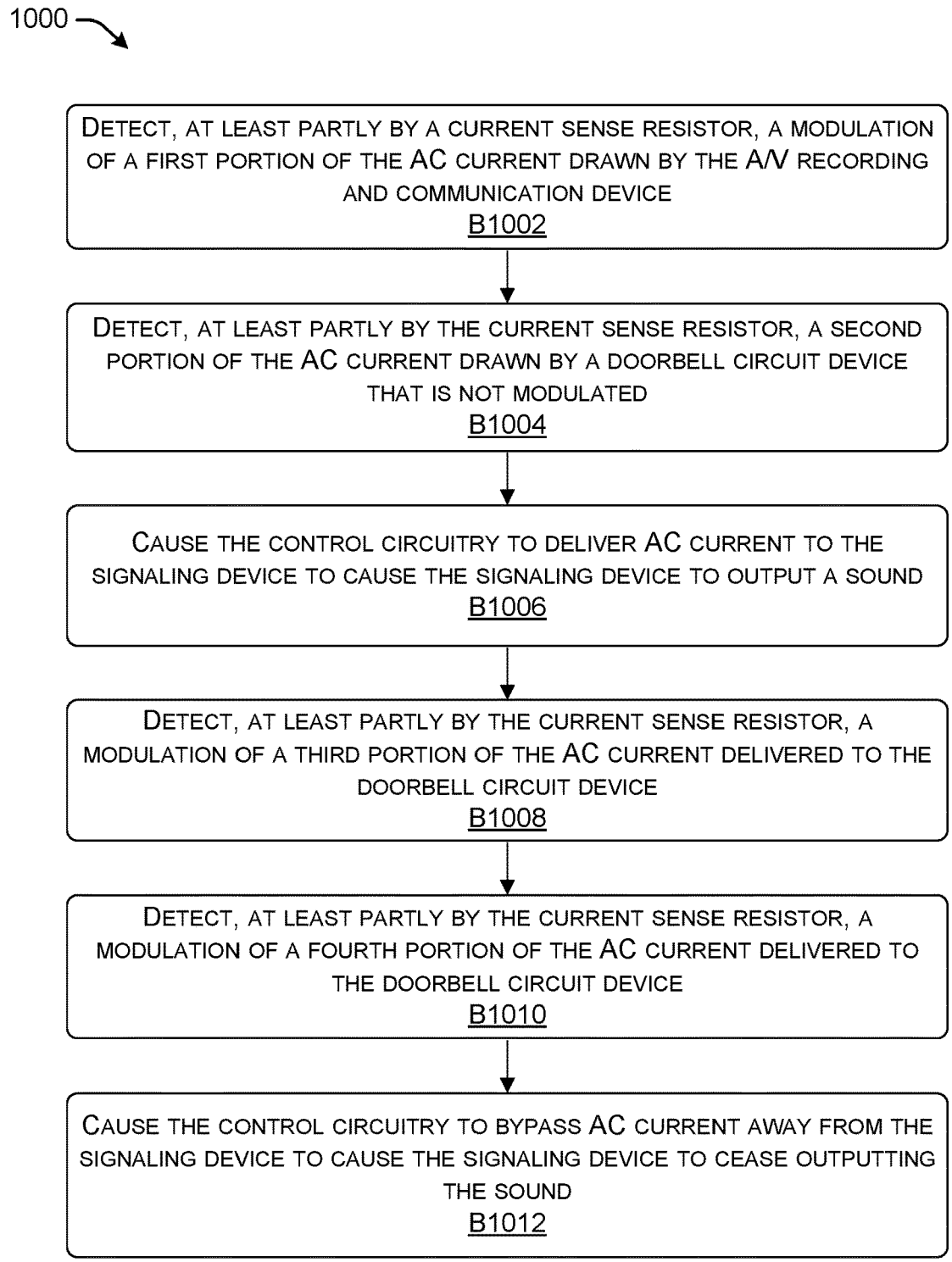

FIG. 10 is a flowchart illustrating an example process 1000 for a doorbell circuit device to receive a communication of data in an AC current waveform from an A/V recording and communication device according to various aspects of the present disclosure. The doorbell circuit device (e.g., signaling-control device 120) may be configured for coupling to a signaling device (e.g., signaling device 114) in a doorbell circuit (e.g., doorbell circuit 112). The doorbell circuit device may be configured to be series with an audio/video (A/V) recording and communication device (e.g., A/V device 106) and comprise one or more processors (e.g., processors 702), a current sense resistor (e.g., signaling device current-sense resistor 128) configured to detect changes in alternating current (AC) current delivered from an AC power source and through the doorbell circuit device, and control circuitry (e.g., shunt 122) configured to deliver AC current to the signaling device in order to cause the signaling device to emit a sound, and to bypass AC current away from the signaling device in order to prevent the signaling device from emitting the sound.

The process 1000, at block B1002, includes detecting, at least partly by the current sense resistor, a modulation of a first portion of the AC current drawn by the A/V recording and communication device. For example, the signaling-control device 120 may detect, at least partly by the signaling device current-sense resistor 128, a modulation of a first portion of the AC current drawn by the A/V device 106.

The process 1000, at block B1004, includes detecting, at least partly by the current sense resistor, a second portion of the AC current drawn by the doorbell circuit device that is not modulated. For example, subsequent to detecting the modulation of the first portion, the signaling-control device 120 may detect, at least partly by the signaling device current-sense resistor 128, a second portion of the AC current drawn by the doorbell circuit device that is not modulated.

The process 1000, at block B1006, includes causing the control circuitry to deliver AC current to the signaling device to cause the signaling device to output a sound. For example, the signaling-control device 120 may cause the shunt 122 to deliver AC current to the signaling device 114 to cause the signaling device 114 (e.g., via the signaling device 114) to output a sound. In some examples, the control circuitry, or the shunt 122, includes a shunt switch and is connected in parallel with the signaling device 114, and causing the shunt 122 to deliver the AC current to the signaling device 114 to cause the signaling device 114 to output the sound includes placing the shunt switch of the shunt 122 in a high impedance state such that a shunt impedance associated with the shunt switch of the shunt 122 is greater than a load impedance associated with the signaling device 114.

The process 1000, at block B1008, includes detecting, at least partly by the current sense resistor, a modulation of a third portion of the AC current delivered to the doorbell circuit device. For example, the signaling-control device 120 may detect, at least partly by the signaling device current-sense resistor 128, a modulation of a third portion of the AC current delivered to the signaling-control device 120.

The process 1000, at block B1010, includes detecting, at least partly by the current sense resistor, a modulation of a fourth portion of the AC current delivered to the doorbell circuit device. For example, the signaling-control device 120 may detect, at least partly by the signaling device current-sense resistor 128 a modulation of a fourth portion of the AC current delivered to the signaling-control device 120.

The process 1000, at block B1012, includes causing the control circuitry to bypass AC current away from the signaling device to cause the signaling device to cease outputting the sound. For example, the signaling-control device 120 may, based at least in part on the modulation of the third portion of the AC current followed by the modulation of the fourth portion of the AC current, cause the shunt 122 to bypass AC current away from the signaling device 114 to cause the signaling device 114 to cease outputting the sound via the signaling device 114.

In some examples, the modulations of the AC current waveform described in the process 1000 may be similar to the AC current waveform 204 of FIG. 2B.

FIG. 11 is a flowchart illustrating an example process 1100 for a doorbell circuit device to receive a communication of data in an AC current waveform from an A/V recording and communication device according to various aspects of the present disclosure. The doorbell circuit device (e.g., signaling-control device 120) may be configured for coupling to a signaling device (e.g., signaling device 114) in a circuit (e.g., doorbell circuit 112). The doorbell circuit device may be configured to be series with an audio/video (A/V) recording and communication device (e.g., A/V device 106) and comprise one or more processors (e.g., processors 702), and control circuitry (e.g., shunt 122) for controlling alternating current (AC) current that is drawn by the signaling device, the control circuitry comprising an open state in which AC current is delivered to the signaling device and a closed state in which the AC current is not drawn by the signaling device.

The process 1100, at block B1102, includes causing the control circuitry to enter the closed state such that AC current is not drawn by the signaling device. For example, the signaling-control device 120 may cause the shunt 122 to enter the closed state such that AC current is not drawn by the signaling device 114.

The process 1100, at block B1104, includes identifying a modulation of a portion of the AC current. In some examples, the signaling-control device 120 may include a signaling device current-sense resistor 128 configured to detect changes in the AC current delivered from an AC power source 116 and through the signaling-control device 120. In such examples, identifying the modulation of the portion of the AC current comprises detecting, at least partly by the signaling device current-sense resistor 128, the portion of the AC current drawn through the shunt 122.

The process 1100, at block B1106, includes causing the control circuitry to enter the open state such that the AC current is drawn by the signaling device to cause the signaling device to output sound. For example, the signaling-control device 120 may cause the shunt 122 to enter the open state such that the AC current is drawn by the signaling device 114 to cause the signaling device 114 to output sound (e.g., via the signaling device 114). In some examples, the portion of the AC current comprises a first portion, and the process 1100 may further comprise detecting, at least partly by the signaling device current-sense resistor 128, a modulation of a second portion of the AC current followed by a modulation of a third portion of the AC current, and based at least in part on the modulation of the second portion of the AC current followed by the modulation of the third portion of the AC current, causing the shunt 122 to enter the closed state such that the AC current bypasses away from the signaling device 114 to cause the signaling device 114 to cease outputting the sound.

In some examples, the signaling-control device 120 may further perform operations including identifying one or more first modulations of the AC current representative of an instruction for communication to the A/V recording and communication device (e.g., detecting an AC current waveform similar to AC current waveform 206 and/or AC current waveform 218), determining, based at least in part on the one or more first modulations of the AC current, a control signal to control the signal relay to perform the current switching (e.g., determine a control signal to drive the signaling device signal relay 132), and causing the signaling device signal relay 132 to perform the current switching for controlling the AC current according to the control signal resulting in one or more second modulations of the AC current to be representative of the instruction for communication to the A/V device 106 (e.g., cause the signaling device signal relay 132 to create an AC current waveform similar to AC current waveform 210).

Figure 12:
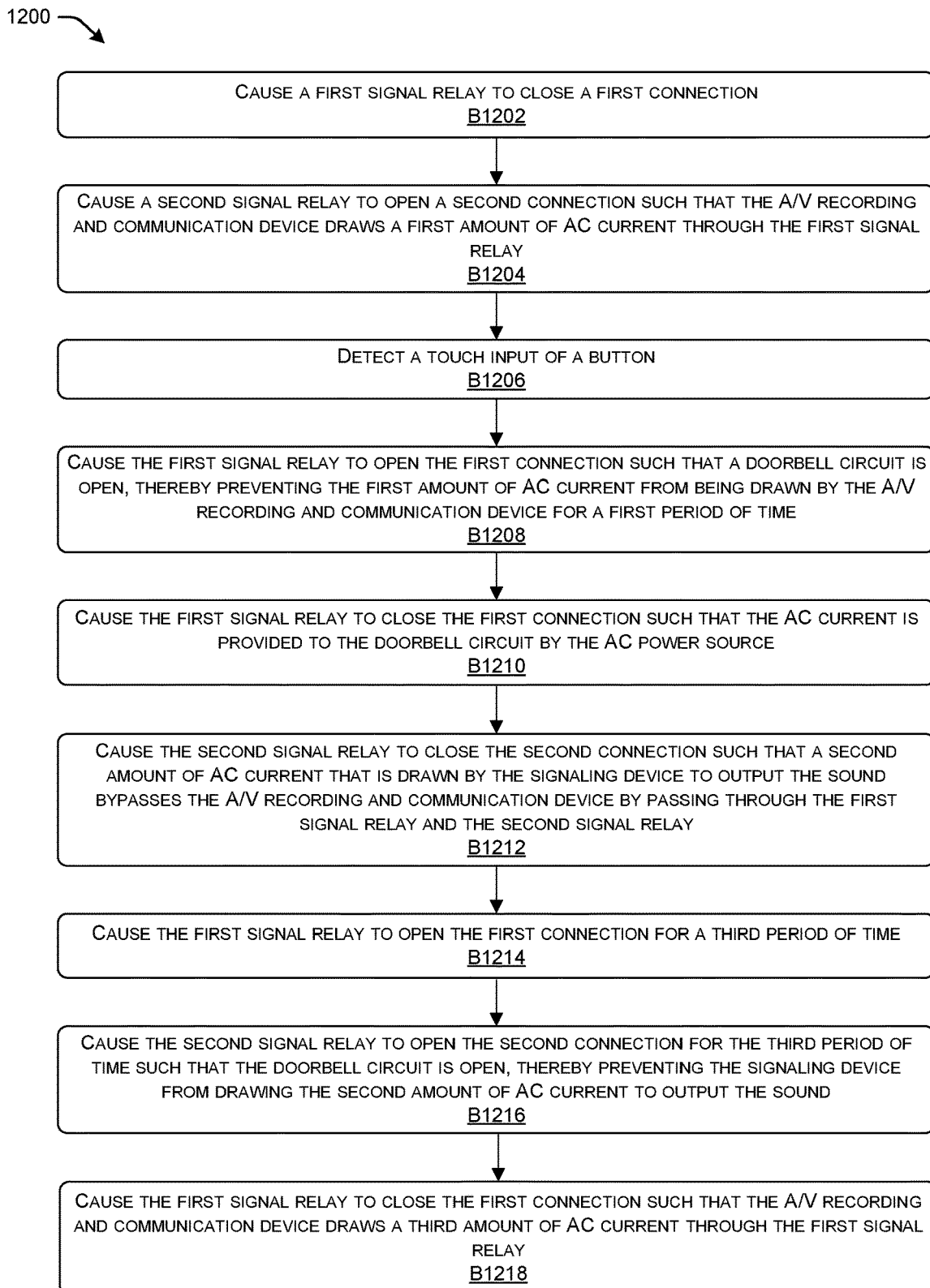
FIGS. 12-15 are flowcharts illustrating example processes for devices in a doorbell system signaling to each other using open-circuit states and/or closed-circuit states to control the entire flow of AC current in the circuit according to various aspects of the present disclosure.

FIG. 12 is a flowchart illustrating an example process 1200 for an A/V recording and communication device in a doorbell system to control the flow of AC current to a signaling device in order to cause the AC current to bypass a signaling device, or to cause the AC current to flow through a signaling device and cause a signaling device to emit sound.

The process 1200, at block B1202, includes causing a first signal relay to close a first connection. For example, the A/V deice 106 may cause the A/V series signal relay 124 to close the first connection. In some examples, the first signal relay (e.g., the A/V series signal relay 124) may be configured to be disposed in series with the signaling device 114 to perform current switching for controlling AC current that is provided by the AC power source 116. For instance, the first signal relay (e.g., the A/V series signal relay 124) may be selectively configurable to close a first connection such that the AC current is provided by the AC power source 116 and to open the first connection such that the AC current is not provided by the AC power source 116.

The process 1200, at block B1204, includes causing the second signal relay to open the second connection such that the A/V recording and communication device draws a first amount of AC current through the first signal relay. For example, the A/V device may cause the A/V shunt signal relay 301 to open the second connection such that the A/V device 106 draws a first amount of AC current through the A/V series signal relay 124. In some examples, the A/V shunt signal relay 301 may be disposed in parallel with the A/V device 106 to perform current switching for controlling the AC current that is drawn by the A/V device 106. For instance, the A/V shunt signal relay 301 may be selectively configurable to open a second connection such that the AC current is drawn by the A/V device 106 through the A/V series signal relay 124 and to close the second connection such that that AC current passes through the A/V series signal relay 124 and the A/V shunt signal relay 301 to bypass the A/V device 106.

The process 1200, at block B1206, includes detecting a touch input of a button. For example, the A/V device 106 may include a button 506 and detect a touch input from a user 110.

The process 1200, at block B1208, includes causing the first signal relay to open the first connection such that the doorbell circuit is open, thereby preventing the first amount of AC current from being drawn by the A/V recording and communication device for a first period of time. For example, the A/V device 106 may, based at least in part on the detecting the touch input of the button 506, cause the A/V series signal relay 124 to open the first connection such that the doorbell circuit 112 is open, thereby preventing the first amount of AC current from being drawn by the A/V device 106 for a first period of time. In some examples, preventing the first amount of AC current from being drawn by the A/V device 106 indicates to the signaling device 114 (e.g., the signaling-control device 120) to output the sound.

The process 1200, at block B1210, includes causing the first signal relay to close the first connection such that the AC current is provided to the doorbell circuit by the AC power source. For example, the A/V device 106 may, subsequent to the first period of time, cause the A/V series signal relay 124 to close the first connection such that the AC current is provided to the doorbell circuit 112 by the AC power source 116 (e.g., create a closed circuit 112).

The process 1200, at block B1212, includes causing the second signal relay to close the second connection such that a second amount of AC current that is drawn by the signaling device to output the sound bypasses the A/V recording and communication device by passing through the first signal relay and the second signal relay. For example, the A/V device 106 may cause the A/V shunt signal relay 301 to close the second connection such that a second amount of AC current that is drawn by the signaling device 114 to output the sound bypasses the A/V device 106 by passing through the A/V series signal relay 124 and the A/V shunt signal relay 301. In some examples, the A/V series signal relay 124 and the A/V shunt signal relay 301 may be closed for a second period of time.

The process 1200, at block B1214, includes causing the first signal relay to open the first connection for a third period of time. For example, the A/V device may cause the A/V series signal relay 124 to open the first connection for a third period of time, thereby creating an open circuit in the doorbell circuit 112.

The process 1200, at block B1216, includes causing the second signal relay to open the second connection for the third period of time such that the doorbell circuit is open, thereby preventing the signaling device from drawing the second amount of AC current to output the sound. For example, the A/V device 106 may cause the A/V shunt signal relay 301 to open the second connection for the third period of time such that the doorbell circuit 112 is open, thereby preventing the signaling device 114 from drawing the second amount of AC current to output the sound.

The process 1200, at block B1218, includes causing the first signal relay to close the first connection such that the A/V recording and communication device draws a third amount of AC current through the first signal relay. For example, the A/V device 106 may cause the A/V series signal relay 124 to close the first connection such that the A/V device 106 draws a third amount of AC current through the A/V series signal relay 124.

In some examples, the doorbell system 102 further includes a doorbell circuit device (e.g., signaling-control device 120) configured for coupling to the signaling device 114 and configured to be connected in series with the A/V recording and communication device 106. The signaling-control device 120 may include one or more second processors 702 and an electronic switch (e.g., shunt 122) configured to perform current switching for controlling AC current that is drawn by the signaling device 114. The shunt 122 may be selectively configurable to open a third connection such that the AC current is drawn by the signaling device 114 and to close the third connection such that the AC current bypasses the signaling device and is drawn by the A/V device 106. In such examples, the signaling-control device 120 may detect that the first amount of AC current was prevented from being drawn by the A/V recording and communication device 106, and based at least in part on the first amount of AC current being prevented from being drawn, cause the shunt 122 to open the third connection such that the AC current is drawn by the signaling device 114 to output the sound at least partly during the second period of time.

Figure 13:
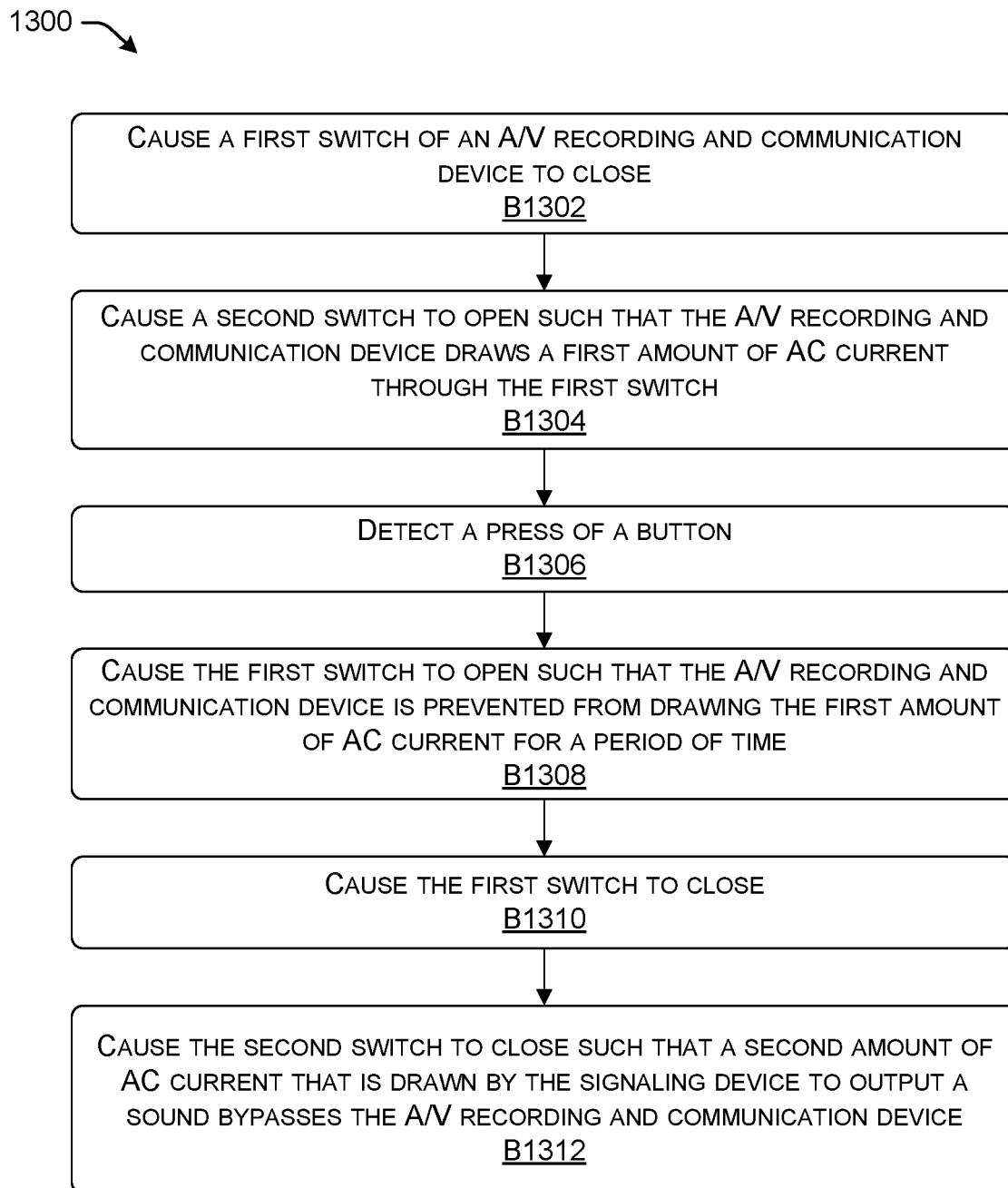

FIG. 13 is a flowchart illustrating an example process 1300 for an A/V recording and communication device to control the flow of AC current to a signaling device in order to cause the AC current to bypass a signaling device, or to cause the AC current to flow through a signaling device and cause a signaling device to emit sound.

The process 1300, at block B1302, includes causing a first switch to close. For example, the A/V device 106 may cause the A/V series signal relay 124 to close. In some examples, the A/V series signal relay 124 may be configured to perform current switching for controlling alternating current (AC) current that is drawn by the A/V device 106. For instance, the A/V series signal relay 124 may be selectively configurable to close such that the AC current is drawn by the A/V device 106 and to open such that the AC current is not drawn by the A/V device 106.

The process 1300, at block B1304, includes causing the second switch to open such that the A/V recording and communication device draws a first amount of AC current through the first signal relay. For example, the A/V device may cause the A/V shunt signal relay 301 to open such that the A/V device 106 draws a first amount of AC current through the A/V series signal relay 124.

The process 1300, at block B1306, includes detecting a press of a button. For example, the A/V device 106 may detect an input to the button 506.

The process 1300, at block B1308, includes causing the first switch to open such that the A/V recording and communication device is prevented from drawing the first amount of AC current for a period of time. For example, the A/V device 106 may cause the A/V series signal relay 124 to open to create an open doorbell circuit 112 such that the A/V device 106 is prevented from drawing the first amount of AC current for a period of time.

The process 1300, at block B1310, includes causing the first switch to close. For example, the A/V device 106 may cause the A/V series signal relay 124 to close, thereby creating a closed doorbell circuit 112.

The process 1300, at block B1312, includes causing the second switch to close such that a second amount of AC current that is drawn by the signaling device to output a sound bypasses the A/V recording and communication device. For example, the A/V device 106 may cause the A/V shunt signal relay 301 to close such that a second amount of AC current that is drawn by the signaling device 114 to output a sound bypasses the A/V device 106. In this way, the signaling device 114 may draw the entire amount of power that it is rated for with little or no impedance interference from the A/V device 106

Figure 14:
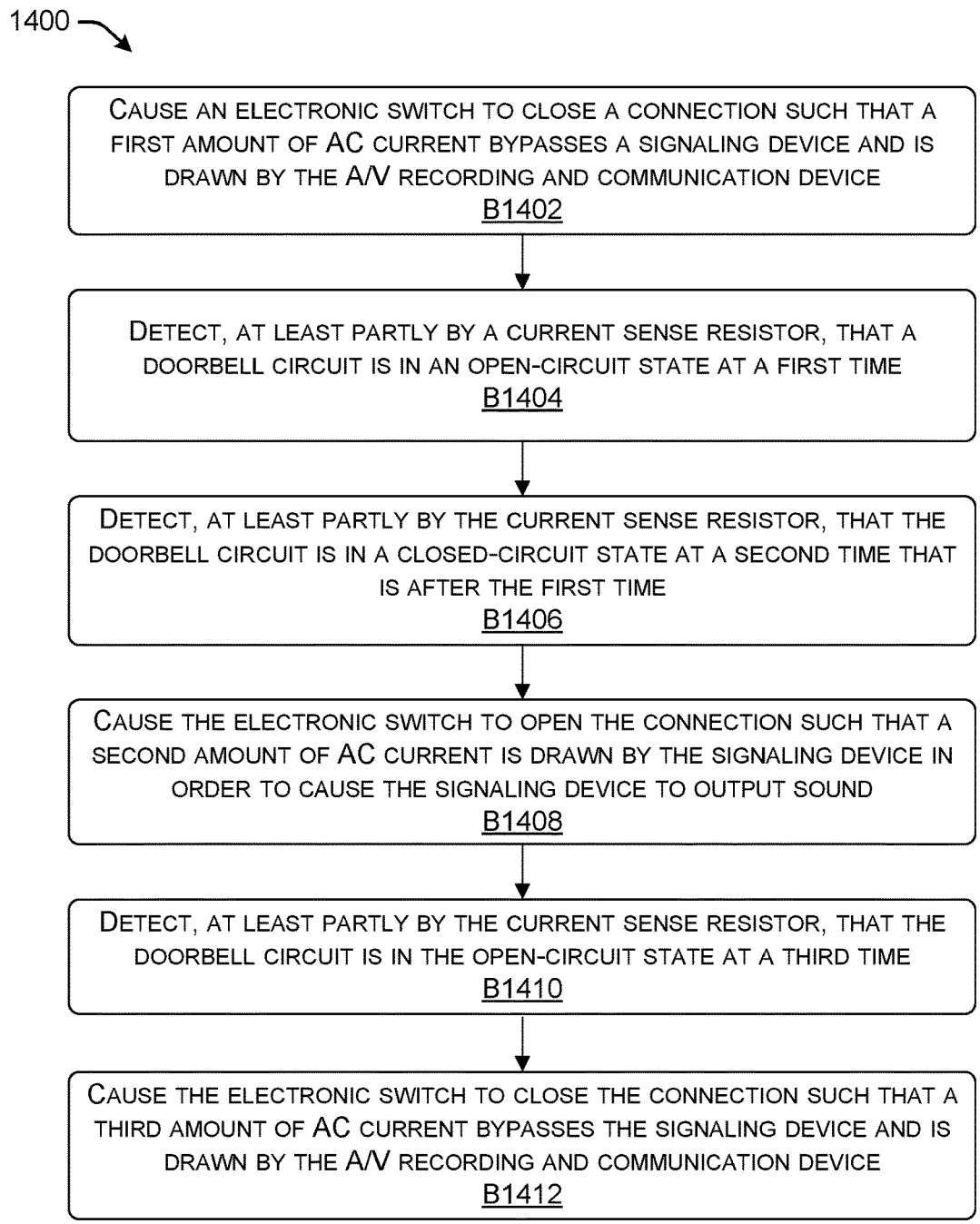

FIG. 14 is a flowchart illustrating an example process 1400 for a doorbell circuit device configured for coupling to a signaling device in a doorbell circuit to selectively cause AC current to bypass the signaling device, or cause the AC current to flow through the signaling device and cause a signaling device to emit sound.

The process 1400, at block B1402, includes causing an electronic switch to close the connection such that a first amount of AC current bypasses the signaling device and is drawn by the A/V recording and communication device. For example, the signaling-control device 120 may cause the shunt 122 to close the connection such that a first amount of AC current bypasses the signaling device 114 and is drawn by the A/V recording and communication device 106.

The process 1400, at block B1404, includes detecting, at least partly by the current sense resistor, that the doorbell circuit is in an open-circuit state at a first time. For example, the signaling-control device 120 may detect, at least partly by the signaling device current-sense resistor 128, that the doorbell circuit 112 is in an open-circuit state at a first time.

The process 1400, at block B1406, includes detecting, at least partly by the current sense resistor, that the doorbell circuit is in a closed-circuit state at a second time that is after the first time. For example, the signaling-control device 120 may detect, at least partly by the signaling device current-sense resistor 128, that the doorbell circuit 112 is in a closed-circuit state at a second time that is after the first time.

The process 1400, at block B1408, includes causing the electronic switch to open the connection such that a second amount of AC current is drawn by the signaling device in order to cause the signaling device to output sound. For example, the signaling-control device 120 may, based at least in part on the doorbell circuit 112 being in the open-circuit state at the first time and the doorbell circuit 112 being in the closed-circuit state at the second time, cause the shunt 122 to open the connection such that a second amount of AC current is drawn by the signaling device 114 in order to cause the signaling device 114 to output sound via the signaling device 114.

The process 1400, at block B1410, includes detecting, at least partly by the current sense resistor, that the doorbell circuit is in the open-circuit state at a third time. For example, the signaling-control device 106 may detect, at least partly using the signaling device current-sense resistor 128, that the doorbell circuit 112 is in the open-circuit state at a third time.

The process 1400, at block B1412, includes causing the electronic switch to close the connection such that a third amount of AC current bypasses the signaling device and is drawn by the A/V recording and communication device. For example, the signaling-control device 120 may, based at least in part on the doorbell circuit 112 being in the open-circuit state at the third time, cause the shunt 122 to close the connection such that a third amount of AC current bypasses the signaling device 114 and is drawn by the A/V device 106.

Figure 15:
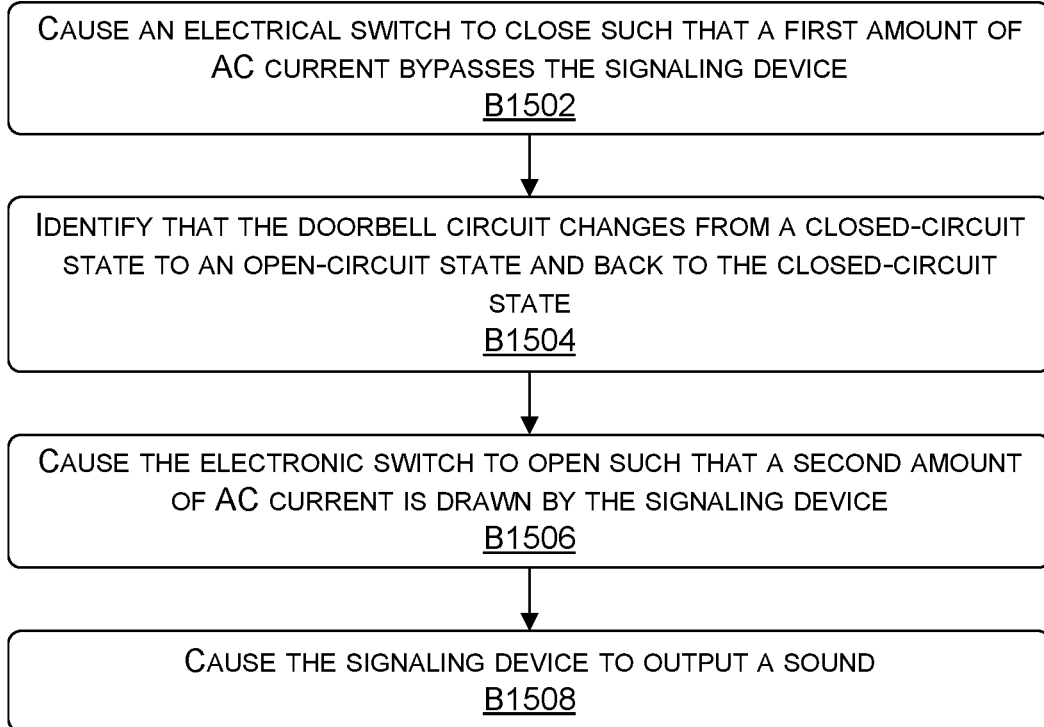

FIG. 15 is a flowchart illustrating an example process 1500 for a doorbell circuit device configured for coupling to a signaling device in a doorbell circuit to selectively cause AC current to bypass the signaling device, or cause the AC current to flow through the signaling device and cause a signaling device to emit sound.

The process 1500, at block B1502, includes causing an electrical switch to close such that a first amount of AC current bypasses the signaling device. For example, the signaling-control device 120 may cause the shunt 122 to close such that a first amount of AC current bypasses the signaling device 114.

The process 1500, at block B1504, includes identifying that the doorbell circuit changes from a closed-circuit state to an open-circuit state. For example, the signaling-control device 120 may identify that the doorbell circuit 112 changes from a closed-circuit state to an open-circuit state.

The process 1500, at block B1506, includes causing the electronic switch to open such that a second amount of AC current is drawn by the signaling device. For example, the signaling-control device 120 may cause the shunt 122 to open such that a second amount of AC current is drawn by the signaling device 114.

The process 1500, at block B1508, includes causing the signaling device to output a sound. For example, the second amount of AC current that is drawn by the signaling device 114 may cause the signaling device 114 to emit a sound.

Figure 16:
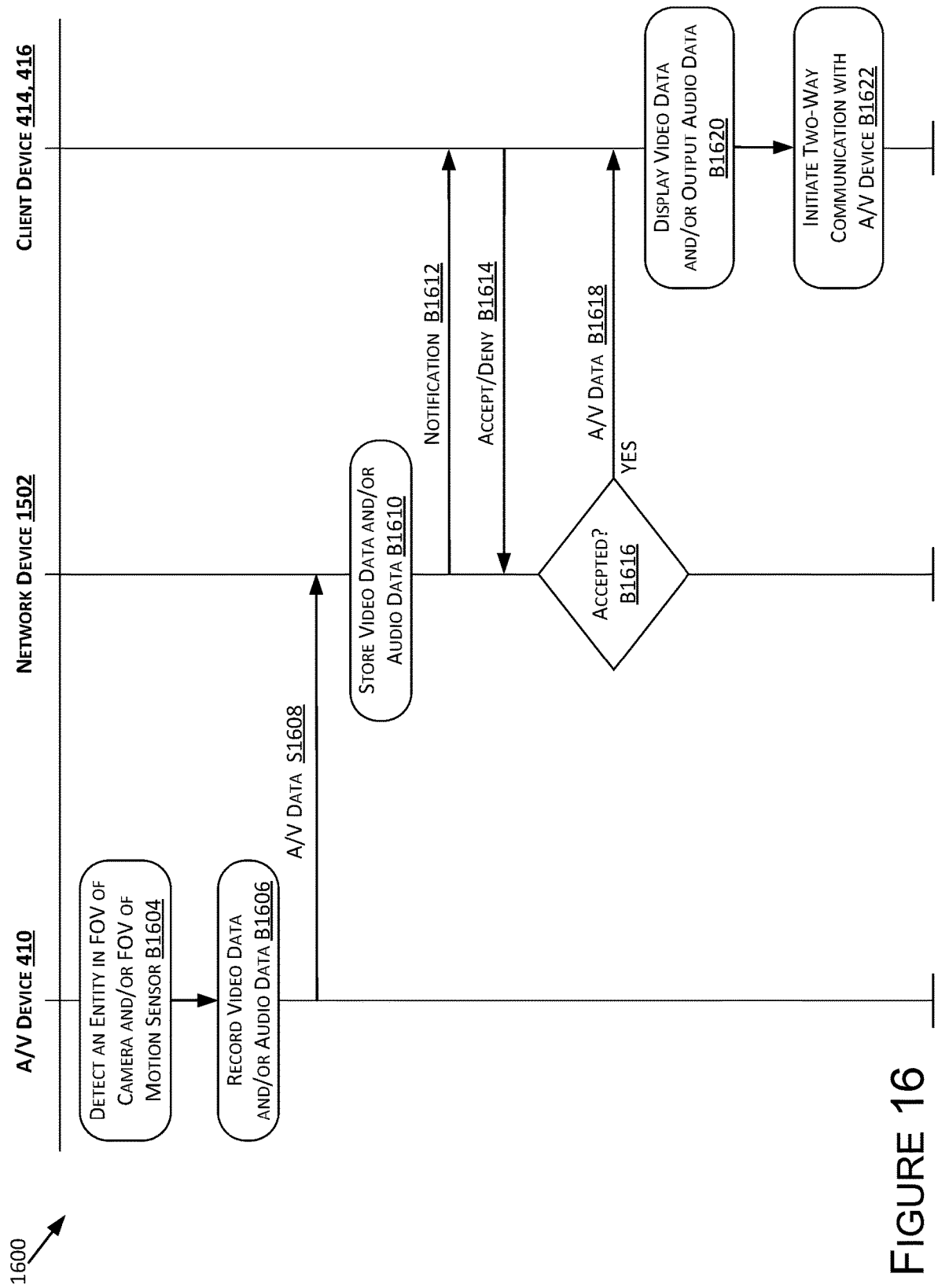
FIG. 16 is a signal diagram of a process for streaming and/or storing A/V content from an A/V recording and communication device according to various aspects of the present disclosure.

FIG. 16 is a signal diagram of a process 1600 for streaming and storing A/V content from the A/V device 410 according to various aspects of the present disclosure. The network device 1602 may include one or more of the hub device 402, the VA device 408, and/or any of the components of the network(s) of servers/backend devices 420 (e.g., the backend server 424, the backend API 426, the storage devices 422, etc.).

The process 1600, at block B1604, detects an object in a field of view of a camera and/or a field of view of a motion sensor. For example, the A/V device 410 may detect the presence of an object within a field of view of view of the motion sensor(s) 526 (e.g., a motion sensor field of view) and/or a field of view of the camera 514 (e.g., a camera field of view). To detect motion using the motion sensor(s) 526, the data type (e.g., voltage for PIR sensors) from the output signal of the motion sensor(s) 526 may be analyzed, by the processor(s) 510 of the A/V device 410, to determine whether the output signal is indicative of motion of an object that should prompt the recording of the image data 606 and/or audio data 608 at block B1606 and signal S1608. To detect motion using the camera 514, the processor(s) 510 of the A/V device 410 may analyze the image data 606 by performing, for example, a frame by frame comparison of a change in pixels, to determine whether the image data 606 is indicative of motion of an object that should prompt the recording and transmission of image data 606 and/or audio data 608 at block B1606 and signal S1608.

The process 1600, at block B1606, records video data and/or audio data. For example, the processor(s) 510 of the A/V device 410 may cause the camera 514 to begin generating the image data 606 and/or the microphone(s) 528 to being recording the audio data 608.

The process 1600, at signal S1608, transmits the video data and/or the audio data to a network device 1602. For example, the processor(s) 510 of the A/V device 410, using the network interface 512, may transmit the image data 606 and/or the audio data 608 to the network device 1602. In response, the network device 1602 may receive, by respective processor(s) and using respective communication module(s), the image data 606 and/or the audio data 608. In some embodiments, the image data 606 and/or the audio data 608 is transmitted to the hub device 402 and/or the VA device 408, and the hub device 402 and/or the VA device 408 may transmit (or forward) the image data 606 and/or the audio data 608 to one or more components of the network(s) of servers/backend devices 420. In either embodiment, the network device 1602 may transmit the image data 606 and/or the audio data 608 to a client device(s) 414, 416. In other embodiments, the image data 606 and/or the audio data 608 may be transmitted to the hub device 402 and/or the VA device 408, and the hub device 402 and/or the VA device 408 may transmit (or forward) the image data 606 and/or the audio data 608 to the client device(s) 414, 416. Still, in some embodiments, the image data 606 and/or the audio data 608 may be transmitted directly to the client device(s) 414, 416 from the A/V device 410.

The process 1600, at block B1610, stores the video data and/or the audio data. For example, the network device 1602 may store the image data 606 and/or the audio data 608. The image data 606 and/or the audio data 608 may be stored for future access by the user(s) of the A/V device 410 (e.g., as Cloud storage). In some embodiments, the A/V device 410 may store the image data 606 and/or the audio data 608 locally (e.g., in the memory 402). In some embodiments, the image data 606 and/or the audio data 608 may not be stored, except during buffering, compression, and/or live (or near-live) streaming of the image data 606 and/or the audio data 608 to the client device(s) 414, 416. In such embodiments, at the conclusion of a motion event (e.g., when an object is no longer in the camera field of view and/or the motion sensor field of view), the video data and/or the audio data may be deleted from the network device 1602.

The process 1600, at signal S1612, transmits a user alert to the client device. For example, the network device 1602 may transmit, by the respective processor(s) and using the respective communication module(s), a notification 616 to the client device(s) 414, 416. In some embodiments, the notification 616 may be generated and transmitted, by the processor(s) 510 and using the network interface 512, directly to the client device(s) 414, 416 from the A/V device 410. The notification 616 may be a notification (e.g., a push notification, a message, (e.g., a short-message-service (SMS) message), an email, a phone call, a signal, and/or another type of user alert. The notification 616 may be configured to provide a user of the client device(s) 414, 416 with an indication that an object is present at the A/V device 410. In some embodiments, the notification 616 may be informative as to the type of motion detected and/or object present at the A/V device 410. For example, if a person, an animal, a parcel, or a vehicle is present, the notification 616 may include an indication of such. As another example, if the person and/or animal detected are known to be dangerous and/or are acting suspicious (as determined using computer vision processing, image processing, behavioral analysis, third party source(s), etc.), the notification 616 may include an indication of such.

The process 1600, at signal S1614, transmits an acceptance or denial of the user alert. For example, the client device(s) 414, 416 may transmit, by the processor(s) 802 and using the network interface 810, an acceptance or denial of the notification 616. In various embodiments, acceptance of the notification 616 includes an acknowledgement of receipt of the notification 616 from the client device(s) 414, 416. In yet other embodiments, the acceptance includes the user interacting with (e.g., selecting through a user interface a user interface element of a modal window displayed by a display device the client device(s) 414, 416) the notification 616. Furthermore, denial of the notification 616 may include a variety of different actions and/or information. In one example, a denial includes a failure of the client device(s) 414, 416 to provide a response to the notification 616 within an interval of time. In yet another example, the denial includes the user interacting with the notification 616 by at least selecting an "ignore" user interface element of a GUI of the client device(s) 414, 416. In response, the hub device 402, the VA device 408, and/or one or more components of the network(s) of servers/backend devices 420 may receive, by the respective processors and using the respective communication modules, the acceptance or denial of the notification 616 from the client device(s) 414, 416.

The process 1600, at block B1616, determines whether the user alert was accepted or denied. For example, the network device 1602 may determine, by the respective processors, whether the notification 616 was accepted or denied. In some embodiments, the processor(s) 510 of the A/V device 410, using the network interface 512, may determine whether the notification 616 was accepted or denied (e.g., in embodiments where the A/V device 410 and the client device(s) 414, 416 communicate directly). When the notification 616 is denied, the process 1600 may end, or another transmission type of the user alert may be generated (e.g., if a user denies a push notification, an SMS message may be transmitted). When the notification 616 is accepted, the image data 606 and/or the audio data 608 may be transmitted to the client device(s) 414, 416 that accepted the notification 616.

The process 1600, at signal S1618, transmits the video data and/or the audio data to the client device(s) 414, 416. For example, network device 1602, by the respective processor(s) and using the respective communication module(s), may transmit the image data 606 and/or the audio data 608 to the client device(s) 414, 416. In response, the client device(s) 414, 416, by the processor(s) 802 and using the network interface 810, may receive the image data 606 and/or the audio data 608. In some embodiments, the image data 606 and/or the audio data 608 may be transmitted by the processor(s) 510 of the A/V device 410, using the network interface 512, directly to the client device(s) 414, 416.

The process 1600, at block B1620, displays the video data and/or outputs the audio data. For example, the processor(s) of the client device(s) 414, 416 may cause display, on the display 818 of the client device(s) 414, 416, the image data 606 and/or may cause output, by the speaker(s) 708 of the client device(s) 414, 416, the audio data 608. In addition to displaying the image data 606 and/or outputting the audio data 608, a GUI may be displayed on the client device(s) 414, 416 that may allow a user of the client device(s) 414, 416 to perform one more actions. The one or more actions may include outputting a siren, or alarm, by selecting a siren/alarm icon, changing camera settings (e.g., move, pan, tilt, zoom, brightness, contrast, etc.) by selecting one or more camera settings icons, activating one or more modes by selecting a mode activation icon (e.g., for activating a parcel protection mode for monitoring a package in the camera field of view), arming or disarming a security system by selecting an arm/disarm icon, unlocking a door by selecting a door lock icon, etc. In some embodiments, the GUI may further include a talk icon for initiating a two-way communication session between the client device(s) 414, 416 and the A/V device 410, as described below with respect to block B1622.

The process 1600, at block B1622, initiates a two-way communication with the A/V device. For example, the processor(s) 802 of the client device(s) 414, 416, using the network interface 810, may initiate a two-way communication session with the A/V device 410. In response, the A/V device 410 and/or the network device 1602 may receive the two-way communication request from the client device(s) 414, 416. Once the two-way communication session is established, the voice/sound input at the client device(s) 414, 416, as captured by the microphone(s) 706 of the client device(s) 414, 416, may be transmitted as audio data to the A/V device 410 for output by the speaker(s) 530. Additionally, the voice/sound input at the A/V device 410, as captured by the microphone(s) 528 of the A/V device 410, may be transmitted as audio data 608 to the client device 414, 416 for output by the speaker(s) 808 of the client device(s) 414, 416.

Figure 17:
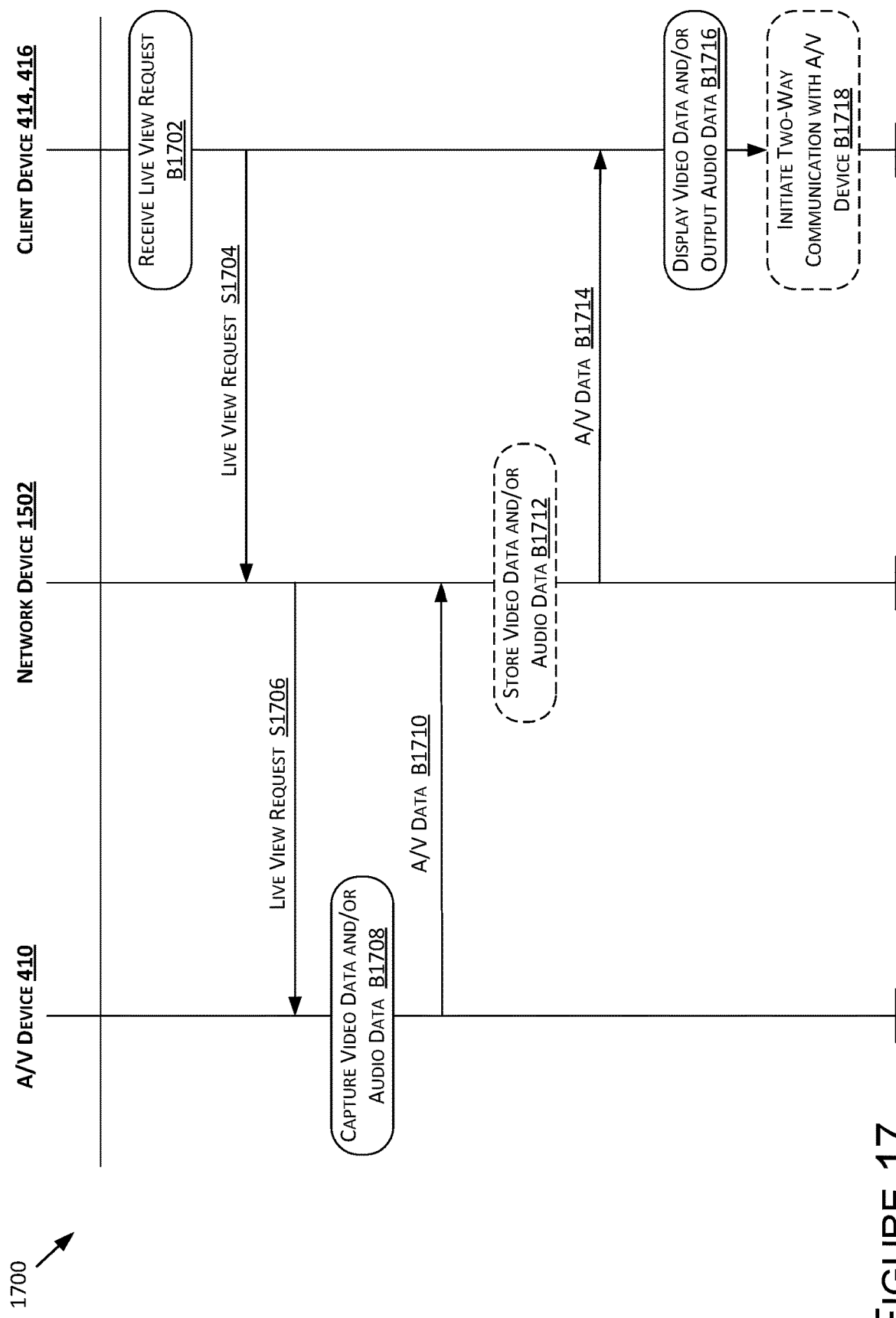
FIG. 17 is a signal diagram of a process for initiating a video-on-demand session for A/V content from an A/V recording and communication device according to various aspects of the present disclosure.

FIG. 17 is a signal diagram of a process 1700 for initiating a video-on-demand session for A/V content from an A/V device 410 according to various aspects of the present disclosure. The network device 1702 may include one or more of the hub device 402, the VA device 408, and/or any of the components of the network(s) of servers/backend devices 420 (e.g., the backend server 424, the backend API 426, the storage devices 422, etc.).

The process 1700, at block B1702, receives a live view request. For example, processor(s) of the client device 414, 416 may receive a live view request from a user of the client device 414, 416. The live view request may include an input to user interface (e.g., a display, such as within a GUI on a display, one or more physical buttons of the client device 414, 416, etc.).

The process 1700, at signal B1704, transmits a live view request. For example, the live request may be transmitted, by processor(s) and using a communication module of the client device 414, 416, to the network device 1702. In response, network device 1702 may receive, by the respective processor(s) and using the respective communication module(s), the live view request. In some embodiments, the live view request may be transmitted directly to the A/V device 410 from the client device 414, 416.

The process 1700, at signal S1706, transmits the live request. For example, network device 1702 may transmit (or forward), by the respective processor(s) and using the respective communication module(s), the live view request to the A/V device 410. In response, the processor(s) 510 of the A/V device 410, using the network interface 512, may receive the live view request.

The process 1700, at block B1708, captures video data and/or audio data. For example, in response to receiving the live view request, the processor(s) 510 of the A/V device 410 may cause the camera 514 to record the image data 606 and/or the microphone(s) 528 to record the audio data 608.

The process 1700, at signal S1710, transmits the video data and/or the audio data. This process may be similar to that of signal S1608 of the process 1600, described above.

The process 1700, at block B1712, stores the video data and/or the audio data. This process may be similar to that of block B1610 of the process 1600, described above.

The process 1700, at block S1714, transmits the video data and/or the audio data to the client device. This process may be similar to that of signal S1618 of the process 1600, described above.

The process 1700, at block B1716, displays the video data and/or outputs the audio data. This process may be similar to that of block B1620 of the process 1600, described above.

The process 1700, at block B1718, initiates two-way communication with the A/V device 410. This process may be similar to that of block B1622 of the process 1600, described above.

Figure 18:
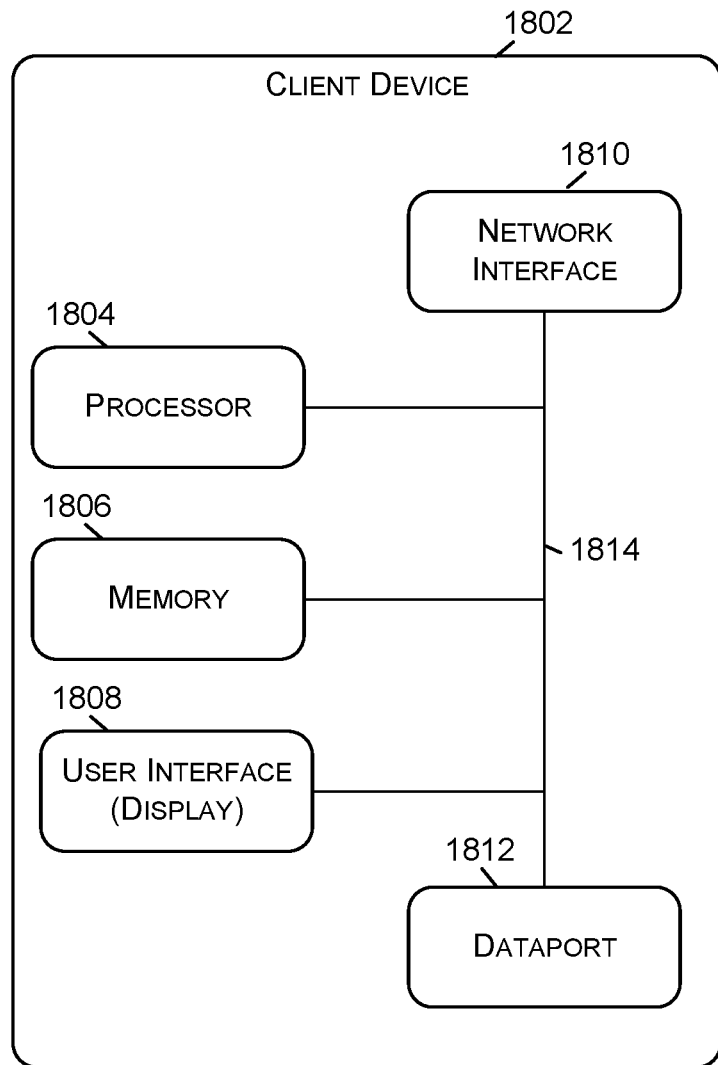
FIG. 18 is a functional block diagram of a client device on which the present embodiments may be implemented according to various aspects of the present disclosure.

FIG. 18 is a functional block diagram of a client device 1802 on which the present embodiments may be implemented according to various aspects of the present disclosure. The client device(s) 414, 416 described with reference to FIG. 4 may include some or all of the components and/or functionality of the client device 1802. The client device 1802 may comprise, for example, a smartphone.

With reference to FIG. 18, the client device 1802 includes a processor 1804, a memory 1806, a user interface 1808, a communication module 1810, and a dataport 1812. These components are communicatively coupled together by an interconnect bus 1814. The processor 1804 may include any processor used in smartphones and/or portable computing devices, such as an ARM processor (a processor based on the RISC (reduced instruction set computer) architecture developed by Advanced RISC Machines (ARM).). In some embodiments, the processor 1804 may include one or more other processors, such as one or more conventional microprocessors, and/or one or more supplementary co-processors, such as math co-processors.

The memory 1806 may include both operating memory, such as random-access memory (RAM), as well as data storage, such as read-only memory (ROM), hard drives, flash memory, or any other suitable memory/storage element. The memory 1806 may include removable memory elements, such as a CompactFlash card, a MultiMediaCard (MMC), and/or a Secure Digital (SD) card. In some embodiments, the memory 1806 may comprise a combination of magnetic, optical, and/or semiconductor memory, and may include, for example, RAM, ROM, flash drive, and/or a hard disk or drive. The processor 1804 and the memory 1806 each may be, for example, located entirely within a single device, or may be connected to each other by a communication medium, such as a USB port, a serial port cable, a coaxial cable, an Ethernet-type cable, a telephone line, a radio frequency transceiver, or other similar wireless or wired medium or combination of the foregoing. For example, the processor 1804 may be connected to the memory 1806 via the dataport 1812.

The user interface 1808 may include any user interface or presentation elements suitable for a smartphone and/or a portable computing device, such as a keypad, a display screen, a touchscreen, a microphone, and a speaker. The communication module 1810 is configured to handle communication links between the client device 1802 and other, external devices or receivers, and to route incoming/outgoing data appropriately. For example, inbound data from the dataport 1812 may be routed through the communication module 1810 before being directed to the processor 1804, and outbound data from the processor 1804 may be routed through the communication module 1810 before being directed to the dataport 1812. The communication module 1810 may include one or more transceiver modules capable of transmitting and receiving data, and using, for example, one or more protocols and/or technologies, such as GSM, UMTS (3GSM), IS-95 (CDMA one), IS-2000 (CDMA 2000), LTE, FDMA, TDMA, W-CDMA, CDMA, OFDMA, Wi-Fi, WiMAX, or any other protocol and/or technology.

The dataport 1812 may be any type of connector used for physically interfacing with a smartphone and/or a portable computing device, such as a mini-USB port or an IPHONE®/IPOD® 30-pin connector or LIGHTNING® connector. In other embodiments, the dataport 1812 may include multiple communication channels for simultaneous communication with, for example, other processors, servers, and/or client terminals.

The memory 1806 may store instructions for communicating with other systems, such as a computer. The memory 1806 may store, for example, a program (e.g., computer program code) adapted to direct the processor 1804 in accordance with the present embodiments. The instructions also may include program elements, such as an operating system. While execution of sequences of instructions in the program causes the processor 1804 to perform the process steps described herein, hard-wired circuitry may be used in place of, or in combination with, software/firmware instructions for implementation of the processes of the present embodiments. Thus, the present embodiments are not limited to any specific combination of hardware and software.

Figure 19:
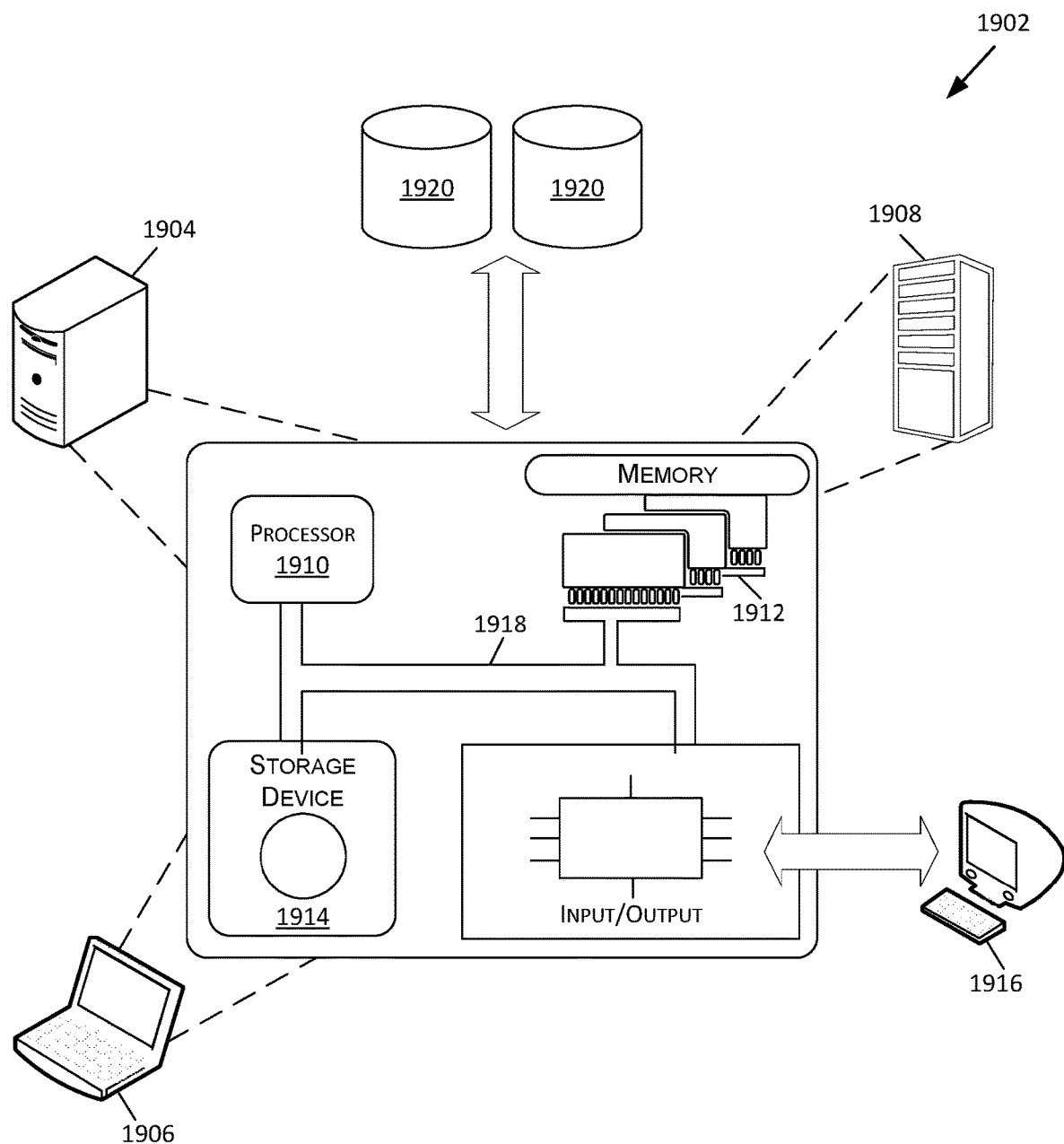
FIG. 19 is a functional block diagram of a general-purpose computing system on which the present embodiments may be implemented according to various aspects of present disclosure.

FIG. 19 is a functional block diagram of a general-purpose computing system on which the present embodiments may be implemented according to various aspects of the present disclosure. The computer system 1902 may be embodied in at least one of a personal computer (also referred to as a desktop computer) 1904, a portable computer (also referred to as a laptop or notebook computer) 1906, and/or a server 1908 is a computer program and/or a machine that waits for requests from other machines or software (clients) and responds to them. A server typically processes data. The purpose of a server is to share data and/or hardware and/or software resources among clients. This architecture is called the client-server model. The clients may run on the same computer or may connect to the server over a network. Examples of computing servers include database servers, file servers, mail servers, print servers, web servers, game servers, and application servers. The term server may be construed broadly to include any computerized process that shares a resource to one or more client processes.

The computer system 1902 may execute at least some of the operations described above. The computer system 1902 may include at least one processor 1910, memory 1912, at least one storage device 1914, and input/output (I/O) devices 1916. Some or all of the components 1910, 1912, 1914, 1916 may be interconnected via a system bus 1918. The processor 1910 may be single- or multi-threaded and may have one or more cores. The processor 1910 execute instructions, such as those stored in the memory 1912 and/or in the storage device 1914. Information may be received and output using one or more I/O devices 1916.

The memory 1912 may store information, and may be a computer-readable medium, such as volatile or non-volatile memory. The storage device(s) 1914 may provide storage for the system 1902 and, in some embodiments, may be a computer-readable medium. In various aspects, the storage device(s) 1914 may be a flash memory device, a hard disk device, an optical disk device, a tape device, or any other type of storage device.

The I/O devices 1916 may provide input/output operations for the system 1902. The I/O devices 1916 may include a keyboard, a pointing device, and/or a microphone. The I/O devices 1916 may further include a display unit for displaying graphical user interfaces, a speaker, and/or a printer. External data may be stored in one or more accessible external databases 1920.

The features of the present embodiments described herein may be implemented in digital electronic circuitry, and/or in computer hardware, firmware, software, and/or in combinations thereof. Features of the present embodiments may be implemented in a computer program product tangibly embodied in an information carrier, such as a machine-readable storage device, and/or in a propagated signal, for execution by a programmable processor. Embodiments of the present method steps may be performed by a programmable processor executing a program of instructions to perform functions of the described implementations by operating on input data and generating output.

The features of the present embodiments described herein may be implemented in one or more computer programs that are executable on a programmable system including at least one programmable processor coupled to receive data and/or instructions from, and to transmit data and/or instructions to, a data storage system, at least one input device, and at least one output device. A computer program may include a set of instructions that may be used, directly or indirectly, in a computer to perform a certain activity or bring about a certain result. A computer program may be written in any form of programming language, including compiled or interpreted languages, and it may be deployed in any form, including as a stand-alone program or as a module, component, subroutine, or other unit suitable for use in a computing environment.

Suitable processors for the execution of a program of instructions may include, for example, both general and special purpose processors, and/or the sole processor or one of multiple processors of any kind of computer. Generally, a processor may receive instructions and/or data from a read only memory (ROM), or a random-access memory (RAM), or both. Such a computer may include a processor for executing instructions and one or more memories for storing instructions and/or data.

Generally, a computer may also include, or be operatively coupled to communicate with, one or more mass storage devices for storing data files. Such devices include magnetic disks, such as internal hard disks and/or removable disks, magneto-optical disks, and/or optical disks. Storage devices suitable for tangibly embodying computer program instructions and/or data may include all forms of non-volatile memory, including for example semiconductor memory devices, such as EPROM, EEPROM, and flash memory devices, magnetic disks such as internal hard disks and removable disks, magneto-optical disks, and CD-ROM and DVD-ROM disks. The processor and the memory may be supplemented by, or incorporated in, one or more ASICs (application-specific integrated circuits).

To provide for interaction with a user, the features of the present embodiments may be implemented on a computer having a display device, such as an LCD (liquid crystal display) monitor, for displaying information to the user. The computer may further include a keyboard, a pointing device, such as a mouse or a trackball, and/or a touchscreen by which the user may provide input to the computer.

The features of the present embodiments may be implemented in a computer system that includes a back-end component, such as a data server, and/or that includes a middleware component, such as an application server or an Internet server, and/or that includes a front-end component, such as a client computer having a graphical user interface (GUI) and/or an Internet browser, or any combination of these. The components of the system may be connected by any form or medium of digital data communication, such as a communication network. Examples of communication networks may include, for example, a LAN (local area network), a WAN (wide area network), and/or the computers and networks forming the Internet.

The computer system may include clients and servers. A client and server may be remote from each other and interact through a network, such as those described herein. The relationship of client and server may arise by virtue of computer programs running on the respective computers and having a client-server relationship to each other.

As used herein, the phrases "at least one of A, B and C," "at least one of A, B, or C," and "A, B, and/or C" are synonymous and mean logical "OR" in the computer science sense. Thus, each of the foregoing phrases should be understood to read on (A), (B), (C), (A and B), (A and C), (B and C), and (A and B and C), where A, B, and C are variables representing elements or features of the claim. Also, while these examples are described with three variables (A, B, C) for ease of understanding, the same interpretation applies to similar phrases in these formats with any number of two or more variables.

The above description presents the best mode contemplated for carrying out the present embodiments, and of the manner and process of practicing them, in such full, clear, concise, and exact terms as to enable any person skilled in the art to which they pertain to practice these embodiments. The present embodiments are, however, susceptible to modifications and alternate constructions from those discussed above that are fully equivalent. Consequently, the present invention is not limited to the particular embodiments disclosed. On the contrary, the present invention covers all modifications and alternate constructions coming within the spirit and scope of the present disclosure. For example, the steps in the processes described herein need not be performed in the same order as they have been presented, and may be performed in any order(s). Further, steps that have been presented as being performed separately may in alternative embodiments be performed concurrently. Likewise, steps that have been presented as being performed concurrently may in alternative embodiments be performed separately.

Example Clauses

1: In a first aspect, an audio/video (A/V) recording and communication device configured to be connected in series with a doorbell circuit device in a doorbell circuit, the A/V recording and communication device comprising: a button to receive input to cause a signaling device to output a sound; one or more processors; a signal relay configured to perform current switching for controlling alternating current (AC) current that is drawn by the A/V recording and communication device, the signal relay being selectively configurable to close a connection such that the AC current is drawn by the A/V recording and communication device, and to open the connection such that the AC current is not drawn by the A/V recording and communication device; and memory having stored therein instructions that, when executed by the one or more processors, cause the A/V recording and communication device to: cause the signal relay to close the connection such that AC current is drawn by the A/V recording and communication device; detect an input to the button; based at least in part on the input to the button, cause the signal relay to open the connection for a first period of time such that the AC current is not drawn by the A/V recording and communication device, resulting in modulation of a first portion of the AC current during the first period of time; subsequent to the first period of time, cause the signal relay to close the connection such that the AC current continues to be drawn by the A/V recording and communication device, wherein the modulation of the AC current during the first period of time causes the signaling device to output the sound; detect a removal of the input to the button; based at least in part on the removal of the input to the button: cause the signal relay to open the connection for a second period of time such that the AC current is not drawn by the A/V recording and communication device, resulting in modulation of a second portion of the AC current during the second period of time; and cause the signal relay to open the connection for a third period of time such that the AC current is not drawn by the A/V recording and communication device, resulting in modulation of a third portion of the AC current during the third period of time, wherein the modulation of the second portion of the AC current followed by the modulation of the third portion of the AC current indicates to the signaling device to stop outputting the sound; and subsequent to the third period of time, cause the signal relay to close the connection such that the AC current is drawn by the A/V recording and communication device.

2: In an embodiment of the first aspect, the A/V recording and communication device of paragraph 1, wherein: the signal relay is connected in series between the signaling device and a power load of the A/V recording and communication device; and the power load draws at least a portion of the AC current and comprises at least one of: a camera; a microphone; or a speaker.

3: In an embodiment of the first aspect, the A/V recording and communication device of paragraph 1, wherein the memory stores further instructions that, when executed by the one or more processors, cause the A/V recording and communication device to: cause the signal relay to switch between opening the connection and closing the connection multiple times according to a sequence, resulting in a corresponding sequence of modulations of multiple portions of the AC current, wherein the corresponding sequence of modulations of the multiple portions of the AC current indicates, to the signaling device, a request that the signaling device provide a device identifier to the A/V recording and communication device.

4: In an embodiment of the first aspect, the A/V recording and communication device of paragraph 3, further comprising: a current sense resistor to detect changes in the AC current caused by the signaling device; wherein the sequence comprises a first sequence; and the memory stores further instructions that, when executed by the one or more processors, cause the A/V recording and communication device to: detect, at least partly using the current sense resistor, multiple modulations of the AC current according to a second predefined sequence; and store data indicating binary bits that correspond to the second predefined sequence of the multiple modulations of the AC current, wherein the binary bits that correspond to the second predefined sequence represent the device identifier of the signaling device.

5: In an embodiment of the first aspect, the A/V recording and communication device of paragraph 3, wherein causing the signal relay to switch between opening the connection and closing the connection multiple times according to the sequence comprises: causing the signal relay to open the connection for a fourth period of time such that the AC current is not drawn by the A/V recording and communication device, resulting in a modulation of a fourth portion of the AC current, wherein the fourth portion of the AC current is included in a positive signal amplitude of a signal period of the AC current; and subsequent to the fourth period of time, causing the signal relay to close the connection for a fifth period of time such that a fifth portion of the AC current is drawn by the A/V recording and communication device, wherein the fifth portion of the AC current is included in the positive signal amplitude of the signal period of the AC current.

6: In an embodiment of the first aspect, the A/V recording and communication device of paragraph 3, wherein causing the signal relay to switch between opening the connection and closing the connection multiple times according to the sequence comprises: causing the signal relay to close the connection for a fourth period of time such that a fourth portion of the AC current is drawn by the A/V recording and communication device, wherein the fourth portion of the AC current is included in a positive signal amplitude of a signal period of the AC current; and subsequent to the fourth period of time, causing the signal relay to open the connection for a fifth period of time such that the AC current is not drawn by the A/V recording and communication device, resulting in a modulation of a fifth portion of the AC current, wherein the fifth portion of the AC current is included in the positive signal amplitude of the signal period of the AC current.

7: In a second aspect, an audio/video (A/V) recording and communication device having two terminals connectable in series with a doorbell circuit device in a doorbell circuit, the A/V recording and communication device comprising: one or more processors; a switch for controlling alternating current (AC) current that is drawn by the A/V recording and communication device, the switch being selectively operable to close such that the AC current is drawn by the A/V recording and communication device, and to open such that the AC current is not drawn by the A/V recording and communication device; and memory having stored therein instructions that, when executed by the one or more processors, cause the A/V recording and communication device to: receive an instruction for communication to the doorbell circuit device; determine, based at least in part on the instruction, a control signal to control the switch to close and open; and send the control signal to the switch, resulting in modulation of a portion of the AC current, the modulation of the portion of the AC current representative of the instruction to the doorbell circuit device.

8: In an embodiment of the second aspect, the A/V recording and communication device of paragraph 7, further comprising a button that, when pressed, causes the doorbell circuit device to output a sound, wherein: receiving the instruction includes detecting a press of the button; and the modulation of the portion of the AC current causes the doorbell circuit device to output the sound.

9: In an embodiment of the second aspect, the A/V recording and communication device of paragraph 7, further comprising a button that, when pressed, causes the doorbell circuit device to output a sound, wherein: receiving the instruction includes detecting a press of the button; sending the control signal to the switch causes the switch to open for a first period of time such that the AC current is not drawn by the A/V recording and communication device, resulting in the modulation of a first portion of the AC current, the modulation of the first portion of the AC current causing the doorbell circuit device to output the sound; and the memory stores further instructions that, when executed by the one or more processors, cause the A/V recording and communication device to: subsequent to the first period of time, cause the switch to close such that the AC current continues to be drawn by the A/V recording and communication device; detect a removal of the press to the button; cause the switch to open for a second period of time such that the AC current is not drawn by the A/V recording and communication device, resulting in modulation of a second portion of the AC current during the second period of time; and cause the switch to open for a third period of time such that the AC current is not drawn by the A/V recording and communication device, resulting in modulation of a third portion of the AC current during the third period of time, wherein the modulation of the second portion of the AC current followed by the modulation of the third portion of the AC current indicates to the doorbell circuit device to stop outputting the sound.

10: In an embodiment of the second aspect, the A/V recording and communication device of paragraph 7, wherein: the switch is connected in series between the doorbell circuit device and a power load of the A/V recording and communication device; and the power load draws at least a portion of the AC current and comprises at least one of a camera, a microphone, or a speaker.

11: In an embodiment of the second aspect, the A/V recording and communication device of paragraph 7, wherein causing the switch to close and open comprises: causing the switch to close and open multiple times according to a sequence, resulting in a corresponding sequence of modulations of multiple portions of the AC current, wherein the corresponding sequence of modulations of the multiple portions of the AC current indicates, to the doorbell circuit device, the instruction that the doorbell circuit device provide a device identifier to the A/V recording and communication device.

12: In an embodiment of the second aspect, the A/V recording and communication device of paragraph 11, further comprising: a current sense resistor to detect changes in the AC current caused by the doorbell circuit device; wherein the sequence comprises a first sequence; and the memory stores further instructions that, when executed by the one or more processors, cause the A/V recording and communication device to: detect, at least partly using the current sense resistor, multiple modulations of the AC current according to a second predefined sequence; and store data indicating binary bits that correspond to the second predefined sequence of the multiple modulations of the AC current, wherein the binary bits that correspond to the second predefined sequence represent the device identifier of the doorbell circuit device.

13: In an embodiment of the second aspect, the A/V recording and communication device of paragraph 7, wherein causing the switch to close and open comprises: causing the switch to open for a first period of time such that the AC current is not drawn by the A/V recording and communication device, resulting in the modulation of the portion of the AC current, wherein the portion of the AC current is included in a positive signal amplitude of a signal period of the AC current; and subsequent to the first period of time, causing the switch to close for a second period of time such that a subsequent portion of the AC current is drawn by the A/V recording and communication device, wherein the subsequent portion of the AC current is included in the positive signal amplitude of the signal period of the AC current.

14: In an embodiment of the second aspect, the A/V recording and communication device of paragraph 7, wherein: the switch is connected in series between the doorbell circuit device and a power load of the A/V recording and communication device; and the power load draws at least a portion of the AC current and comprises at least one of: a camera; a microphone; or a speaker.

15: In an embodiment of the second aspect, the A/V recording and communication device of paragraph 7, wherein causing the switch close and open comprises: causing the switch to close for a first period of time such that an initial portion of the AC current is drawn by the A/V recording and communication device, wherein the initial portion of the AC current is included in a positive signal amplitude of a signal period of the AC current; and subsequent to the first period of time, causing the switch to open for a second period of time such that the AC current is not drawn by the A/V recording and communication device, resulting in the modulation of the portion of the AC current, wherein the portion of the AC current is included in the positive signal amplitude of the signal period of the AC current.

16: In a third aspect, a doorbell circuit device having two terminals connectable to a signaling device in a circuit and connectable in series with an audio/video (A/V) recording and communication device, the doorbell circuit device comprising: control circuitry for controlling alternating current (AC) current that is drawn by the signaling device, the control circuitry comprising an open state in which AC current is delivered to the signaling device and a closed state in which the AC current is not drawn by the signaling device; and one or more control components comprising logic to cause the doorbell circuit device to: cause the control circuitry to enter the closed state such that AC current is not drawn by the signaling device; identify a modulation of a portion of the AC current; and based at least in part on the modulation of the portion of the AC current, cause the control circuitry to enter the open state such that the AC current is drawn by the signaling device to cause the signaling device to output sound.

17: In an embodiment of the third aspect, the doorbell circuit device of paragraph 16, further comprising a current sense resistor connected between two terminals of the A/V recording and communication device for detecting changes in the AC current delivered from an AC power source and through the doorbell circuit device, wherein identifying the modulation of the portion of the AC current comprises detecting, at least partly by the current sense resistor, the portion of the AC current drawn through the control circuitry.

18: In an embodiment of the third aspect, the doorbell circuit device of paragraph 17, wherein the portion of the AC current comprises a first portion, and wherein the one or more control components comprise further logic that cause the doorbell circuit device to: detect, at least partly by the current sense resistor, a modulation of a second portion of the AC current followed by a modulation of a third portion of the AC current; and based at least in part on the modulation of the second portion of the AC current followed by the modulation of the third portion of the AC current, cause the control circuitry to enter the closed state such that the AC current bypasses away from the signaling device to cause the signaling device to cease outputting the sound.

19: In an embodiment of the third aspect, the doorbell circuit device of paragraph 16, wherein: the control circuitry includes a shunt switch and is connected in parallel with the signaling device; and causing the control circuitry to enter the open state such that the AC current is drawn by the signaling device includes placing the shunt switch in a high impedance state such that a shunt impedance associated with the shunt switch is greater than a load impedance associated with the signaling device.

20: In an embodiment of the third aspect, the doorbell circuit device of paragraph 16, wherein the one or more control components comprise further logic that cause the doorbell circuit device to: detect an end of a predefined period of time associated with causing the signaling device to output the sound; and based at least in part on the detecting the end of the predefined period of time, cause the control circuitry to enter the closed state such that the AC current bypasses away from the signaling device to cause the signaling device to cease outputting the sound.

20: In a fourth aspect, a doorbell circuit device configured to be coupled to a signaling device in a circuit, the doorbell circuit device configured to be in series with an audio/video (A/V) recording and communication device, the doorbell circuit device comprising: one or more processors; control circuitry for controlling alternating current (AC) current that is drawn by the signaling device, the control circuitry comprising an open state in which AC current is delivered to the signaling device and a closed state in which the AC current is not drawn by the signaling device; and memory having stored therein instructions that, when executed by the one or more processors, cause the doorbell circuit device to: cause the control circuitry to enter the closed state such that AC current is not drawn by the signaling device; identify a modulation of a portion of the AC current; based at least in part on the modulation of the portion of the AC current, cause the control circuitry to enter the open state such that the AC current is drawn by the signaling device to cause the signaling device to output sound.

21: In an embodiment of the fourth aspect, the doorbell circuit device of paragraph 20, further comprising a current sense resistor configured to detect changes in the AC current delivered from an AC power source and through the doorbell circuit device, wherein identifying the modulation of the portion of the AC current comprises detecting, at least partly by the current sense resistor, the portion of the AC current drawn through the control circuitry.

22: In an embodiment of the fourth aspect, the doorbell circuit device of paragraph 21, wherein the portion of the AC current comprises a first portion, comprising further instructions that, when executed by the one or more processors, cause the doorbell circuit device to: detect, at least partly by the current sense resistor, a modulation of a second portion of the AC current followed by a modulation of a third portion of the AC current; and based at least in part on the modulation of the second portion of the AC current followed by the modulation of the third portion of the AC current, cause the control circuitry to enter the closed state such that the AC current bypasses away from the signaling device to cause the signaling device to cease outputting the sound.

23: In an embodiment of the fourth aspect, the doorbell circuit device of paragraph 20, wherein: the control circuitry includes a shunt switch and is in parallel with the signaling device; and causing the control circuitry to enter the open state such that the AC current is drawn by the signaling device includes placing the shunt switch in a high impedance state such that a shunt impedance associated with the shunt switch is greater than a load impedance associated with the signaling device.

24: In a fifth aspect, a method performed at least partly by a doorbell circuit device, the method comprising: causing control circuitry for controlling alternating current (AC) current that is drawn by a signaling device to enter a closed state such that the AC current is not drawn by the signaling device; identifying a modulation of a portion of the AC current; and based at least in part on the modulation of the portion of the AC current, cause the control circuitry to enter an open state such that the AC current is drawn by the signaling device to cause the signaling device to output sound.

25: In a sixth aspect, a doorbell circuit device configured to be coupled to a signaling device in a circuit, the doorbell circuit device configured to be in series with an audio/video (A/V) recording and communication device, the doorbell circuit device comprising: one or more processors; a signal relay configured to perform current switching for controlling alternating current (AC) current that is drawn through the doorbell circuit device by the A/V recording and communication device, the signal relay being selectively configurable to close a connection such that the AC current is drawn and to open the connection such that the AC current is not drawn; and memory having stored therein instructions that, when executed by the one or more processors, cause the doorbell circuit device to: identify one or more first modulations of the AC current representative of an instruction for communication to the A/V recording and communication device; determine, based at least in part on the one or more first modulations of the AC current, a control signal to control the signal relay to perform the current switching; and cause the signal relay to perform the current switching for controlling the AC current according to the control signal resulting in one or more second modulations of the AC current to be representative of the instruction for communication to the A/V recording and communication device.

26: In an embodiment of the sixth aspect, the doorbell circuit device of paragraph 25, wherein the one or more first modulations of the AC current comprises a first sequence of modulations of multiple first portions of the AC current; comprising further instructions that, when executed by the one or more processors, cause the doorbell circuit device to: determine, based at least in part on the first sequence of modulations of the multiple first portions of the AC current, that the instruction for communication comprises a request for a device identifier of the doorbell circuit device.

27: In an embodiment of the sixth aspect, the doorbell circuit device of paragraph 26, wherein causing the signal relay to perform the current switching resulting in the one or more second modulations comprises: determine a second sequence of modulations of AC current that represent the device identifier of the doorbell circuit device; and causing the signal relay to switch between opening the connection and closing the connection multiple times according to the second sequence of modulations of second portions of the AC current to communicate an indication of the device identifier to the A/V recording and communication device.

28: In a seventh aspect, an audio/video (A/V) recording and communication device configured to be connected in series with a doorbell device in a doorbell circuit, the A/V recording and communication device comprising: a button configured to receive touch input to cause a signaling device to output a sound; one or more processors; a first signal relay configured to be disposed in series with the signaling device to perform current switching for controlling AC current that is provided by an AC power source, the first signal relay being selectively configurable to close a first connection such that the AC current is provided by the AC power source and to open the first connection such that the AC current is not provided by the AC power source; a second signal relay disposed in parallel with the A/V recording and communication device to perform current switching for controlling the AC current that is drawn by the A/V recording and communication device, the second signal relay being selectively configurable to open a second connection such that the AC current is drawn by the A/V recording and communication device through the first signal relay and to close the second connection such that that AC current passes through the first signal relay and the second signal relay to bypass the A/V recording and communication device; and memory having stored therein instructions that, when executed by the one or more processors, cause the A/V recording and communication device to: cause the first signal relay to close the first connection; cause the second signal relay to open the second connection such that the A/V recording and communication device draws a first amount of AC current through the first signal relay; detect a touch input of the button; based at least in part on the detecting the touch input of the button, cause the first signal relay to open the first connection such that the doorbell circuit is open, thereby preventing the first amount of AC current from being drawn by the A/V recording and communication device for a first period of time, wherein the preventing the first amount of AC current from being drawn by the A/V recording and communication device indicates to the signaling device to output the sound; subsequent to the first period of time: cause the first signal relay to close the first connection such that the AC current is provided to the doorbell circuit by the AC power source; and cause the second signal relay to close the second connection such that a second amount of AC current that is drawn by the signaling device to output the sound bypasses the A/V recording and communication device by passing through the first signal relay and the second signal relay, wherein the first signal relay and the second signal relay are closed for a second period of time; subsequent to the second period of time: cause the first signal relay to open the first connection for a third period of time; and cause the second signal relay to open the second connection for the third period of time such that the doorbell circuit is open, thereby preventing the signaling device from drawing the second amount of AC current to output the sound; and subsequent to the third period of time, cause the first signal relay to close the first connection such that the A/V recording and communication device draws a third amount of AC current through the first signal relay.

29: In an embodiment of the seventh aspect, the A/V recording and communication device of paragraph 28, wherein: the first signal relay is configured to be connected in series between the signaling device and a power load of the A/V recording and communication device; and the power load is configured to draw at least a portion of the AC current and comprises at least one of a camera, a microphone, or a speaker.

30: In an embodiment of the seventh aspect, the A/V recording and communication device of paragraph 28, further comprising a doorbell circuit device connected in series with the A/V recording and communication device and configured for coupling to the signaling device, the doorbell circuit device comprising: one or more second processors; and an electronic switch configured to perform current switching for controlling AC current that is drawn by the signaling device, the electronic switch being selectively configurable to open a third connection such that the AC current is drawn by the signaling device and to close the third connection such that the AC current bypasses the signaling device and is drawn by the A/V recording and communication device.

31: In an embodiment of the seventh aspect, the A/V recording and communication device of paragraph 30, wherein the doorbell circuit device further comprises second memory storing second instructions that, when executed by the one or more second processors, cause the doorbell circuit device to: detect that the first amount of AC current was prevented from being drawn by the A/V recording and communication device; and based at least in part on the first amount of AC current being prevented from being drawn, causing the electronic switch to open the third connection such that the AC current is drawn by the signaling device to output the sound at least partly during the second period of time.

32: In an embodiment of the seventh aspect, the A/V recording and communication device of paragraph 31, wherein: the doorbell circuit device further comprises a current sense resistor configured to detect changes in alternating current (AC) current drawn from an AC power source and through the doorbell circuit by the A/V recording and communication device; and detecting that the first amount of AC current was prevented from being drawn comprises detecting, at least partly using the current sense resistor, that the first amount of AC current was prevented from being drawn.

33: In an eighth aspect, an audio/video (A/V) recording and communication device having two terminals connectable in series with a signaling device within a doorbell circuit, the A/V recording and communication device comprising: a button that, when pressed, causes the signaling device to output sound; one or more processors; a first switch for controlling alternating current (AC) current that is drawn by the A/V recording and communication device, the first switch being selectively configurable to close such that the AC current is drawn by the A/V recording and communication device and to open such that the AC current is not drawn by the A/V recording and communication device; a second switch for controlling the AC current that is drawn by the A/V recording and communication device, the second switch being selectively configurable to open such that the AC current is drawn by the A/V recording and communication device through the first switch and to close such that that AC current passes through the first switch and the second switch to bypass the A/V recording and communication device; and memory having stored therein instructions that, when executed by the one or more processors, cause the A/V recording and communication device to: cause the first switch to close; cause the second switch to open such that the A/V recording and communication device draws a first amount of AC current through the first switch; detect a press of the button; based at least in part on the press of the button, cause the first switch to open such that the A/V recording and communication device is prevented from drawing the first amount of AC current for a first period of time; subsequent to the first period of time: cause the first switch to close; and cause the second switch to close such that a second amount of AC current that is drawn by the signaling device to output a sound bypasses the A/V recording and communication device, wherein the first switch and the second switch are closed for a second period of time.

34: In an embodiment of the eighth aspect, the A/V recording and communication device of paragraph 33, the memory storing further instructions that, when executed by the one or more processors, cause the A/V recording and communication device to, subsequent to the second period of time: cause the first switch to open for a third period of time; and cause the second switch to open for the third period of time such that the doorbell circuit is open, thereby preventing the signaling device from drawing the second amount of AC current to output the sound.

35: In an embodiment of the eighth aspect, the A/V recording and communication device of paragraph 34, the memory storing further instructions that, when executed by the one or more processors, cause the A/V recording and communication device to, subsequent to the third period of time: cause the first switch to close such that the A/V recording and communication device draws a third amount of AC current through the first switch.

36: In an embodiment of the eighth aspect, the A/V recording and communication device of paragraph 33, wherein: the first switch is configured to be connected in series between the signaling device and a power load of the A/V recording and communication device; and the power load is configured to draw at least a portion of the first amount of AC current and comprises at least one of a camera, a microphone, or a speaker.

37: In a ninth aspect, a method performed at least in part by an audio/video (A/V) recording and communication device, the method comprising: causing a first switch of the A/V recording and communication device to close a first connection such that alternating current (AC) current is drawn through a doorbell circuit from an AC power source, wherein the A/V recording and communication device is connected in series with a signaling device in the doorbell circuit; causing a second switch of the A/V recording and communication device to open a second connection such that the A/V recording and communication device draws a first amount of AC current through the first switch; detecting a press of a button of the A/V recording and communication device; based at least in part on the press of the button, causing the first switch to open such that the A/V recording and communication device is prevented from drawing the first amount of AC current for a first period of time; subsequent to the first period of time: causing the first switch to close; and causing the second switch to close such that a second amount of AC current that is drawn by the signaling device to output a sound bypasses the A/V recording and communication device, wherein the first switch and the second switch are closed for a second period of time.

38: In an embodiment of the ninth aspect, the method of paragraph 37, further comprising: causing the first switch to open the first connection for a third period of time; and causing the second switch to open the second connection for the third period of time such that the doorbell circuit is open, thereby preventing the signaling device from drawing the second amount of AC current to output the sound.

39: In an embodiment of the ninth aspect, the method of paragraph 37, wherein: the first switch is configured to be connected in series between the signaling device and a power load of the A/V recording and communication device; and the power load is configured to draw at least a portion of the AC current and comprises at least one of a camera, a microphone, or a speaker.

40: In an embodiment of the ninth aspect, the method of paragraph 37, further comprising causing the first switch to close the first connection such that the A/V recording and communication device draws a third amount of AC current through the first switch.

41: In a tenth aspect, a doorbell circuit device having two terminals connectable to a signaling device in a doorbell circuit and connectable in series in the doorbell circuit with an audio/video (A/V) recording and communication device, the doorbell circuit device comprising: an electronic switch configured to perform current switching for controlling alternating current (AC) current that is drawn by the signaling device, the electronic switch being selectively configurable to open such that the AC current is drawn by the signaling device and to close such that the AC current bypasses the signaling device; and one or more control components comprising logic to cause the doorbell circuit device to: cause the electrical switch to close such that a first amount of AC current bypasses the signaling device; identify that the doorbell circuit changes from a closed-circuit state to an open-circuit state; and based at least in part on the identifying that the doorbell circuit changes from the closed-circuit state to the open-circuit state: cause the electronic switch to open such that a second amount of AC current is drawn by the signaling device; and cause the signaling device to output a sound.

42: In an embodiment of the tenth aspect, the doorbell circuit device of paragraph 41, wherein the one or more control components comprise further logic that cause the doorbell device to: identify that the doorbell circuit changes from the closed-circuit state back to the open-circuit state; and based at least in part on the identifying that the doorbell circuit changes from the closed-circuit state back to the open circuit state, cause the electronic switch to close such that a third amount of AC current bypasses the signaling device.

43: In an embodiment of the tenth aspect, the doorbell circuit device of paragraph 41, further comprising a current sense resistor configured to detect changes in the AC current drawn from an AC power source and through the doorbell circuit by the A/V recording and communication device, wherein the identifying that the doorbell circuit changes from the closed-circuit state to the open-circuit state comprises detecting, at least partly by the current sense resistor, that the doorbell circuit changes from the closed-circuit state to the open-circuit state.

44: In an embodiment of the tenth aspect, the doorbell circuit device of paragraph 41, wherein the doorbell circuit device is configured to be connected in parallel with the signaling device in the doorbell circuit.

45: In an eleventh aspect, a method performed at least partly by a doorbell circuit device that is coupled to a signaling device in a doorbell circuit, the method comprising: causing an electronic switch to close a connection in the doorbell circuit such that a first amount of alternating current (AC) current bypasses the signaling device in the doorbell circuit; identifying that the doorbell circuit changes from a closed-circuit state to an open-circuit state; and based at least in part on the identifying that the doorbell circuit changes from the closed-circuit state to the open-circuit state: causing the electronic switch to open such that a second amount of AC current is drawn by the signaling device; and causing the signaling device to output a sound.

46: In an embodiment of the eleventh aspect, the method of paragraph 45, further comprising: identifying that the doorbell circuit changes from the closed-circuit state back to the open-circuit state; and based at least in part on the identifying that the doorbell circuit changes from the closed-circuit state back to the open circuit state, causing the electronic switch to close such that a third amount of AC current bypasses the signaling device.

47: In an embodiment of the eleventh aspect, the method of paragraph 45, further comprising: detecting an end of a predefined period of time associated with causing the signaling device to output the sound; and based at least in part on the detecting the end of the predefined period of time, cause the electronic switch to close such that a third amount of AC current bypasses the signaling device to cease outputting the sound.

48: In a twelfth aspect, a doorbell circuit device configured for coupling to a signaling device in a doorbell circuit, the doorbell circuit device configured to be in series with an audio/video (A/V) recording and communication device, the doorbell circuit device comprising: one or more processors; a current sense resistor configured to detect changes in alternating current (AC) current drawn from an AC power source and through the doorbell circuit by the A/V recording and communication device; an electronic switch configured to perform current switching for controlling AC current that is drawn by the signaling device, the electronic switch being selectively configurable to open a connection such that the AC current is drawn by the signaling device and to close the connection such that the AC current bypasses the signaling device and is drawn by the A/V recording and communication device; and memory having stored therein instructions that, when executed by the one or more processors, cause the doorbell circuit device to: cause the electronic switch to close the connection such that a first amount of AC current bypasses the signaling device and is drawn by the A/V recording and communication device; detect, at least partly by the current sense resistor, that the doorbell circuit is in an open-circuit state at a first time; detect, at least partly by the current sense resistor, that the doorbell circuit is in a closed-circuit state at a second time that is after the first time; based at least in part on the doorbell circuit being in the open-circuit state at the first time and the doorbell circuit being in the closed-circuit state at the second time, cause the electronic switch to open the connection such that a second amount of AC current is drawn by the signaling device in order to cause the signaling device to output sound; detect, at least partly by the current sense resistor, that the doorbell circuit is in the open-circuit state at a third time; and based at least in part on the doorbell circuit is in the open-circuit state at the third time, cause the electronic switch to close the connection such that a third amount of AC current bypasses the signaling device and is drawn by the A/V recording and communication device.

49: In an embodiment of the twelfth aspect, the doorbell circuit device of paragraph 48, wherein the doorbell circuit device is configured to be in parallel with the signaling device in the doorbell circuit.

50: In an embodiment of the twelfth aspect, the doorbell circuit device of paragraph 48, wherein causing the electronic switch to close the connection such that a first amount of AC current bypasses the signaling device and is drawn by the A/V recording and communication device comprise causing the electronic switch to switch from a low impedance to a high impedance.

What is claimed is:

1. An audio/video (A/V) recording and communication device configured to be connected in series with a doorbell circuit device in a doorbell circuit, the A/V recording and communication device comprising:
a button to receive input to cause a signaling device to output a sound;
one or more processors;
a signal relay configured to perform current switching for controlling alternating current (AC) current that is drawn by the A/V recording and communication device, the signal relay being selectively configurable to close a connection such that the AC current is drawn by the A/V recording and communication device, and to open the connection such that the AC current is not drawn by the A/V recording and communication device; and memory having stored therein instructions that, when executed by the one or more processors, cause the A/V recording and communication device to:
  cause the signal relay to close the connection such that AC current is drawn by the A/V recording and communication device;
  detect an input to the button;
  based at least in part on the input to the button, cause the signal relay to open the connection for a first period of time such that the AC current is not drawn by the A/V recording and communication device, resulting in modulation of a first portion of the AC current during the first period of time;
  subsequent to the first period of time, cause the signal relay to close the connection such that the AC current continues to be drawn by the A/V recording and communication device,
    wherein the modulation of the AC current during the first period of time causes the signaling device to output the sound;
  detect a removal of the input to the button;
  based at least in part on the removal of the input to the button:
    cause the signal relay to open the connection for a second period of time such that the AC current is not drawn by the A/V recording and communication device, resulting in modulation of a second portion of the AC current during the second period of time; and
    cause the signal relay to open the connection for a third period of time such that the AC current is not drawn by the A/V recording and communication device, resulting in modulation of a third portion of the AC current during the third period of time,
      wherein the modulation of the second portion of the AC current followed by the modulation of the third portion of the AC current indicates to the signaling device to stop outputting the sound; and
    subsequent to the third period of time, cause the signal relay to close the connection such that the AC current is drawn by the A/V recording and communication device.

2. The A/V recording and communication device of claim 1, wherein:
  the signal relay is connected in series between the signaling device and a power load of the A/V recording and communication device; and
  the power load draws at least a portion of the AC current and comprises at least one of:
  a camera;
  a microphone; or
  a speaker.

3. The A/V recording and communication device of claim 1, wherein the memory stores further instructions that, when executed by the one or more processors, cause the A/V recording and communication device to:
  cause the signal relay to switch between opening the connection and closing the connection multiple times according to a sequence, resulting in a corresponding sequence of modulations of multiple portions of the AC current,
  wherein the corresponding sequence of modulations of the multiple portions of the AC current indicates, to the signaling device, a request that the signaling device provide a device identifier to the A/V recording and communication device.

4. The A/V recording and communication device of claim 3, further comprising:
  a current sense resistor to detect changes in the AC current caused by the signaling device;
  wherein the sequence comprises a first sequence; and
  the memory stores further instructions that, when executed by the one or more processors, cause the A/V recording and communication device to:
    detect, at least partly using the current sense resistor, multiple modulations of the AC current according to a second predefined sequence; and
    store data indicating binary bits that correspond to the second predefined sequence of the multiple modulations of the AC current,
      wherein the binary bits that correspond to the second predefined sequence represent the device identifier of the signaling device.

5. The A/V recording and communication device of claim 3, wherein causing the signal relay to switch between opening the connection and closing the connection multiple times according to the sequence comprises:
  causing the signal relay to open the connection for a fourth period of time such that the AC current is not drawn by the A/V recording and communication device, resulting in a modulation of a fourth portion of the AC current, wherein the fourth portion of the AC current is included in a positive signal amplitude of a signal period of the AC current; and
  subsequent to the fourth period of time, causing the signal relay to close the connection for a fifth period of time such that a fifth portion of the AC current is drawn by the A/V recording and communication device, wherein the fifth portion of the AC current is included in the positive signal amplitude of the signal period of the AC current.

6. The A/V recording and communication device of claim 3, wherein causing the signal relay to switch between opening the connection and closing the connection multiple times according to the sequence comprises:
  causing the signal relay to close the connection for a fourth period of time such that a fourth portion of the AC current is drawn by the A/V recording and communication device, wherein the fourth portion of the AC current is included in a positive signal amplitude of a signal period of the AC current; and
  subsequent to the fourth period of time, causing the signal relay to open the connection for a fifth period of time such that the AC current is not drawn by the A/V recording and communication device, resulting in a modulation of a fifth portion of the AC current, wherein the fifth portion of the AC current is included in the positive signal amplitude of the signal period of the AC current.

7. An audio/video (A/V) recording and communication device having two terminals connectable in series with a doorbell circuit device in a doorbell circuit, the A/V recording and communication device comprising:
  one or more processors;
  a switch for controlling alternating current (AC) current that is drawn by the A/V recording and communication device, the switch being selectively operable to close such that the AC current is drawn by the A/V recording and communication device, and to open such that the AC current is not drawn by the A/V recording and communication device; and memory having stored therein instructions that, when executed by the one or more processors, cause the A/V recording and communication device to:

receive an instruction for communication to the doorbell circuit device;

determine, based at least in part on the instruction, a control signal to control the switch to close and open; and send the control signal to the switch, resulting in modulation of a portion of the AC current, the modulation of the portion of the AC current representative of the instruction to the doorbell circuit device.

8. The A/V recording and communication device of claim 7, further comprising a button that, when pressed, causes the doorbell circuit device to output a sound, wherein:

receiving the instruction includes detecting a press of the button; and the modulation of the portion of the AC current causes the doorbell circuit device to output the sound.

9. The A/V recording and communication device of claim 7, further comprising a button that, when pressed, causes the doorbell circuit device to output a sound, wherein:

receiving the instruction includes detecting a press of the button;

sending the control signal to the switch causes the switch to open for a first period of time such that the AC current is not drawn by the A/V recording and communication device, resulting in the modulation of a first portion of the AC current, the modulation of the first portion of the AC current causing the doorbell circuit device to output the sound; and the memory stores further instructions that, when executed by the one or more processors, cause the A/V recording and communication device to:

subsequent to the first period of time, cause the switch to close such that the AC current continues to be drawn by the A/V recording and communication device;

detect a removal of the press to the button;

cause the switch to open for a second period of time such that the AC current is not drawn by the A/V recording and communication device, resulting in modulation of a second portion of the AC current during the second period of time; and cause the switch to open for a third period of time such that the AC current is not drawn by the A/V recording and communication device, resulting in modulation of a third portion of the AC current during the third period of time, wherein the modulation of the second portion of the AC current followed by the modulation of the third portion of the AC current indicates to the doorbell circuit device to stop outputting the sound.

10. The A/V recording and communication device of claim 7, wherein:

the switch is connected in series between the doorbell circuit device and a power load of the A/V recording and communication device; and the power load draws at least a portion of the AC current and comprises at least one of a camera, a microphone, or a speaker.

11. The A/V recording and communication device of claim 7, wherein causing the switch to close and open comprises:

causing the switch to close and open multiple times according to a sequence, resulting in a corresponding sequence of modulations of multiple portions of the AC current, wherein the corresponding sequence of modulations of the multiple portions of the AC current indicates, to the doorbell circuit device, the instruction that the doorbell circuit device provide a device identifier to the A/V recording and communication device.

12. The A/V recording and communication device of claim 11, further comprising:

a current sense resistor to detect changes in the AC current caused by the doorbell circuit device;

wherein the sequence comprises a first sequence; and the memory stores further instructions that, when executed by the one or more processors, cause the A/V recording and communication device to:

detect, at least partly using the current sense resistor, multiple modulations of the AC current according to a second predefined sequence; and store data indicating binary bits that correspond to the second predefined sequence of the multiple modulations of the AC current, wherein the binary bits that correspond to the second predefined sequence represent the device identifier of the doorbell circuit device.

13. The A/V recording and communication device of claim 7, wherein causing the switch to close and open comprises:

causing the switch to open for a first period of time such that the AC current is not drawn by the A/V recording and communication device, resulting in the modulation of the portion of the AC current, wherein the portion of the AC current is included in a positive signal amplitude of a signal period of the AC current; and subsequent to the first period of time, causing the switch to close for a second period of time such that a subsequent portion of the AC current is drawn by the A/V recording and communication device, wherein the subsequent portion of the AC current is included in the positive signal amplitude of the signal period of the AC current.

14. The A/V recording and communication device of claim 7, wherein:

the switch is connected in series between the doorbell circuit device and a power load of the A/V recording and communication device; and the power load draws at least a portion of the AC current and comprises a wireless communication component.

15. The A/V recording and communication device of claim 7, wherein causing the switch close and open comprises:

causing the switch to close for a first period of time such that an initial portion of the AC current is drawn by the A/V recording and communication device, wherein the initial portion of the AC current is included in a positive signal amplitude of a signal period of the AC current; and subsequent to the first period of time, causing the switch to open for a second period of time such that the AC current is not drawn by the A/V recording and communication device, resulting in the modulation of the portion of the AC current, wherein the portion of the AC current is included in the positive signal amplitude of the signal period of the AC current.

16. A doorbell circuit device having two terminals connectable to a signaling device in a circuit and connectable in series with an audio/video (A/V) recording and communication device, the doorbell circuit device comprising:
control circuitry for controlling alternating current (AC) current that is drawn by the signaling device, the control circuitry comprising an open state in which AC current is delivered to the signaling device and a closed state in which the AC current is not drawn by the signaling device; and
one or more control components comprising logic to cause the doorbell circuit device to:
cause the control circuitry to enter the closed state such that AC current is not drawn by the signaling device;
identify a modulation of a portion of the AC current; and
based at least in part on the modulation of the portion of the AC current, cause the control circuitry to enter the open state such that the AC current is drawn by the signaling device to cause the signaling device to output sound.

17. The doorbell circuit device of claim 16, further comprising a current sense resistor connected between two terminals of the A/V recording and communication device for detecting changes in the AC current delivered from an AC power source and through the doorbell circuit device,
wherein identifying the modulation of the portion of the AC current comprises detecting, at least partly by the current sense resistor, the portion of the AC current drawn through the control circuitry.

18. The doorbell circuit device of claim 17, wherein the portion of the AC current comprises a first portion, and wherein the one or more control components comprise further logic that cause the doorbell circuit device to:
detect, at least partly by the current sense resistor, a modulation of a second portion of the AC current followed by a modulation of a third portion of the AC current; and
based at least in part on the modulation of the second portion of the AC current followed by the modulation of the third portion of the AC current, cause the control circuitry to enter the closed state such that the AC current bypasses away from the signaling device to cause the signaling device to cease outputting the sound.

19. The doorbell circuit device of claim 16, wherein:
the control circuitry includes a shunt switch and is connected in parallel with the signaling device; and
causing the control circuitry to enter the open state such that the AC current is drawn by the signaling device includes placing the shunt switch in a high impedance state such that a shunt impedance associated with the shunt switch is greater than a load impedance associated with the signaling device.

20. The doorbell circuit device of claim 16, wherein the one or more control components comprise further logic that cause the doorbell circuit device to:
detect an end of a predefined period of time associated with causing the signaling device to output the sound; and
based at least in part on the detecting the end of the predefined period of time, cause the control circuitry to enter the closed state such that the AC current bypasses away from the signaling device to cause the signaling device to cease outputting the sound.

* * * * *